(12) United States Patent
Lee

(10) Patent No.: US 12,512,364 B2
(45) Date of Patent: Dec. 30, 2025

(54) SEMICONDUCTOR MEMORY DEVICE AND MANUFACTURING METHOD THEREOF

(71) Applicant: SK hynix Inc., Icheon-si (KR)

(72) Inventor: Nam Jae Lee, Cheongju (KR)

(73) Assignee: SK hynix Inc., Icheon-si (KR)

( * ) Notice: Subject to any disclaimer, the term of this patent is extended or adjusted under 35 U.S.C. 154(b) by 95 days.

(21) Appl. No.: 18/526,643

(22) Filed: Dec. 1, 2023

(65) Prior Publication Data

US 2024/0105507 A1 Mar. 28, 2024

Related U.S. Application Data

(63) Continuation of application No. 17/387,787, filed on Jul. 28, 2021, now Pat. No. 11,837,498, which is a continuation of application No. 16/597,603, filed on Oct. 9, 2019, now Pat. No. 11,107,729.

(30) Foreign Application Priority Data

Mar. 15, 2019 (KR) ........................ 10-2019-0030157

(51) Int. Cl.
*H10B 43/27* (2023.01)
*H01L 21/768* (2006.01)
*H10B 43/10* (2023.01)

(52) U.S. Cl.
CPC .. *H01L 21/76816* (2013.01); *H01L 21/76831* (2013.01); *H01L 21/76877* (2013.01); *H10B 43/27* (2023.02); *H10B 43/10* (2023.02)

(58) Field of Classification Search
None
See application file for complete search history.

(56) References Cited

U.S. PATENT DOCUMENTS

| | | | |
|---|---|---|---|
| 8,680,604 | B2 | 3/2014 | Higashi et al. |
| 8,759,217 | B1 | 6/2014 | Chen |
| 9,257,444 | B2 | 2/2016 | Oh et al. |
| 9,929,093 | B2 | 3/2018 | Lee |
| 2005/0142855 | A1 | 6/2005 | Choi |
| 2012/0135583 | A1 | 5/2012 | Jang et al. |
| 2013/0095654 | A1 | 4/2013 | Kwon et al. |
| 2013/0161821 | A1 | 6/2013 | Hwang et al. |

(Continued)

FOREIGN PATENT DOCUMENTS

| | | |
|---|---|---|
| CN | 106409811 A | 2/2017 |
| CN | 106711146 A | 5/2017 |

(Continued)

OTHER PUBLICATIONS

Written Opinion from Intellectual Property Office of Singapore dated Jun. 3, 2023 for Application No. 10201909519P.

(Continued)

*Primary Examiner* — Jay C Chang

(57) ABSTRACT

A process of forming a 3D memory device includes forming a stacked structure with a plurality of stacked layers, etching the stacked structure to form stepped trenches each comprising a plurality of steps, forming a hard mask layer with a plurality of openings over the stepped trenches, forming a photoresist layer over the hard mask layer, and etching through the plurality of openings using the hard mask layer and the photoresist layers as an etch mask to extend a bottom of the stepped trenches to a lower depth.

10 Claims, 54 Drawing Sheets

(56) References Cited

U.S. PATENT DOCUMENTS

| | | | |
|---|---|---|---|
| 2014/0162420 A1* | 6/2014 | Oh | H01L 23/528 |
| | | | 438/270 |
| 2016/0093626 A1 | 3/2016 | Izumi et al. | |
| 2016/0172369 A1 | 6/2016 | Hu et al. | |
| 2017/0141032 A1 | 5/2017 | Lee | |
| 2017/0317088 A1 | 11/2017 | Lee | |
| 2018/0145029 A1 | 5/2018 | Tanzawa | |
| 2019/0109196 A1* | 4/2019 | Sonehara | H10B 43/27 |

FOREIGN PATENT DOCUMENTS

| | | |
|---|---|---|
| CN | 107546229 A | 1/2018 |
| CN | 108431955 A | 8/2018 |
| JP | 2011-060958 A | 3/2011 |
| KR | 10-2017-0014757 A | 2/2017 |
| KR | 10-2017-0057060 A | 5/2017 |
| KR | 20180001301 A | 1/2018 |

OTHER PUBLICATIONS

First Notification of Office Action from China National Intellectual Property Administration dated Feb. 25, 2023 for Application No. 201911059396.6.

* cited by examiner

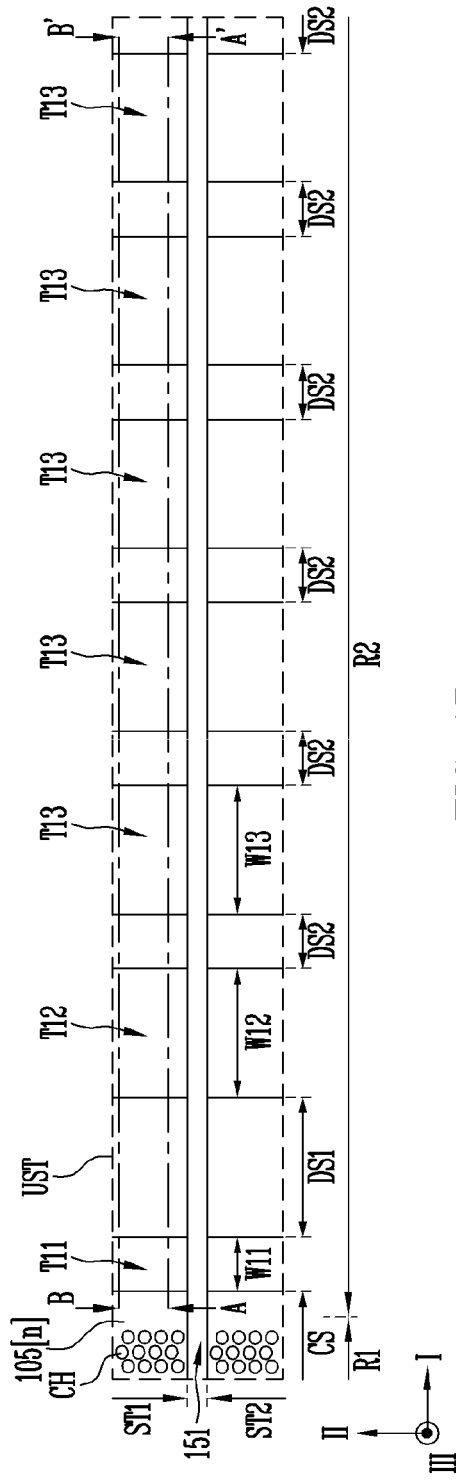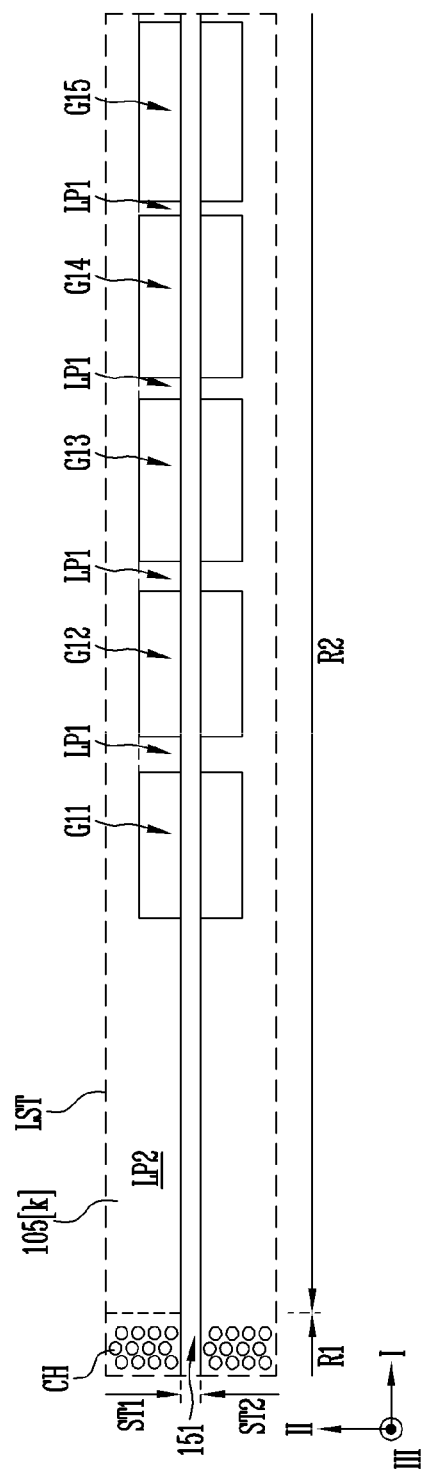

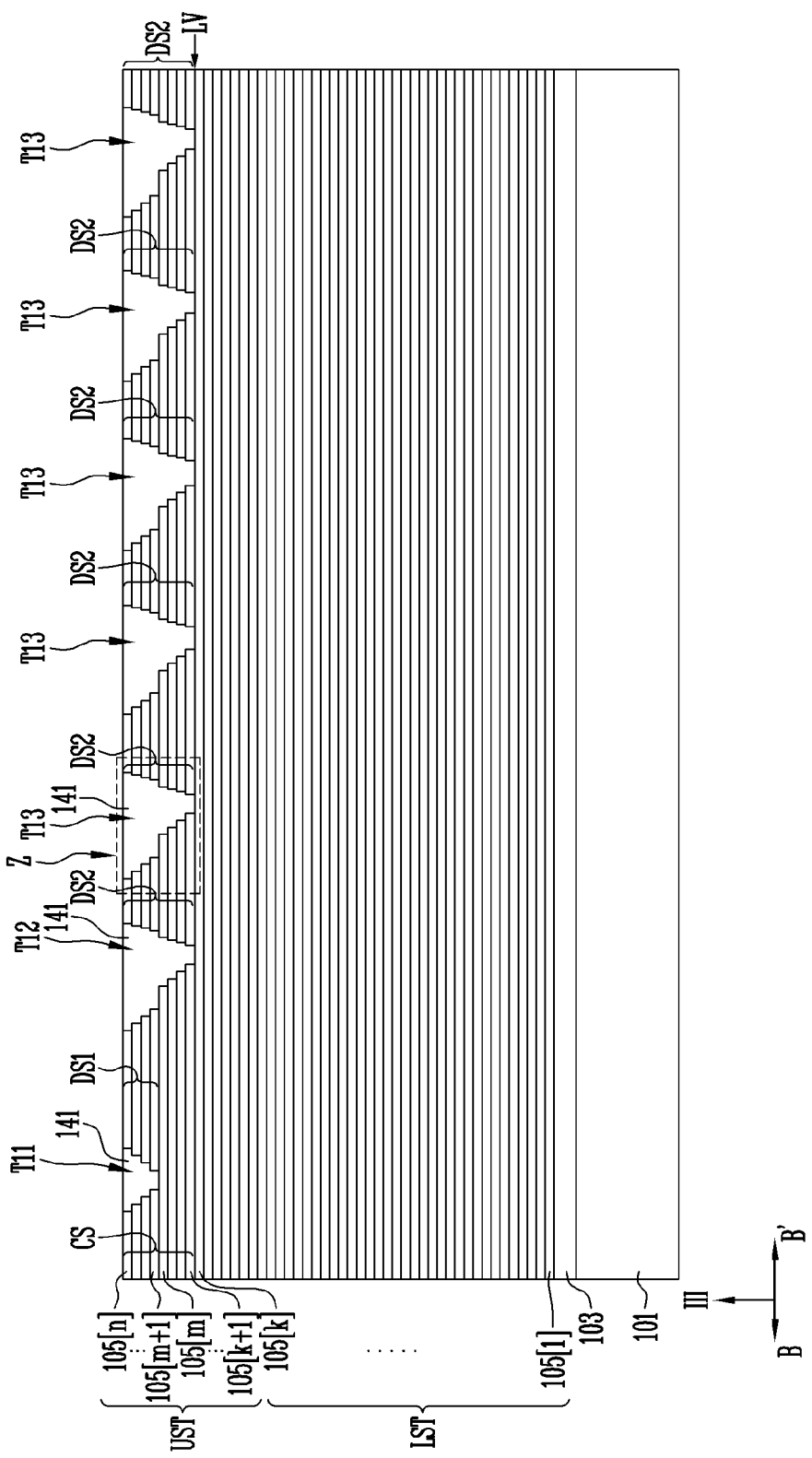

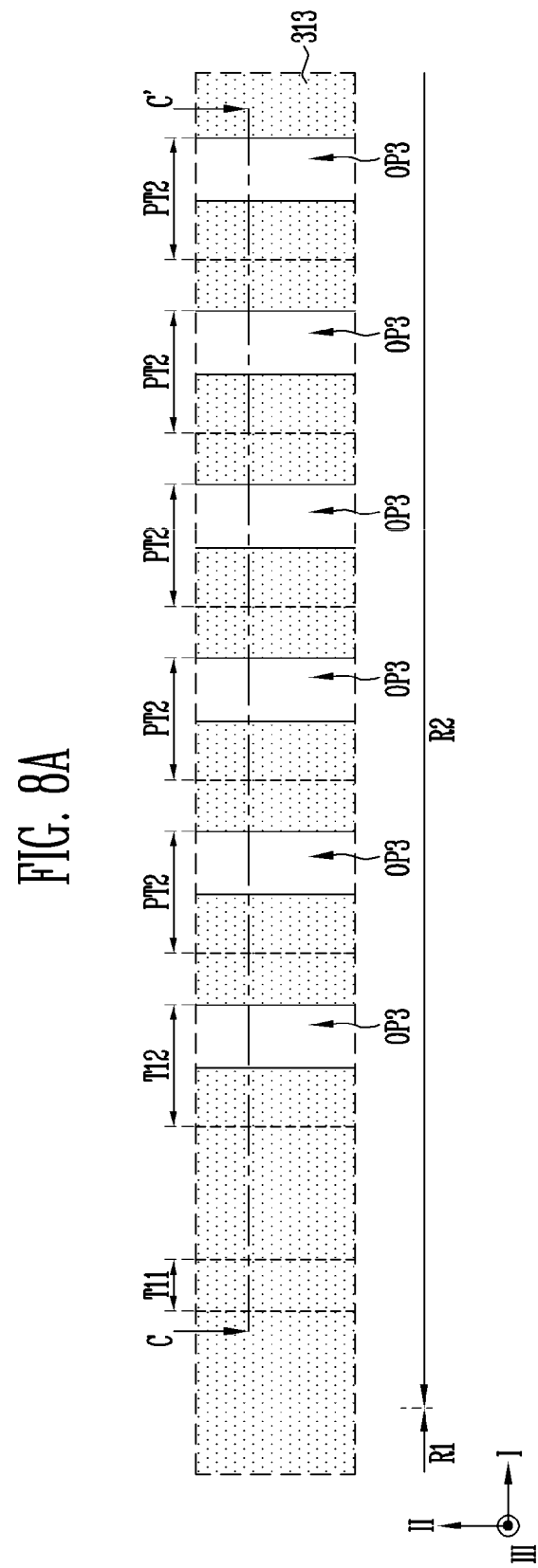

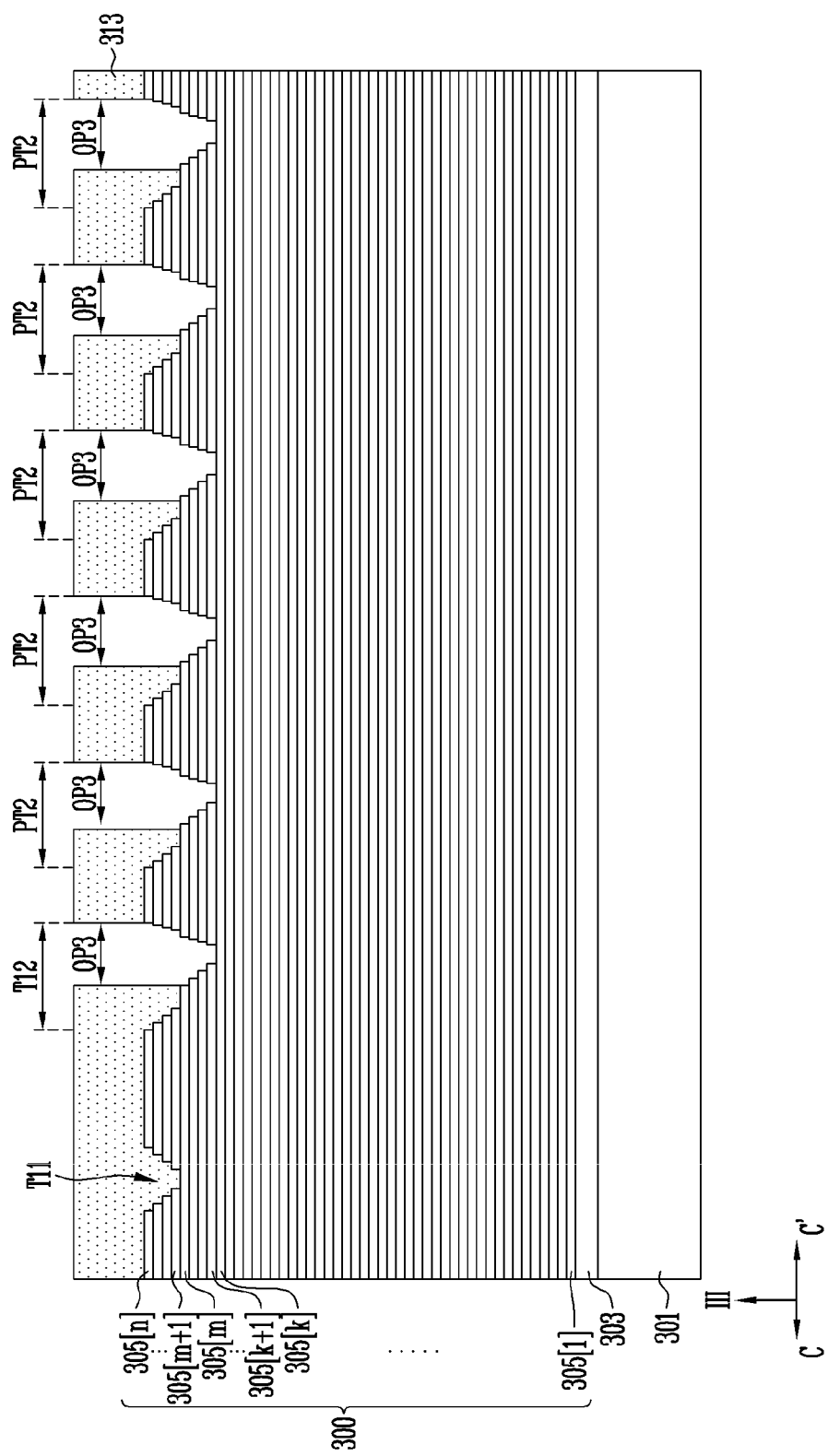

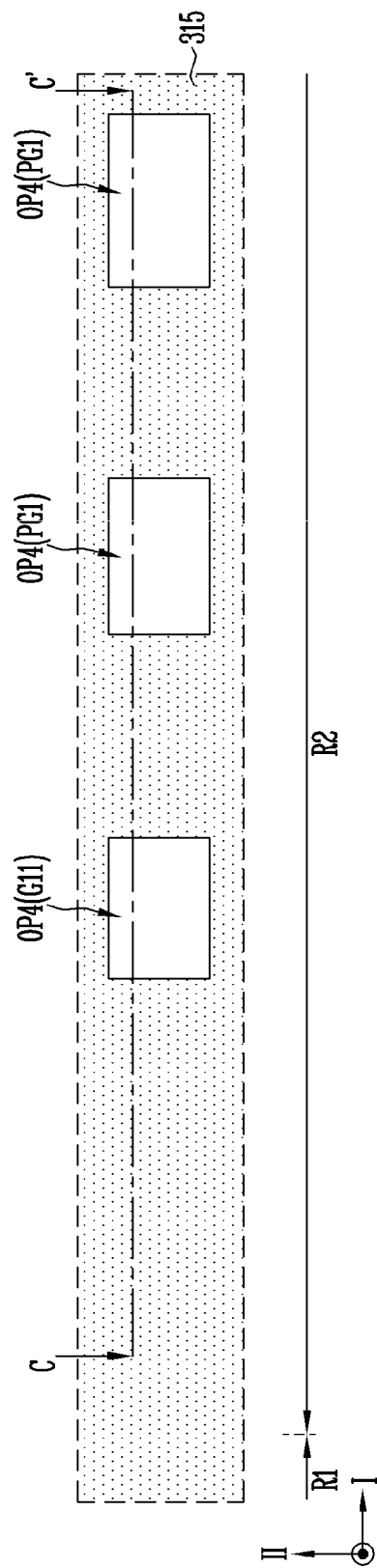

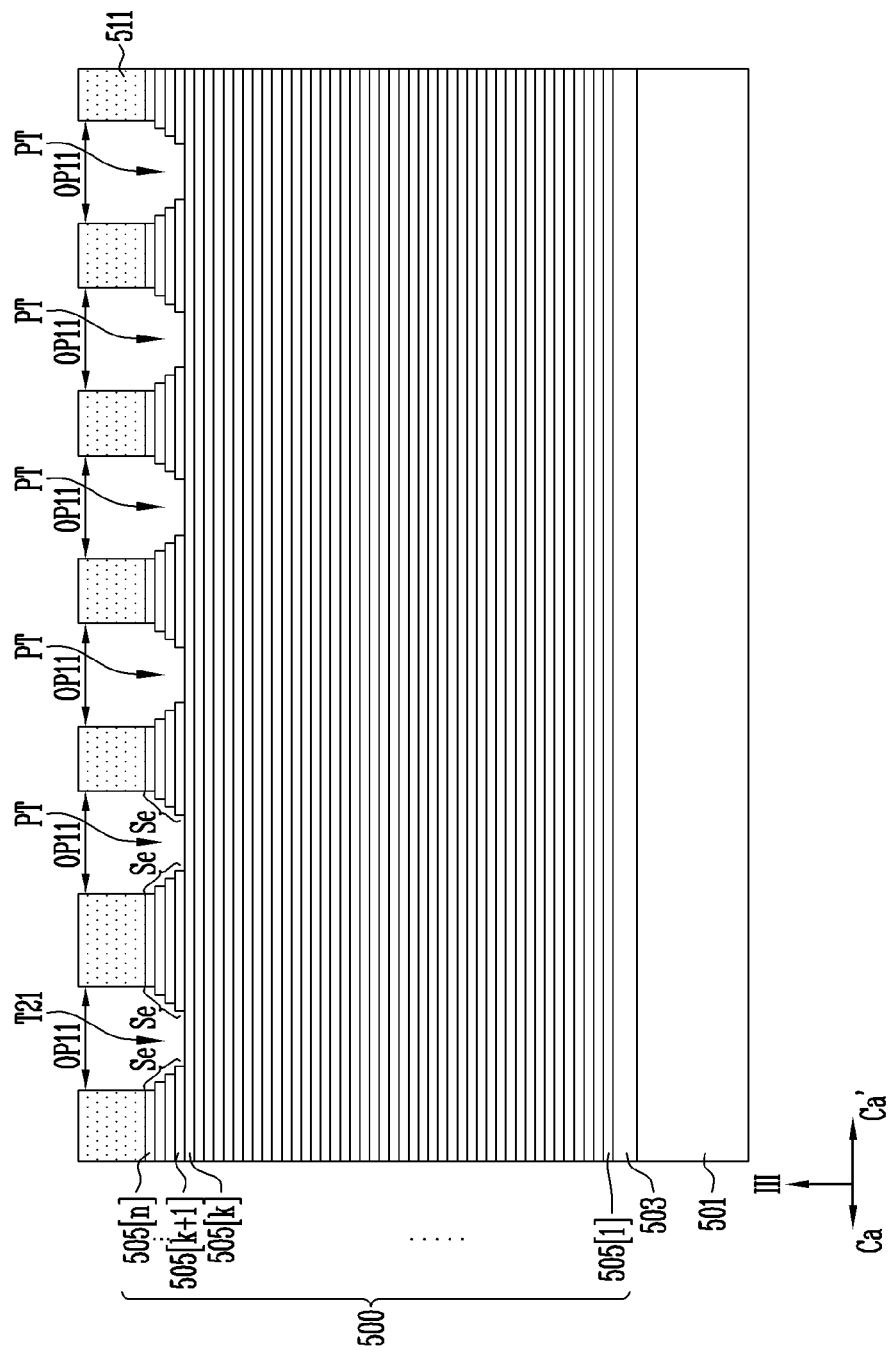

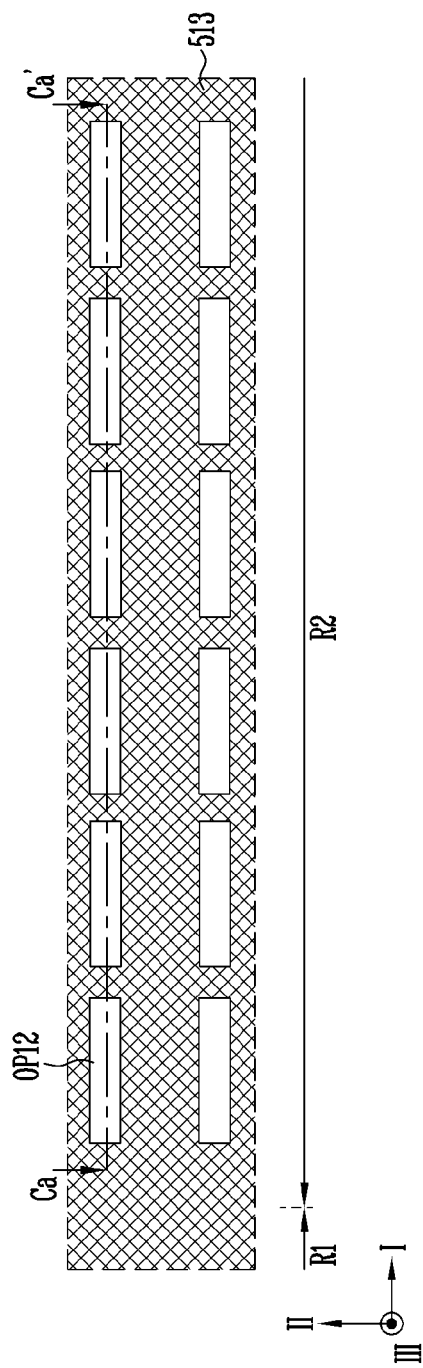

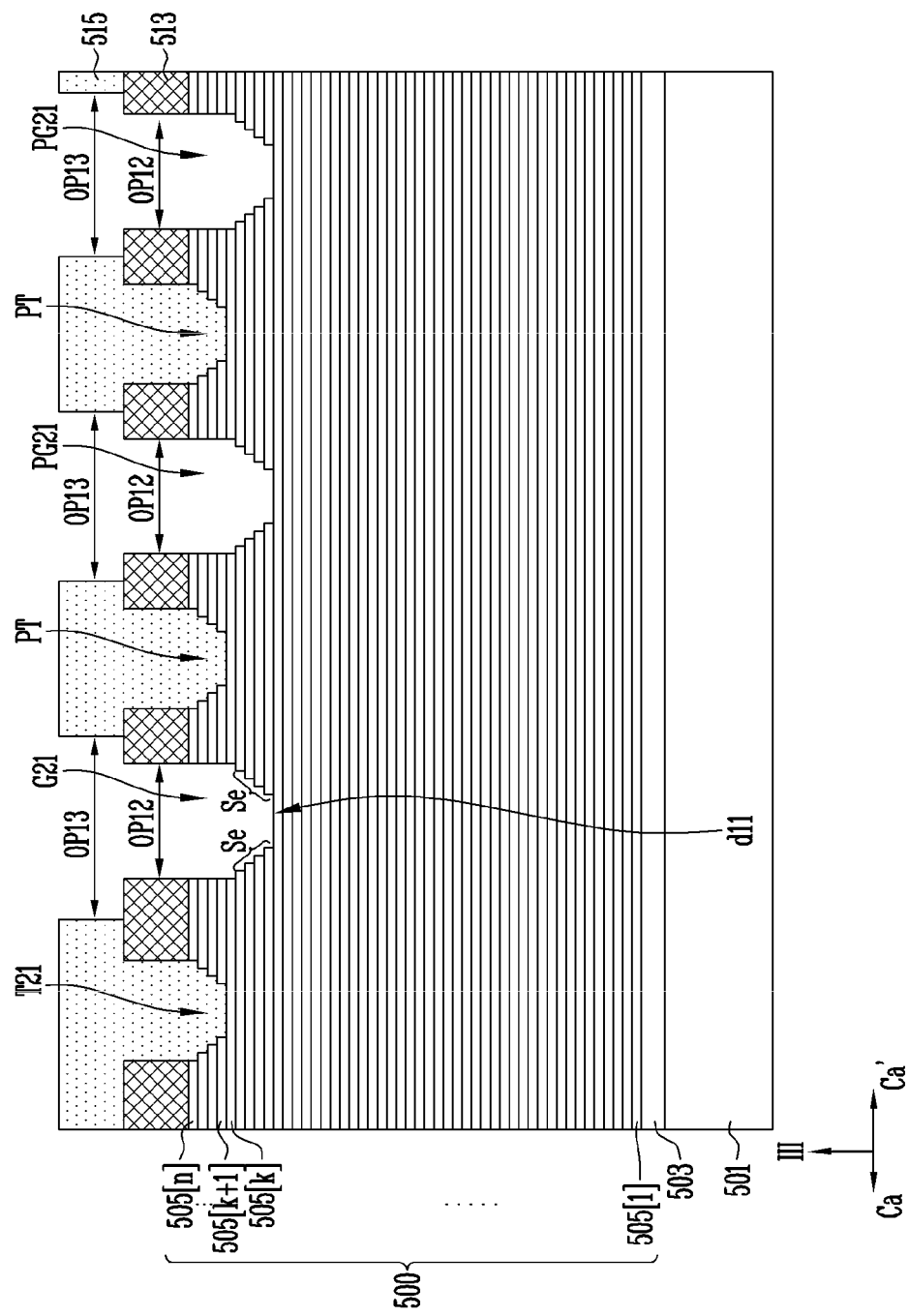

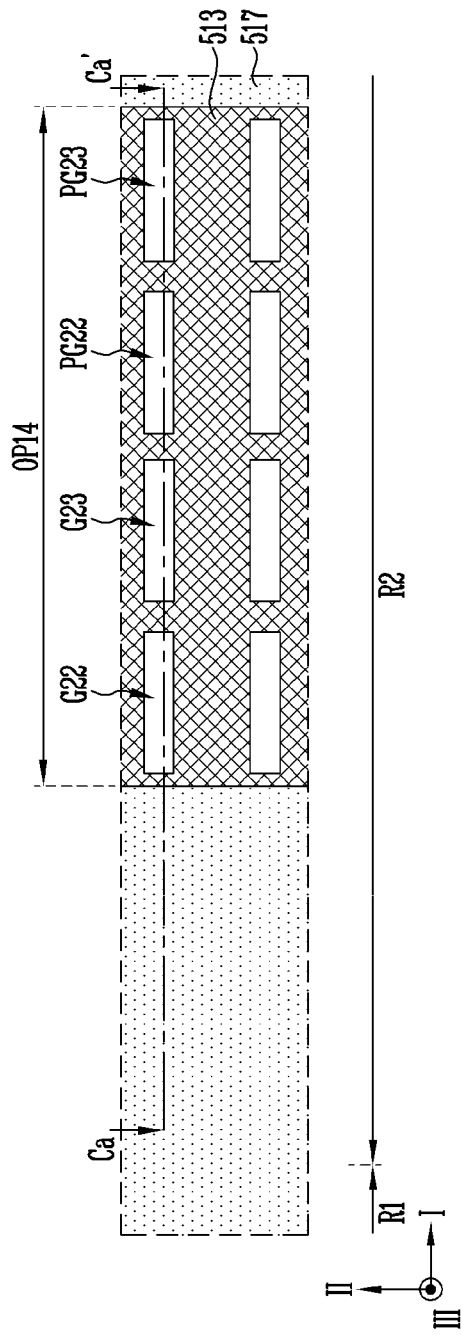

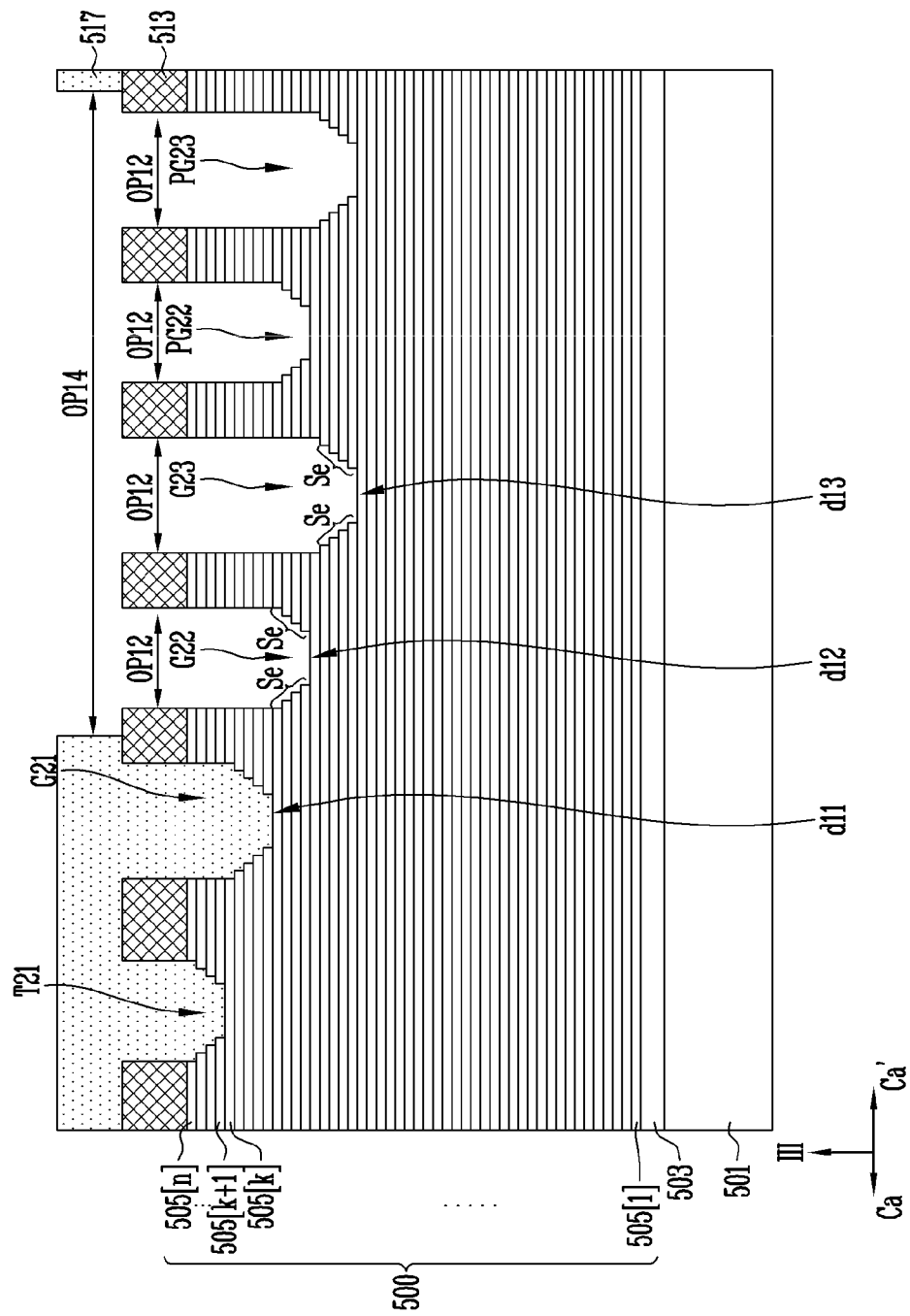

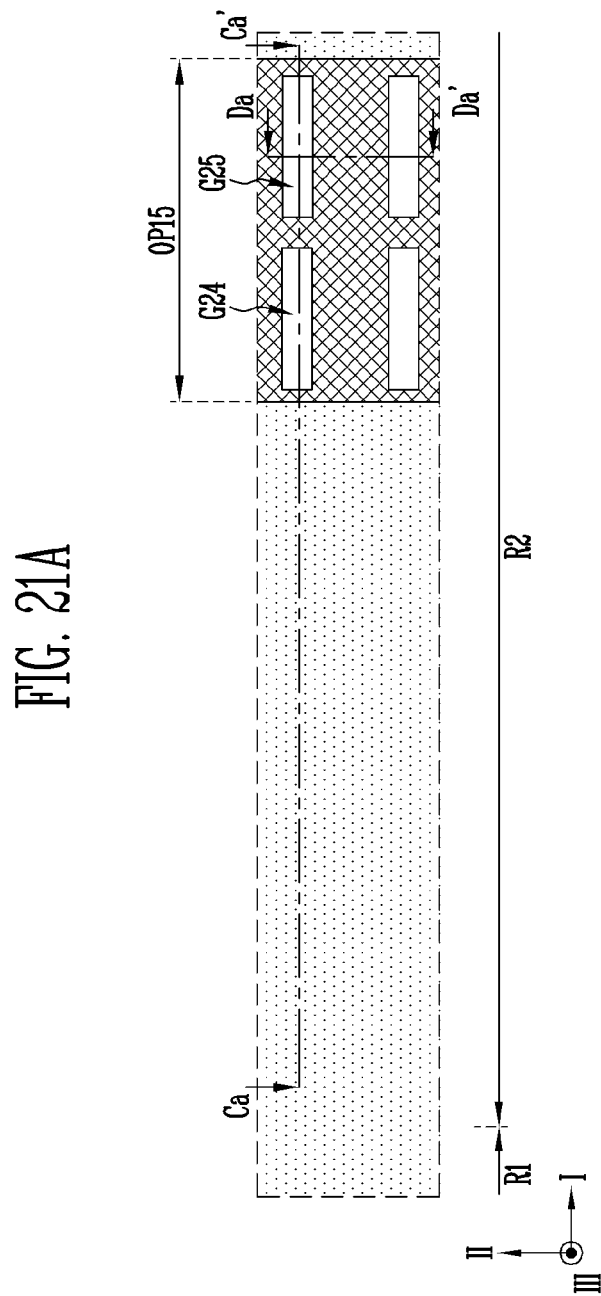

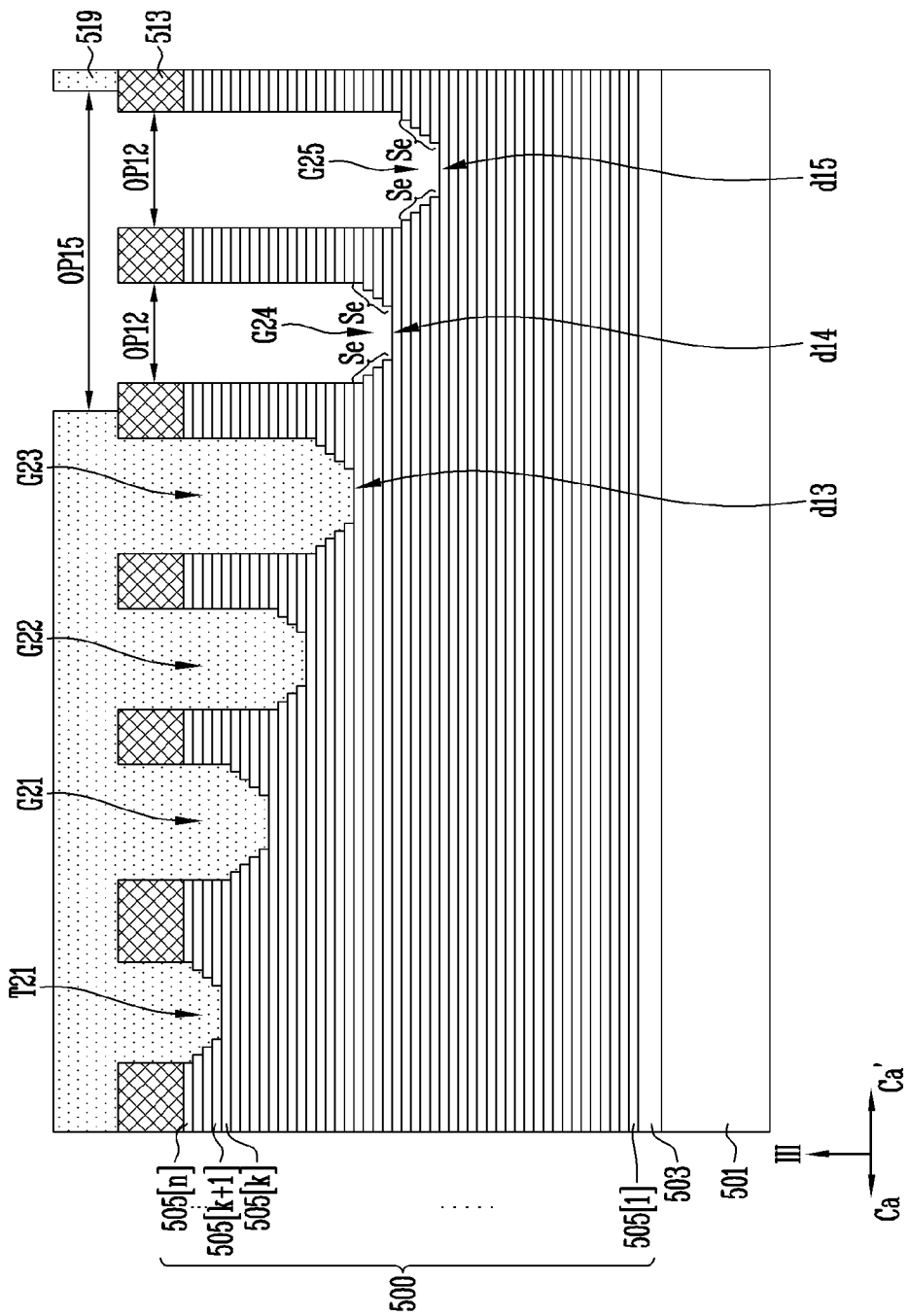

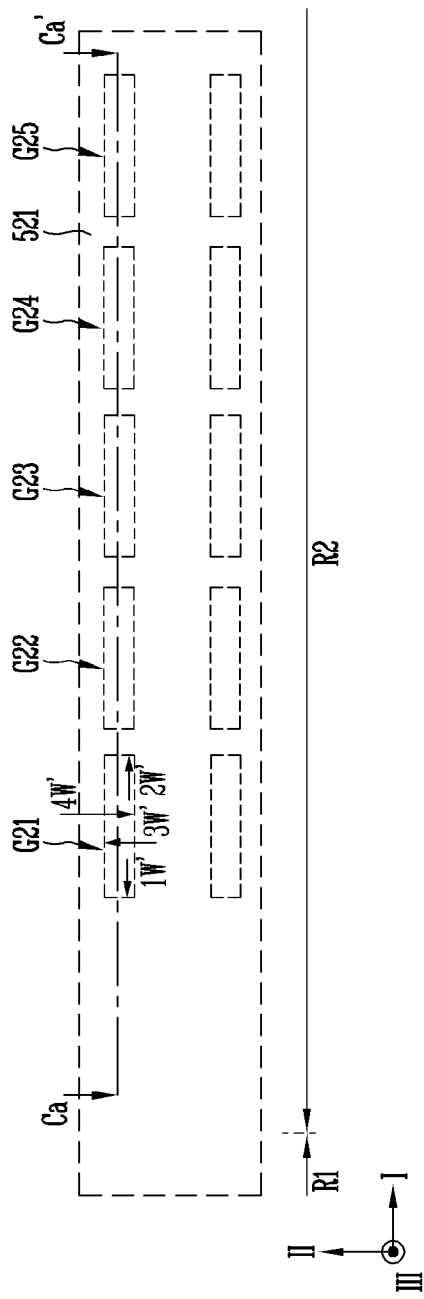

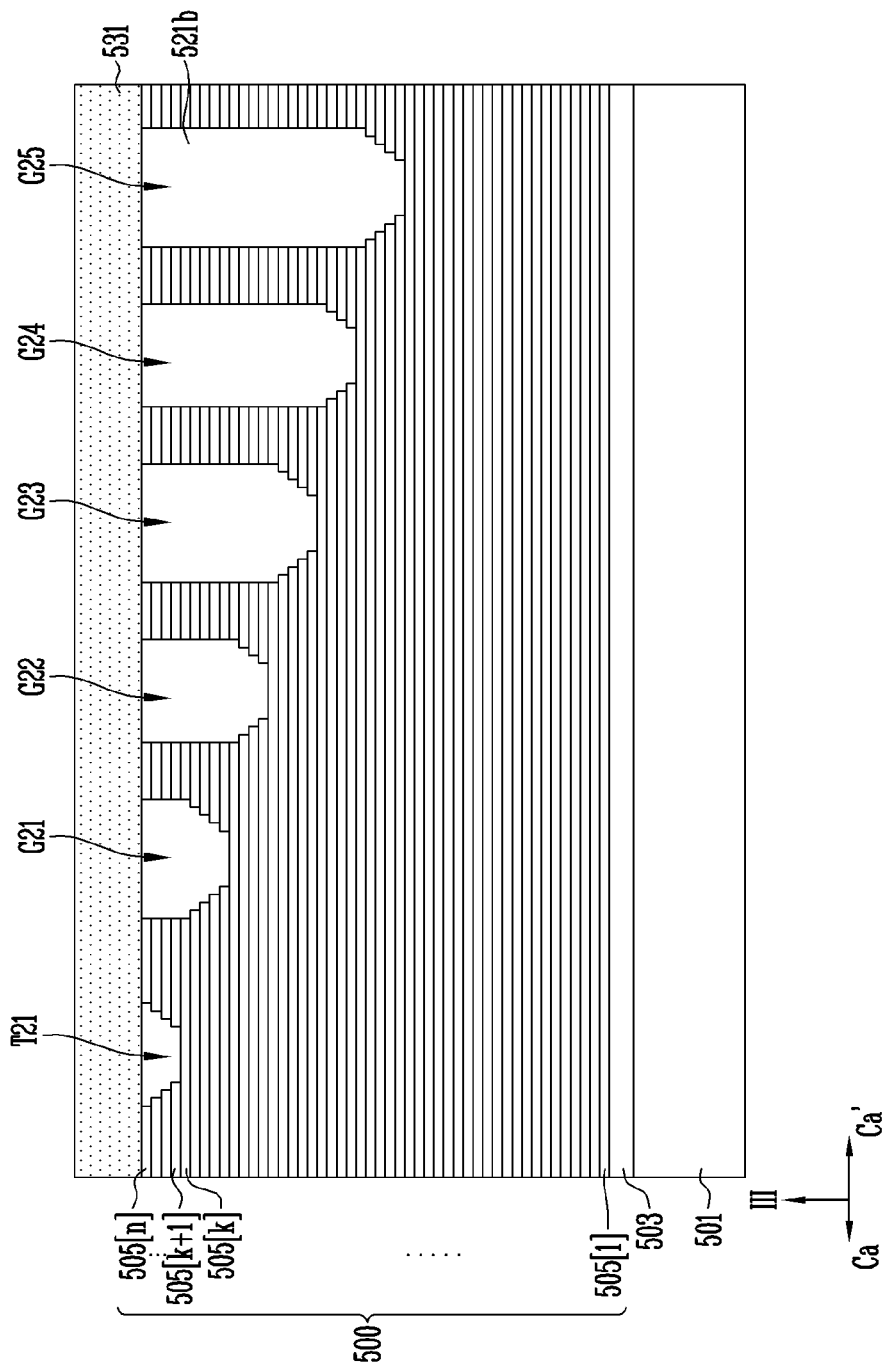

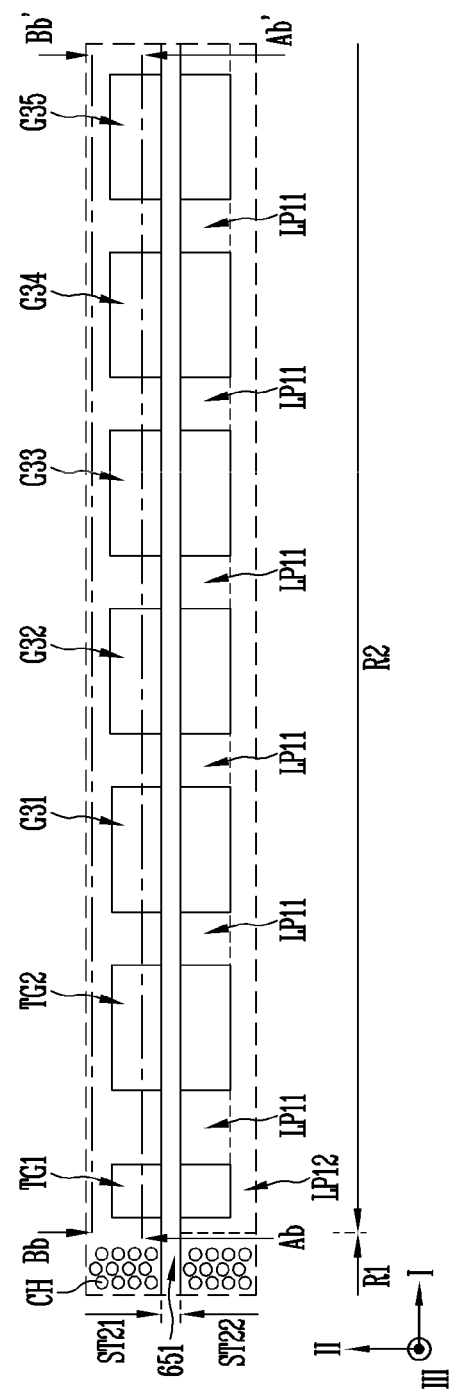

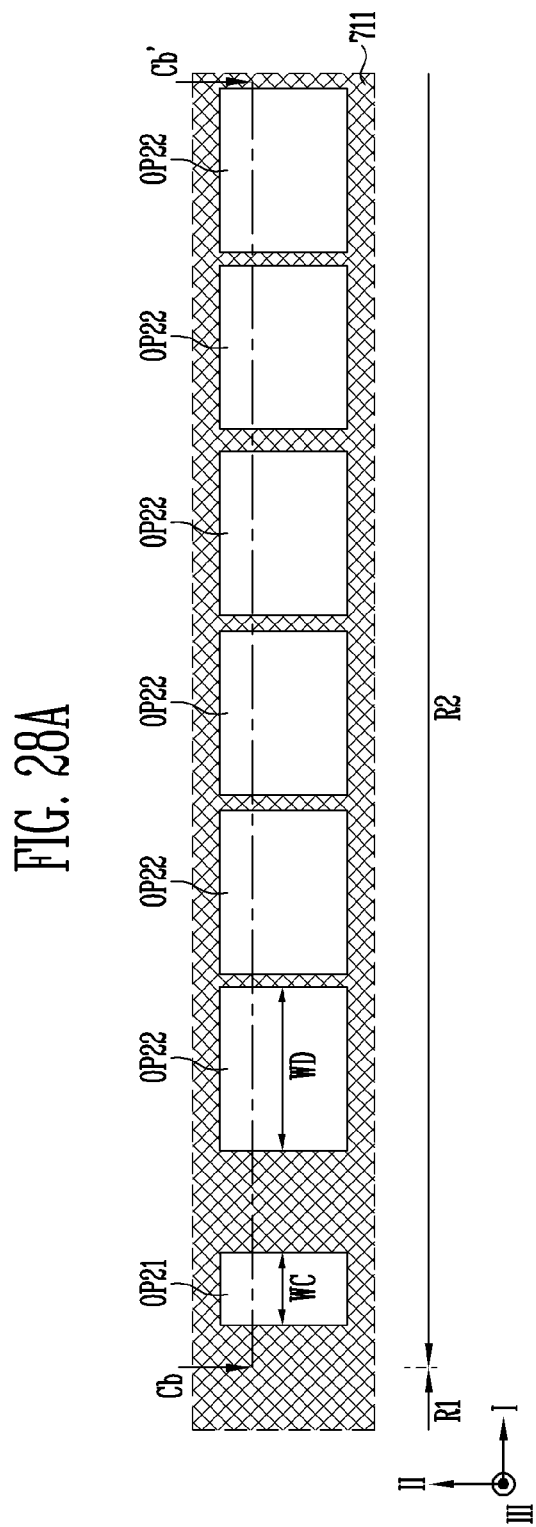

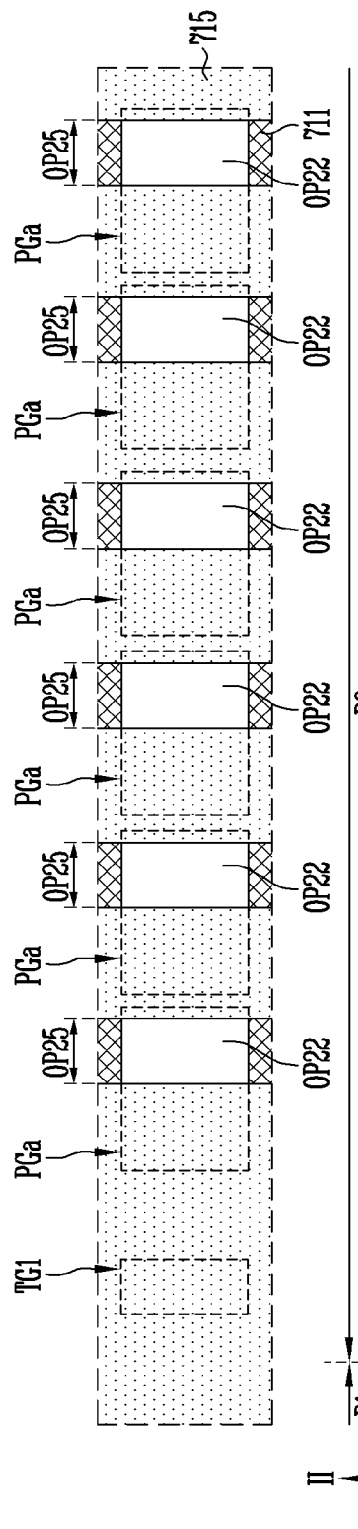
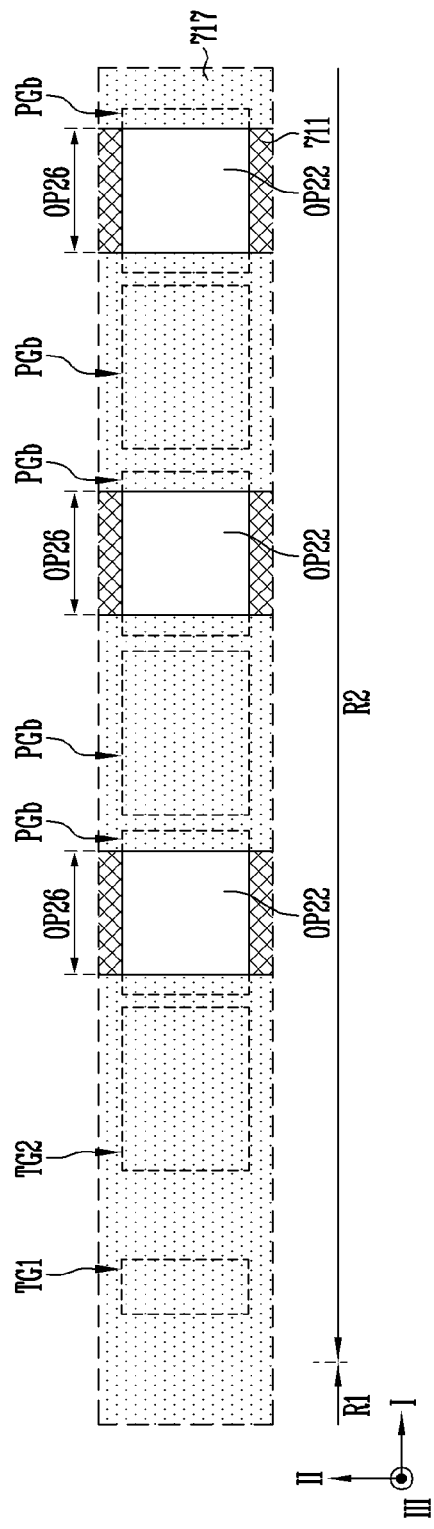
FIG. 30A
FIG. 30B

SEMICONDUCTOR MEMORY DEVICE AND MANUFACTURING METHOD THEREOF

CROSS-REFERENCE TO RELATED APPLICATION

The present application is a continuation of U.S. application Ser. No. 17/387,787, filed on Jul. 28, 2021, which is a continuation of U.S. application Ser. No. 16/597,603, filed on Oct. 9, 2019 and now issued as U.S. Pat. No. 11,107,729, which claims priority under 35 U.S.C. § 119(a) to Korean patent application number 10-2019-0030157, filed on Mar. 15, 2019, which is incorporated by reference herein.

BACKGROUND

1. Technical Field

The present disclosure generally relates to a semiconductor memory device and a manufacturing method thereof, and more particularly, to a three-dimensional semiconductor memory device and a manufacturing method thereof.

2. Related Art

A semiconductor memory device may include a memory cell array including a plurality of memory cells. In order to improve the degree of integration of memory cells, a three-dimensional semiconductor memory device has been proposed.

The three-dimensional semiconductor memory device includes memory cells arranged in three dimensions. In order to improve the degree of integration, the number of memory cells vertically stacked on a substrate may be increased. However, the structural stability of the three-dimensional semiconductor memory device and the stability of a manufacturing process of the three-dimensional semiconductor memory device may be reduced as the number of cell layers increases. In addition, some of the process that are used to form single layer devices or devices with a few layers lead to defects when more layers are present.

SUMMARY

In an embodiment of the present disclosure, a method for forming a semiconductor device includes forming a stacked structure having a plurality of stacked layers, forming a plurality of stepped trenches having a first depth in the stacked structure by etching the stacked structure, each of the stepped trenches having first and second opposing stepped sidewalls that each have a plurality of steps, forming an etch stop pattern having a hard mask material over a top surface of the stacked structure, the etch stop pattern including a plurality of openings exposing portions of the plurality of stepped trenches, forming a first photoresist pattern over the etch stop pattern, the photoresist pattern filling a first portion of the openings and exposing a second portion of the openings, and etching the second portion of the openings using the etch stop pattern as an etch mask to extend a bottom of the stepped trenches exposed by the second portion of the openings to a second depth lower than the first depth.

In an embodiment, the semiconductor device has a cell region and a contact region. Etching the second portion of the openings forms a first groove, and a first stepped trench of the plurality of stepped trenches is disposed between the first groove and the cell region. The first photoresist pattern is removed from the first portion of the openings, and the process may further include forming a second photoresist pattern that covers the first groove, and etching a third portion of the openings using the hard mask pattern and the second photoresist pattern as etch masks. Etching the third portion of the openings includes forming a second groove adjacent to the first groove, the second groove having a depth greater than that of the first groove. Etching the third portion of the openings includes forming a third groove adjacent to the second groove, the third groove having a depth greater than that of the second groove. These steps may form a device with a series of stepped grooves having different depths.

In an embodiment, the plurality of openings of the etch stop pattern extends in a first direction, and the plurality of stepped trenches extends in a second direction perpendicular to the first direction. The stacked structure may have a plurality of first layers alternating with a plurality of second layers, the second layers comprising a different material from the first layers, and each of the steps has at least one of the first layers and at least one of the second layers.

In an embodiment, the stacked structure comprises at least 32 of the first layers and at least 32 of the second layers, and etching the second portion of the grooves includes etching at least 8 of the dielectric layers and at least 8 of the conductive material layers. In another embodiment, the stacked structure comprises at least 96 of the dielectric layers and 96 of the conductive material layers, and etching the second portion of the grooves includes etching at least 16 of the dielectric layers and at least 16 of the conductive material layers.

Edges of openings in the photoresist pattern may be set back from edges of openings in the etch stop pattern so that edges of the openings in the etch stop pattern with the hard mask material define sidewalls of grooves by a vertical etch process. The first stepped sidewalls may be asymmetric to the second stepped sidewalls, and the second stepped sidewalls may be dummy structures.

In an embodiment, the semiconductor device includes a cell region and a contact region and steps of the first stepped sidewalls are contact pads for the contact region, and the method includes respectively forming vertical contacts on the contact pads. The openings in the etch mask pattern may be used to form a plurality of grooves having different depths, and the method may include filling the plurality of grooves with an insulating material and removing a portion of the insulating material using the etch stop pattern as a stop layer.

The openings in the etch stop pattern may be substantially rectangular openings that are used to define sidewalls of a plurality of grooves through a plurality of etching processes, so that the substantially rectangular openings define four sidewalls of each of the plurality of grooves. The semiconductor device may be a memory device that includes at least 192 layers in the stacked layers.

BRIEF DESCRIPTION OF THE DRAWINGS

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 1A and 1B illustrate layouts of a semiconductor memory device in accordance with an embodiment of the present disclosure.

FIGS. 2A and 2B illustrate cross-sections of the semiconductor memory device in accordance with an embodiment of the present disclosure.

FIGS. 7A and 7B, 8A to 8C, 9A and 9B, 10A and 10B, 11A to 11C, and 12A to 12C are views illustrating a manufacturing method of the semiconductor memory device in accordance with an embodiment of the present disclosure.

FIGS. 17A and 17B, 18A and 18B, 19A and 19B, 20A and 20B, 21A to 21C, 22A and 22B, 23, and 24A and 24B are views illustrating a manufacturing method of the semiconductor memory device in accordance with an embodiment of the present disclosure.

FIG. 25 illustrates a layout of a semiconductor memory device in accordance with an embodiment of the present disclosure.

FIGS. 28A and 28B, 29A and 29B, and 30A to 30D are views illustrating a manufacturing method of a semiconductor memory device in accordance with an embodiment of the present disclosure.

DETAILED DESCRIPTION

Figure 2A:
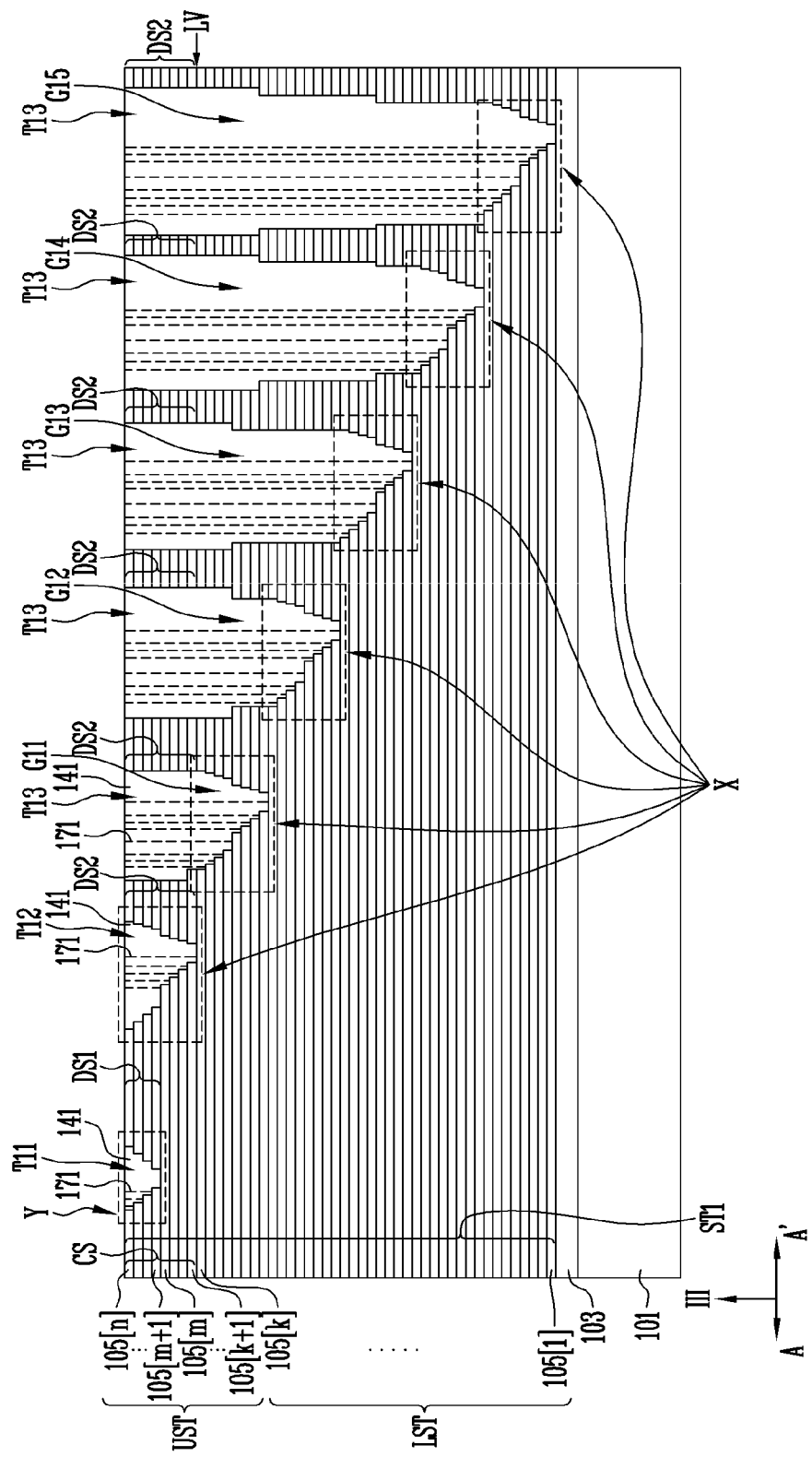

The specific structural or functional description disclosed herein is merely illustrative for the purpose of describing embodiments according to the concept of the present disclosure. Embodiments according to the present disclosure can be implemented in various forms, and are not limited to the embodiments set forth herein.

While terms such as "first" and "second" may be used to describe various components, these terms are used only to distinguish one component from another. For example, a first component may be referred to as a second component, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present.

The terms used in the present application are merely used to describe particular embodiments, and are not intended to limit the present disclosure. Singular forms in the present disclosure do not preclude multiple instances of the terms, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added. The term "substantially" refers to a property, e.g. a shape or orientation, that is within engineering tolerance.

In the drawings, dimensions of components may be exaggerated for convenience of illustration.

Embodiments provide a stable three dimensional (3D) semiconductor memory device and a manufacturing method of the semiconductor memory device with reduced costs and defects.

FIGS. 1A and 1B illustrate layouts of a semiconductor memory device in accordance with an embodiment of the present disclosure. FIG. 1A illustrates a layout of an upper stack structure UST, and FIG. 1B illustrates a layout of a lower stack structure LST disposed under the upper stack structure UST. FIG. 1A illustrates a layout of an uppermost upper layer 105[n] of the upper stack structure UST, and FIG. 1B illustrates an uppermost lower layer 105[k] of the lower stack structure LST.

Referring to FIGS. 1A and 1B, the semiconductor memory device may include gate stack structures ST1 and ST2. Each of the gate stack structures ST1 and ST2 may have a cell region R1 and a contact region R2 extending in a horizontal direction I from the cell region R1. Directions I, II and III correspond to x, y and z directions in a cartesian coordinate system as indicated in the legend, where z is a vertical direction and x and y are perpendicular horizontal directions. Each of the gate stack structures ST1 and ST2 may be penetrated by channel structures CH arranged in the cell region R1. Each of the channel structures CH may include a semiconductor layer used as a channel region. Although not shown in the drawings, a memory layer may be formed along an interface between each of the channel structures CH and each of the gate stack structures ST1 and ST2. The memory layer may include a tunnel insulating layer, a data storage layer, and a blocking insulating layer, which are stacked toward a sidewall of each of the gate stack structures ST1 and ST2 from a sidewall of the channel structures CH. The tunnel insulating layer may include a silicon oxide layer through which charges can tunnel. The data storage layer may be formed of a charge trapping layer, a material layer including conductive nano dots, or a phase change material layer. For example, the data storage layer may be formed of a silicon nitride layer in which charges can be trapped. The blocking insulating layer may include an oxide capable of blocking charges.

Each of the gate stack structures ST1 and ST2 may be have an upper stack structure UST that overlaps with a lower stack structure LST. The upper stack structure UST and the lower stack structure LST are penetrated by a slit 151 extending in the third direction III and the first direction I. The slit 151 is disposed between adjacent gate stack structures ST1 and ST2, and separates the gate stack structures ST1 and ST2 from each other in the second direction II. The contact region R2 of each of the first and second gate stack structures ST1 and ST2 may extend in the first direction I from the cell region R1. The first gate stack structure ST1 and the second gate stack structure ST2 may be symmetrical with respect to the slit 151.

Referring to FIG. 1A, the upper stack structure UST may be divided into a cell structure CS and first and second dummy structures DS1 and DS2, which are separated from each other by first to third trenches T11 to T13. The first to third trenches T11 to T13 may extend in parallel to each other in the second direction II, and be spaced apart from each other in the first direction I. The first to third trenches T11 to T13 may overlap with the lower stack structure LST shown in FIG. 1B in the contact region R2. The slit 151 may divide the first to third trenches T11 to T13.

The first trench T11 may be disposed between the cell region R1 and the second trench T12, and penetrate a portion of the upper stack structure UST. The second trench T12 may penetrate the upper stack structure UST between the first trench T11 and the third trench T13. The third trenches T13 may respectively open grooves G11 to G15 shown in FIG. 1B. The third trenches T13 may penetrate the upper stack structure UST. A width W11 of the first trench T11 may be less than a width W12 of the second trench T12 and a width W13 of each of the third trenches T13.

Each of the gate stack structures ST1 and ST2 may include the upper stack structure UST forming the cell structure CS. The cell structure CS may be disposed in the cell region R1. An end portion of the cell structure CS may extend toward the contact region R2 to provide a pad region connected to contact plugs 171 shown in FIG. 2A. The cell structure CS is penetrated by the channel structure CH in the cell region R1.

The first and second dummy structures DS1 and DS2 may be spaced apart from each other in the horizontal direction by the second and third trenches T12 and T13. The first dummy structure DS1 adjacent to the cell structure CS may be spaced apart from the cell structure CS in the horizontal direction by the first trench T11. One second dummy structure adjacent to the first dummy structure DS1 among the second dummy structures DS2 may be spaced apart from the first dummy structure DS1 in the horizontal direction by the second trench T12. The second dummy structures DS2 may be spaced from each other in the horizontal direction by the third trenches T13. A portion of the upper stack structure UST may form each of the first and second dummy structures DS1 and DS2.

Referring to FIG. 1B, the lower stack structure LST extends from the cell region R1 to the contact region R2 to surround each of the grooves G11 to G15, and forms the gate stack structures ST1 and ST2. The lower stack structure LST is penetrated by the channel structures CH in the cell region R1.

The grooves G11 to G15 are disposed in the contact region R2 and spaced apart from each other. The grooves G11 to G15 may extend to different depths in the lower stack structure LST. The grooves G11 to G15 may be sequentially disposed in the first direction I. However, embodiments of the present disclosure are not limited thereto. For example, the grooves G11 to G15 may be arranged in various configurations in the horizontal direction. The slit 151 may extend through each of the groves G11 to G15. Each of the grooves G11 to G15 may include a first part disposed in the first gate stack structure ST1 and a second part disposed in the second gate stack structure ST2.

The lower stack structure LST may include connection parts disposed in the contact region R2. For example, the lower stack structure LST may include first connection parts LP1 and a second connection part LP2. The first connection parts LP1 may be parts of the lower stack structure LST, which are disposed between adjacent grooves G11 to G15. The second connection part LP2 may be a part of the lower stack structure LST, which extends in the first direction I towards the first connection parts LP1 from the cell region R1. The second connection part LP2 may be connected to the first connection parts LP1. Each of the grooves G11 to G15 is surrounded by a sidewall defined by first and second connection parts.

FIGS. 2A and 2B illustrate cross-sections of the semiconductor memory device in accordance with an embodiment of the present disclosure. FIG. 2A illustrates a cross-section of the semiconductor memory device taken along line A-A' shown in FIG. 1A, and FIG. 2B illustrates a cross-section of the semiconductor memory device taken along line B-B' shown in FIG. 1A.

Referring to FIGS. 2A and 2B, the lower stack structure LST and the upper stack structure UST may be disposed on a lower structure 101.

The lower structure 101 may include a substrate. The substrate may include at least one of silicon (Si), germanium (Ge), silicon germanium (SiGe), gallium arsenide (GaAs), indium gallium arsenide (InGaAs), or aluminum gallium arsenide (AlGaAs), or any combination thereof. The substrate may be a bulk silicon substrate, a silicon-on-insulator substrate, a germanium substrate, a germanium-on-insulator substrate, a silicon-germanium substrate, or an epitaxial thin film formed through a selective epitaxial growth process.

The lower structure 101 may include a peripheral circuit formed on the above-described substrate. The peripheral circuit may include a row decoder, a page buffer, a column decoder, and the like. At least a portion of the peripheral circuit may overlap with the lower stack structure LST and the upper stack structure UST.

The lower structure 101 may be covered with an insulating layer 103. The lower stack structure LST and the upper stack structure UST may be disposed on the insulating layer 103.

The lower stack structure LST may include lower layers 105[1] to 105[k] stacked on each other. The upper stack structure UST may include first upper layers 105[k+1] to 105[m] stacked on the lower stack structure LST and second upper layers 105[m+1] to 105[n] stacked on the first upper layers 105[k+1] to 105[m].

The grooves G11 to G15 may extend to different depths toward the inside of the lower stack structure LST from a height LV at which an interface between the lower stack structure LST and the upper stack structure UST is disposed. In other words, bottom surfaces of the grooves G11 to G15 may be disposed at different levels. The grooves G11 to G15 may be opened by the third trenches T13.

The third trenches T13 may overlap with the grooves G11 to G15. The third trenches T13 may extend in the horizontal direction as shown in FIG. 1A to open the uppermost lower layer 105[$k$] of the lower stack structure LST. The third trenches T13 extend in the third direction III and penetrate the second upper layers 105[$nn$+1] to 105[$n$] and the first upper layers 105[$k$+1] to 105[$m$]. The third trenches T13 may have sidewalls overlapping with the first connection parts LP1 shown in FIG. 1B and sidewalls overlapping with the second connection part LP2 shown in FIG. 1B. The sidewalls of the third trenches T13, which overlap with the second connection part LP2, are shown in FIG. 2A, and the sidewalls of the third trenches T13, which overlap with the second connection part LP2, are shown in FIG. 2B. A gradient of the sidewall of each of the third trenches T13, which is shown in FIG. 2A, may be greater than that of the sidewall of each of the third trenches T13, which is shown in FIG. 2B. For example, a portion of each of the third trenches T13, which overlaps with the first connection part LP1 shown in FIG. 2A, may have vertical or substantially vertical sidewalls.

The first trench T11 is disposed between the cell region R1 shown in FIG. 1A and the grooves G11 to G15, and extends in the third direction III to penetrate the second upper layers 105[$nn$+1] to 105[$n$]. The first trench T11 overlaps with the first upper layers 105[$k$+1] to 105[$m$]. The uppermost first upper layer 105[$m$] may be a bottom surface of the first trench T11.

The second trench T12 extends in the third direction III to penetrate the second upper layers 105[$nn$+1] to 105[$n$] and the first upper layers 105[$k$+1] to 105[$m$] between the first trench T11 and the grooves G11 to G15. The second trench T12 may overlap with the lower stack structure LST, and the uppermost lower layer 105[$k$] may be a bottom surface of the second trench T12.

The lower layers 105[1] to 105[$k$] may constitute the gate stack structure ST1. Portions of the respective first upper layers 105[$k$+1] to 105[$m$] constituting the cell structure CS and portions of the respective second upper layers 105[$nn$+1] to 105[$n$] may constitute the gate stack structure ST1. The first dummy structure DS1 may overlap with the first upper layers 105[$k$+1] to 105[$m$] of the cell structure CS. The first dummy structure DS1 may be configured with other portions of the respective second upper layers 105[$nn$+1] to 105[$n$]. Each of the second dummy structures DS2 may overlap with the lower stack structure LST. Each of the second dummy structures DS2 may be configured with other portions of the respective first upper layers 105[$k$+1] to 105[$m$] and still other portions of the respective second upper layers 105[$nn$+1] to 105[$n$]. The flatness in the contact region R2 can be improved by the first and second dummy structures DS1 and DS2, which can provide support to avoid dishing in a polishing operation.

Each of the grooves G11 to G15 and the first to third trenches T11 to T13 may be filled with a gap fill insulating layer 141. Referring to the X, Y and Z regions illustrated in FIG. 2A and FIG. 2B, each of the grooves G11 to G15 and the first to third trenches T11 to T13 may include a stepped structure comprising a plurality of steps. The stepped structure formed in each of the first and second trenches T11 and T12 and the grooves G11 to G15 may be defined by the layers 105[1] to 105[$n$] of the gate stack structure ST1, and exposed top surfaces of the steps may provide pad regions connected to contact plugs 171. Each of the contact plugs 171 may extend in the third direction III to penetrate the gap fill insulating layer 141. The X regions and the Y region include portions of the gate stack structure ST1, which are adjacent to the bottom surfaces of the grooves G11 to G15 and the first and second trenches T11 and T12. The Z region includes a portion of the upper stack structure UST, which overlaps with the second connection part LP2 shown in FIGS. 1B and 1$s$ adjacent to any one of the third trenches T13. The shape of stepped structures formed in the X regions and the Z region may be substantially the same.

Figure 3:
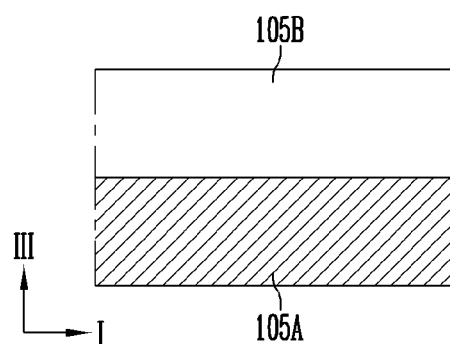
FIG. 3 illustrates a stacked structure of each of lower layers and first and second upper layers, which are shown in FIGS. 2A and 2B.

FIG. 3 illustrates a structure of each of the layers 105 which are shown in FIGS. 2A and 2B.

Referring to FIG. 3, each of the lower layers 105[1] to 105[$k$], the first upper layers 105[$k$+1] to 105[$m$], and the second upper layers 105[$nn$+1] to 105[$n$], which are shown in FIGS. 2A and 2B, may comprise a conductive layer 105A and an interlayer insulating layer 105B. The conductive layer 105A and the interlayer insulating layer 105B may be alternately stacked in the third direction III. Each of the contact plugs 171 shown in FIG. 2A extends to be in contact with a conductive layer 105A that is exposed in a step.

Referring to FIGS. 2A and 2B, the conductive layers 105A constituting the layers 105[1] to 105[$n$] included in the gate stack structure ST1 may include gate electrodes surrounding the channel structures CH shown in FIGS. 1A and 1B. The gate electrodes may include word lines connected to memory cells and select lines connected to select transistors. For example, the conductive layers 105A included in the second upper layers 105[$nn$+1] to 105[$n$] of the gate stack structure ST1 may be used as first select lines, and the conductive layers 105A included in the first upper layers 105[$k$+1] to 105[$m$] and the lower layers 105[1] to 105[$k$] of the gate stack structure ST1 may be used a word lines or second select lines.

Figure 4A:
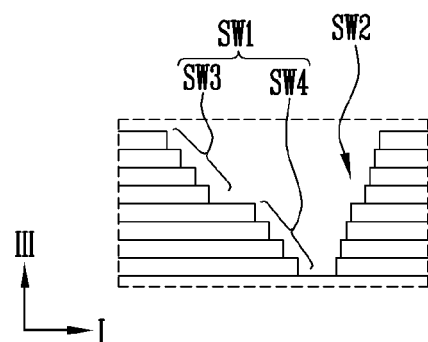
FIGS. 4A and 4B are sectional views illustrating stepped structures shown in FIGS. 2A and 2B.
Figure 4B:
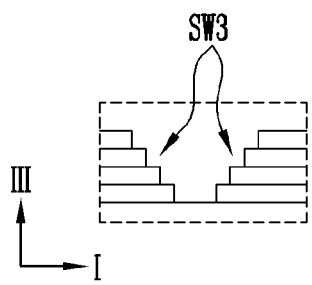

FIGS. 4A and 4B are sectional views illustrating the stepped structures shown in FIGS. 2A and 2B. FIG. 4A illustrates a first stepped structure SW1 and a second stepped structure SW2, which are formed in the X regions shown in FIG. 2A and the Z region shown in FIG. 2B. FIG. 4B illustrates a third stepped structure SW3 formed in the Y region shown in FIG. 2A.

Referring to FIG. 4A, each of the second trench T12, the grooves G11 to G15, and the third trenches T13, which are shown in FIGS. 2A and 2B, may have a sidewall of the first stepped structure SW1 and a sidewall of the second stepped structure SW2, which face each other. The first stepped structure SW1 and the second stepped structure SW2 may have different gradients, or slopes. For example, the first stepped structure SW1 may have a gradient smaller than that of the second stepped structure SW2. The first stepped structure SW1 having a relatively small gradient may be used as a pad region.

Referring to FIG. 4B, the first trench T11 shown in FIGS. 2A and 2B may include sidewalls that have structures symmetrical to each other and face each other. Both of the sidewalls of the first trench T11 may have the third stepped structure SW3. The third stepped structure SW3 of the first trench T11 may be include end portions of the second upper layers 105[M+1] to 105[$n$], which extend toward the sidewalls of the first trench T11 shown in FIG. 2A.

Referring back to FIG. 4A, the first stepped structure SW1 may include an upper portion formed in a shape of the third stepped structure SW3 shown in FIG. 4B and a lower portion formed in a shape of a fourth stepped structure SW4.

Figure 5A:
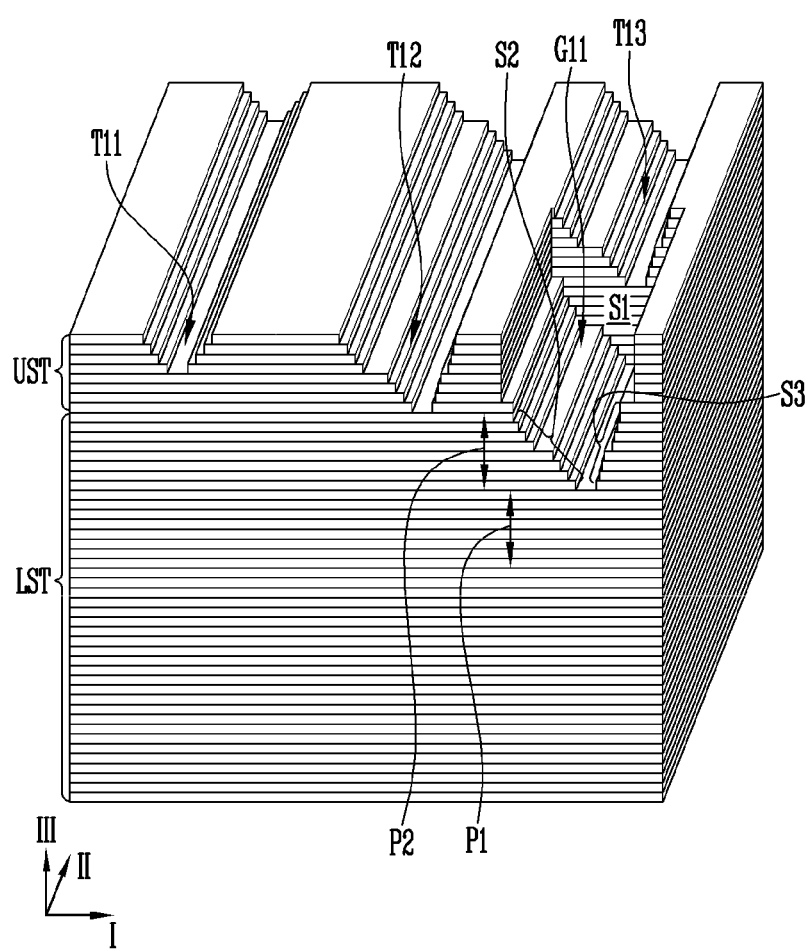
FIGS. 5A and 5B are perspective views illustrating structures of first to third trenches and grooves, which are shown in FIGS. 1A and 1B.
Figure 5B:
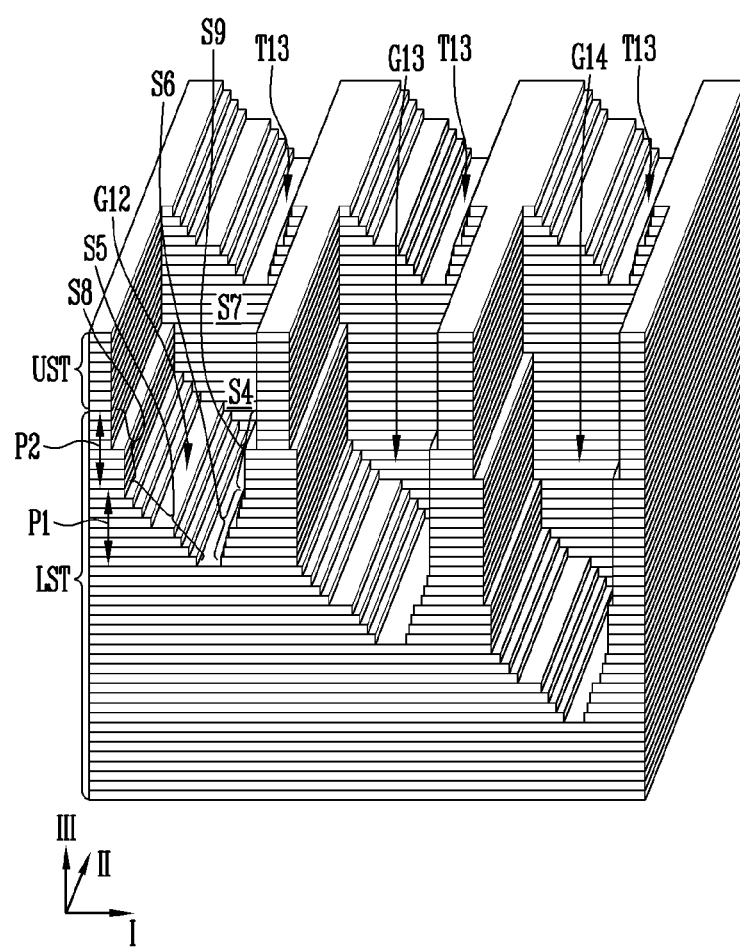

FIGS. 5A and 5B are perspective views illustrating structures of the first to third trenches and the grooves, which are shown in FIGS. 1A and 1B. FIGS. 5A and 5B illustrate a portion of the gate stack structure.

Referring to FIGS. 5A and 5B, the first to third trenches T11 to T13 are disposed in the upper stack structure UST, and the grooves G11 to G14 are disposed at different depths in the lower stack structure LST.

The first trench T11 has stepped symmetrical sidewalls that face each other as described with reference to FIG. 4B, and each of both the sidewalls may have a shape of the third stepped structure SW3 shown in FIG. 4B.

The second trench T12 and the third trenches T13 may have the same depth. Each of the second trench T12 and the third trenches T13 may have asymmetric sidewalls that face each other and have different gradients. One of the sidewalls of each of the second trench T12 and the third trenches T13 may have the first stepped structure SW1 shown in FIG. 4A, and the other sidewalls of each of the second trench T12 and the third trenches T13 may have the second stepped structure SW2 shown in FIG. 4A.

Each of the grooves G11 to G14 may have a sidewall with the first stepped structure SW1 shown in FIG. 4A and a sidewall with the second stepped structure SW2 shown in FIG. 4A.

For example, a first groove G11 may include first to third sidewalls S1 to S3. The first groove G11 may overlap with first patterns P1 formed with some of the lower layers constituting the lower stack structure LST. The first groove G11 may be surrounded by second patterns P2, which are formed with others of the lower layers constituting the lower stack structure LST and are disposed on the first patterns P1. The first sidewall S1 of the first groove G11 may be sidewalls of the second patterns P2. The second sidewall S2 and the third sidewall S3 of the first groove G11 may face each other and extend from the first sidewall S1. The second sidewall S2 may have the first stepped structure SW1 shown in FIG. 4A, and the third sidewall S3 may have the second stepped structure SW2 shown in FIG. 4A.

A second groove G12 may include fourth to sixth sidewalls S4 to S6. The second groove G12 may be surrounded by first patterns P1 and second patterns P2. The fourth sidewall S4 of the second groove G12 may be comprise faces of the first patterns P1. The fifth sidewall S5 and the sixth sidewall S6 of the second groove G12 may face each other and extend from the fourth sidewall S4. The fifth sidewall S5 may have the first stepped structure SW1 shown in FIG. 4A, and the sixth sidewall S6 may have the second stepped structure SW2 shown in FIG. 4A. The second groove G12 may further include seventh to ninth sidewalls S7 to S9 extending toward the upper stack structure UST respectively from the fourth to sixth sidewalls S4 to S6. The seventh to ninth sidewalls S7 to S9 comprise faces of the second patterns P2.

Each of the first sidewall S1, the fourth sidewall S4, and the seventh sidewall S7 may be formed to have a gradient greater than that of each of the first stepped structure SW1 and the second stepped structure SW2. For example, the gradient of each of the first sidewall S1, the fourth sidewall S4, and the seventh sidewall S7 may be vertical or substantially vertical. The first sidewall S1, the fourth sidewall S4, and the seventh sidewall S7 are sidewalls of the second connection part LP2 shown in FIG. 1B. Since it is unnecessary for the first sidewall S1, the fourth sidewall S4, and the seventh sidewall S7 to provide a pad region, each of the first sidewall S1, the fourth sidewall S4, and the seventh sidewall S7 may not be formed in a stepped structure. In the embodiment of the present disclosure, each of the first sidewall S1, the fourth sidewall S4, and the seventh sidewall S7, have a steep gradient, which occupies less space on a chip leading to greater integration.

Figure 6:
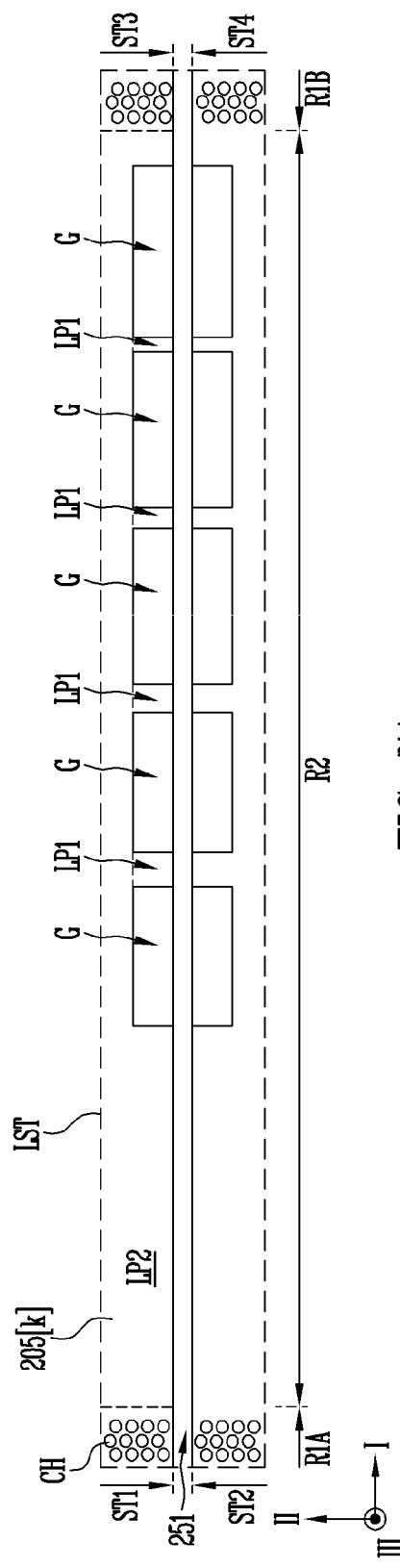
FIG. 6 is a layout of a lower stack structure in accordance with an embodiment of the present disclosure.

FIG. 6 is a layout of a lower stack structure in accordance with an embodiment of the present disclosure. FIG. 6 illustrates a layout with respect to an uppermost lower layer 205[k] of the lower stack structure LST.

The lower stack structure LST may include the structures described with reference to FIGS. 1B, 2A and 2B, 3, 4A, and 5A and 5B. Hereinafter, redundant descriptions will be omitted.

Each of the lower layers of the lower stack structure LST in accordance with an embodiment of the present disclosure includes first and second connection parts LP1 and LP2 disposed in a contact region R2. The first and second connection parts LP1 and LP2 may be disposed between a first cell region R1A and a second cell region R1B of the lower stack structure LST. A structure formed in each of the first cell region R1A and the second cell region R1B includes the structure disposed in the cell region R1, which is described with reference to FIG. 1B. For example, the first cell region R1A and the second cell region R1B may have channel structures CH.

The lower stack structure LST may be gate stack structures. For example, the lower layers of the lower stack structure LST may constitute first to fourth gate stack structures ST1 to ST4. The first gate stack structure ST1 and the third stack structure ST3 may share the same contact region R2, and the second gate stack structure ST2 and the fourth gate stack structure ST4 may share the same contact region R2.

The lower stack structure LST may be penetrated by a slit 251 extending in the first direction I. The first gate stack structure ST1 and the second stack structure ST2 may be spaced apart in the second direction II by the slit 251, and the third gate stack structure ST3 and the fourth gate stack structure ST4 may be spaced apart from each other in the second direction II by the slit 251.

Grooves G having different depths may be disposed in the contact region R2 of the lower stack structure LST. The grooves G may be formed in the same structure as G11 to G15 shown in FIGS. 1B, 2A, 3, 4A, and 5A and 5B.

FIGS. 7A and 7B, 8A to 8C, 9A and 9B, 10A and 10B, 11A to 11C, and 12A to 12C are views illustrating a manufacturing method of the semiconductor memory device in accordance with an embodiment of the present disclosure. The gate stack structures described with reference to FIGS. 1A and 1B, 2A and 2B, 3, 4A and 4B, and 5A and 5B may be formed using the embodiments described below.

Figure 7A:
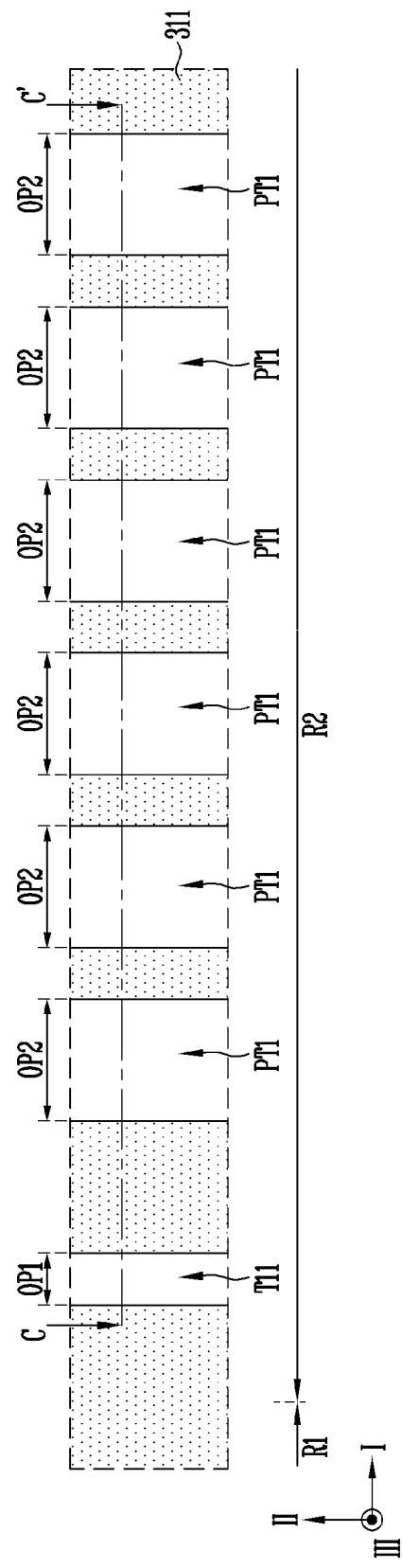
Figure 7B:
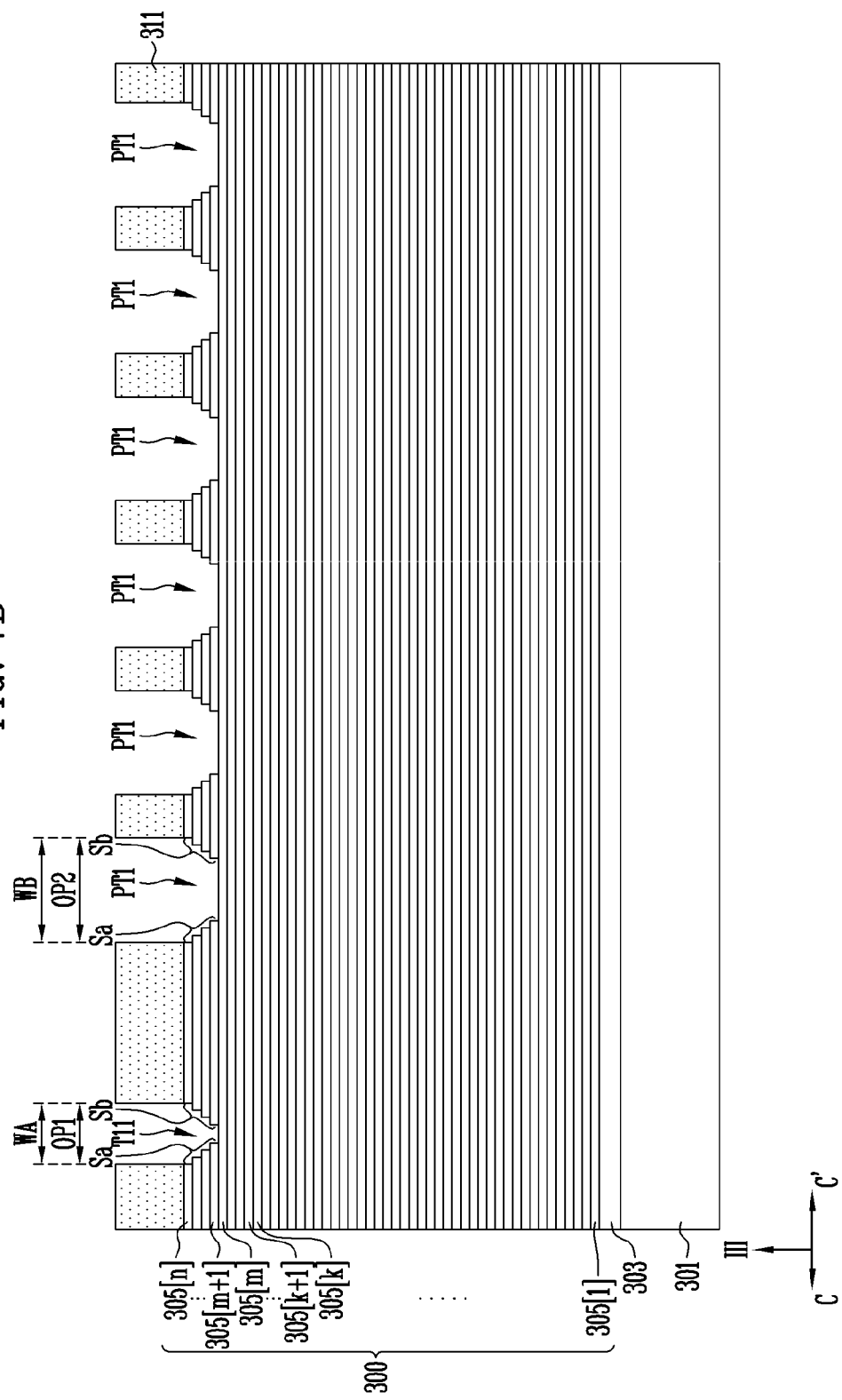

FIGS. 7A and 7B are plan and sectional views illustrating a process of a first trench T11 and first preliminary trenches PT1 in a stack structure 300. FIG. 7B illustrates a cross-section of the stack structure 300 taken along line C-C' shown in FIG. 7A.

Referring to FIGS. 7A and 7B, the stack structure 300 is formed by stacking a plurality of horizontal layers 305[1] to 305[n] on a lower structure 301, which may be the same as the lower structure 101 described with reference to FIGS. 2A and 2B. After an insulating layer 303 covering the lower structure 301 is formed, the stack structure 300 may be formed on the insulating layer 303.

Each of the horizontal layers 305[1] to 305[n] of the stack structure 300 may include a cell region R1 and a contact region R2 extending in a horizontal direction from the cell region R1. The contact region R2 may extend in a first direction I from the cell region R1. The horizontal layers 305[1] to 305[n] may include lower layers 305[1] to 305[k], first upper layers 305[k+1] to 305[m], and second upper layers 305[nn+1] to 305[n].

Each of the horizontal layers 305[1] to 305[n] extends in the first direction I and the second direction II. The horizontal layers 305[1] to 305[n] may be formed by alternately stacking first material layers and second material layers in a third direction III. Each of the horizontal layers 305[1] to 305[n] may be configured with a pair of a first material layer and a second material layer, which are sequentially stacked. In an embodiment, each of the first material layers may be formed as the conductive layer 105A described with reference to FIG. 3, and each of the second material layers may be formed as the interlayer insulating layer 105B described with reference to FIG. 3. In another embodiment, the first material layers and the second material layers may be formed of materials having different etch rates. In an example, each of the first material layers may be formed as a sacrificial layer replaced with the conductive layer 105A described with reference to FIG. 3 in a subsequent process, and each of the second material layers may be formed as the interlayer insulating layer 105B. In another example, each of the first material layers may be formed as the conductive layer 105A described with reference to FIG. 3, and each of the second material layers may be formed as a sacrificial layer replaced with the interlayer insulating layer 105B in a subsequent process. Each of the first sacrificial layers may include a nitride layer, and each of the second sacrificial layers may include a doped silicon layer.

Subsequently, a first mask pattern 311 may be formed on the stack structure 300. Before the first mask pattern 311 is formed, processes for forming the channel structures CH shown in FIGS. 1A and 1B in the cell region R1 of the stack structure 300 may be performed.

The first mask pattern 311 may include a photoresist pattern. The first mask pattern 311 may include a first opening OP1 and second openings OP2, which open the contact region R2. The first opening OP1 may be disposed between the cell region R1 and the second openings OP2. In other words, the first opening OP1 may be formed closer to the cell region R1 than the second openings OP2.

The first trench T11 and the first preliminary trenches PT1 may be formed by etching each of the second upper layers 305[m+1] to 305[n], using the first mask pattern 311 as an etch mask. The first trench T11 may be formed in a region corresponding to the first opening OP1 of the first mask pattern 311, and the first preliminary trenches PT1 may be formed in regions corresponding to the second openings OP2 of the first mask pattern 311.

Each of the first trench T1 and the first preliminary trenches PT1 may include opposing stepped sidewalls facing each other. the stepped sidewalls may have stepped structures Sa and Sb that are symmetrical to each other. Each of the stepped structures Sa and Sb may be the third stepped structure SW3 described with reference to FIGS. 4A and 4B.

The stepped structures Sa and Sb of each of the first trench T11 and the first preliminary trenches PT1 may be formed by repeating an etching process and a slimming process. The etching process is performed by removing a portion of at least one of the second upper layers 305[m+1] to 305[n], using the first mask pattern 311 as the etch mask. The etching process may be repeated until each layer of the second upper layers 305[m+1] to 305[n] is exposed through the first opening OP1 and the second openings OP2.

Here, the slimming process may include removing material from sidewalls of the first mask pattern 311 such that the width of each of the first opening OP1 and the second openings OP2 of the first mask pattern 311 expands in the horizontal direction. Thus, the process of forming the preliminary trenches may comprise performing a vertical etch using an isotropic etch process to remove a layer of material 305, performing a slimming process, e.g. an isotropic etching process, to expand the width of the trenches, and repeating the vertical etch and slimming processes until stepped preliminary trenches T11 and PT1 are formed. An uppermost first upper layer 305[m] may be exposed by the first trench T11 and the first preliminary trenches PT1. In order to save space, a width WA of the first trench T11 may be formed narrower than that WB of each of the first preliminary trenches PT1.

Figure 8C:
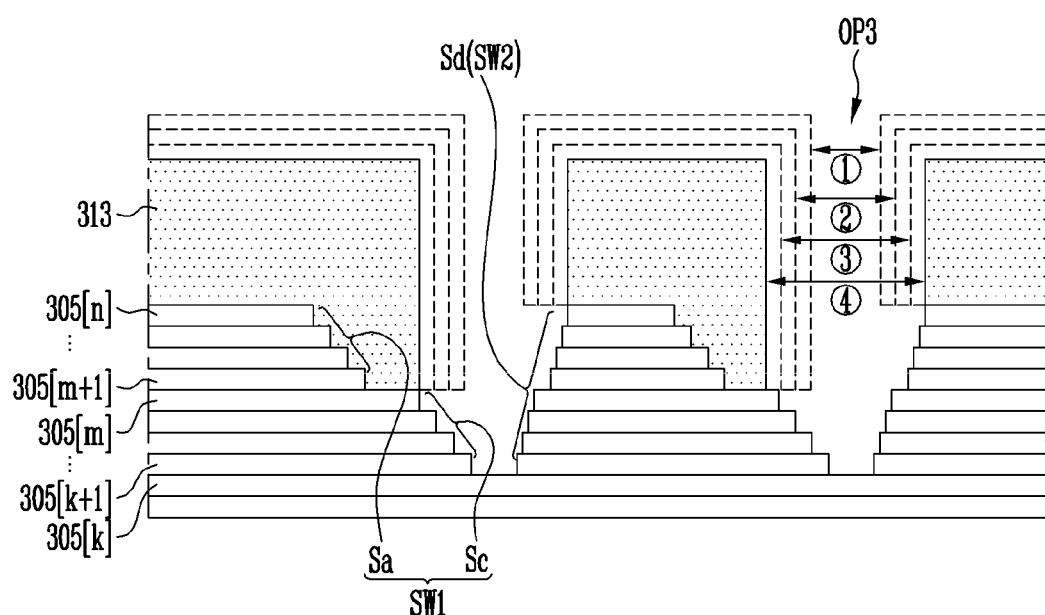

FIGS. 8A to 8C are views illustrating a process of forming a second trench T12 and second preliminary trenches PT2 in the stacked structure 300. FIG. 8A is a plan view illustrating a second mask pattern 313. FIG. 8B illustrates a cross-section of the stack structure 300 taken along line C-C' shown in FIG. 8A. FIG. 8C is an enlarged sectional view of stepped structures Sa, Sc, and Sd included in each of the second trench T12 and the second preliminary trenches PT2.

Referring to FIGS. 8A and 8B, the second mask pattern 313 may be formed on the stack structure 300. Before the second mask pattern 313 is formed, the first mask pattern 311 shown in FIGS. 7A and 7B may be removed. The second mask pattern 313 may include a photoresist pattern.

The second mask pattern 313 may be formed to cover the first trench T11 shown in FIG. 8B and to cover one (e.g., Sa) of the stepped structures Sa and Sb of each of the first preliminary trenches PT1 shown in FIGS. 7A and 7B. The second mask pattern 313 may include third openings OP3. The third openings OP3 may be formed to have a width narrower than that of the second openings OP2 shown in FIGS. 7A and 7B. The third openings OP3 may be biased toward one side of the first preliminary trenches PT1 shown in FIGS. 7A and 7B.

The second trench T12 and the second preliminary trenches PT2 may be formed by etching each of the first upper layers 305[k+1] to 305[m], using the second mask pattern 313 as an etch mask. The second upper layers 305[m+1] to 305[n] defining a stepped structure (e.g., Sb) formed at one sidewall of each of the first preliminary trenches PT1 shown in FIGS. 7A and 7B may be etched through the third openings OP3.

Referring to FIG. 8C, each of the second trench T12 and the second preliminary trenches PT2 may include the stepped structure Sa formed through the processes described with reference to FIGS. 7A and 7B. Also, each of the second trench T12 and the second preliminary trenches PT2 may include the stepped structures Sc and Sd formed through an etching process using the second mask pattern 313 as an etch mask. The stepped structures Sc and Sd formed through the etching process using the second mask pattern 313 as an etch mask may be respectively the third stepped structures SW3 and the fourth stepped structures SW4, which are described with reference to FIG. 4A.

The stepped structures Sc and Sd of each of the second trench T12 and the second preliminary trenches PT2 may be formed by repeating an etching process and a slimming process.

The etching process is performed to remove a portion of at least one of the first upper layers 305[k+1] to 305[m] by using the second mask pattern 313 as an etch mask. The etching process may be repeated whenever each of the first upper layers 305[k+1] to 305[m] are exposed through the third openings OP3.

The slimming process is a process of removing a portion of the second mask pattern 313 such that the width of each of the third openings OP3 of the second mask pattern 313 expands in the horizontal direction. The slimming process may be performed before performing a vertical etching process. When the slimming process is repeated, the width of each of the third openings OP3 may be increased. For example, as shown in FIG. 8C, the width of each of the third openings OP3 may expand in an order of ①, ②, ③, and ④. Whenever the width of each of the third openings OP3 is increased, the second upper layers 305[m+1] to 305[n] defining the stepped structure (e.g., Sb) formed at the one sidewall of each of the first preliminary trenches PT1 shown in FIGS. 7A and 7B may be exposed and etched.

Each of the second trench T12 and the second preliminary trenches PT2 may have the first stepped structure SW1 and the second stepped structure SW2, which are described with reference to FIG. 4A. An uppermost lower layer 305[k] may be a bottom surface of the second trench T12 and the second preliminary trenches PT2.

Figure 9B:
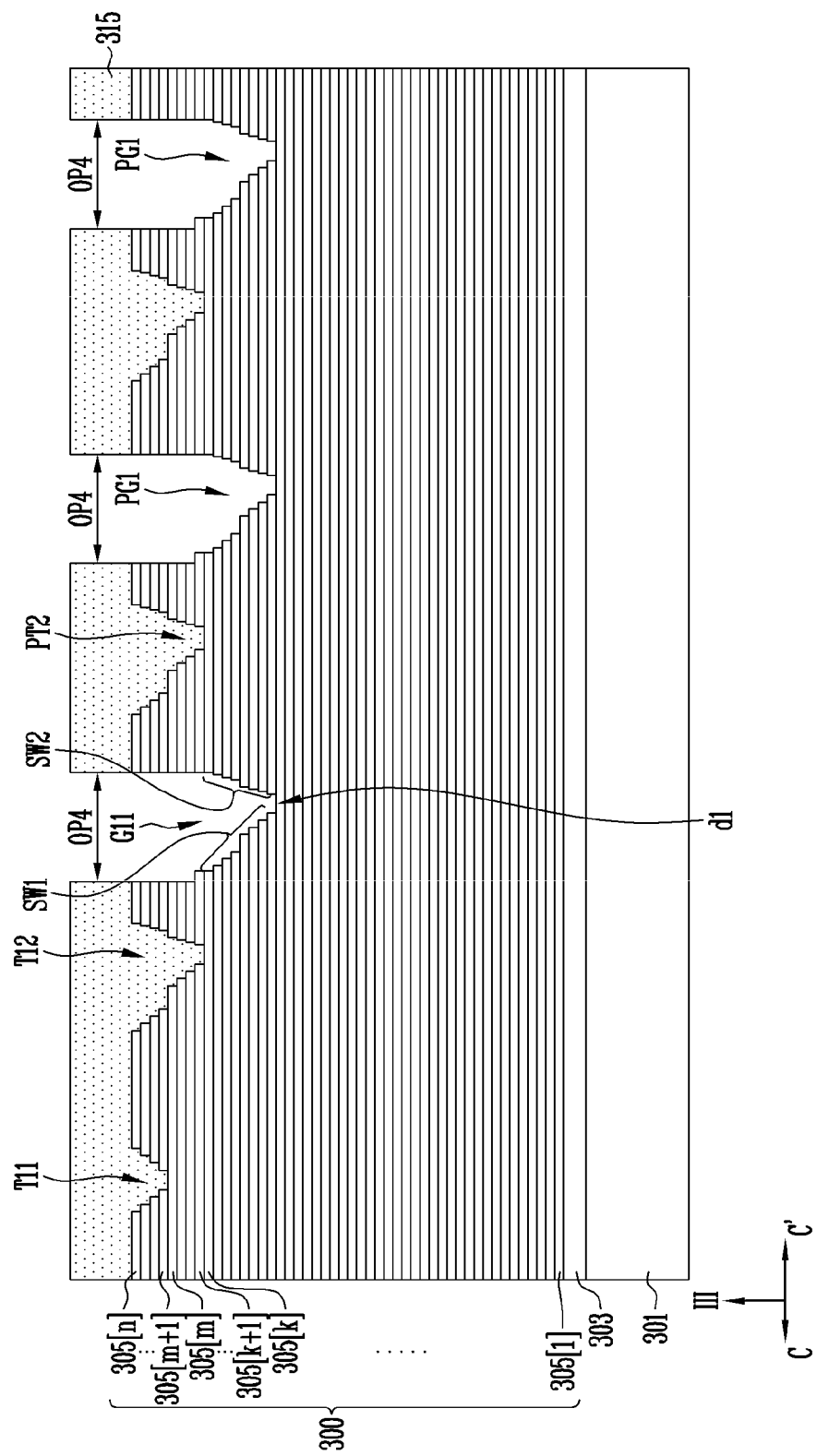

FIGS. 9A and 9B are plan and sectional views illustrating a process of forming a first groove G11 and first preliminary grooves PG1. FIG. 9B illustrates a cross-section of the stack structure 300 taken along line C-C' shown in FIG. 9A.

Referring to FIGS. 9A and 9B, a third mask pattern 315 may be formed on the stack structure 300. Before the third mask pattern 315 is formed, the second mask pattern 313 shown in FIGS. 8A and 8B may be removed. The third mask pattern 315 may include a photoresist pattern.

The third mask pattern 315 may be formed to cover the first trench T11 and the second trench T12. The third mask pattern 315 may be formed to cover some of the second preliminary trenches PT2 shown in FIGS. 8A and 8B, and include openings OP4 exposing remaining second preliminary trenches PT2 shown in FIGS. 8A and 8B. The fourth openings OP4 may be formed to be spaced apart from each other.

Some layers disposed under the uppermost lower layer 305[k] are etched using the third mask pattern 315 as an etch mask. The first and second upper layers 305[k+1] to 305[n] exposed by the fourth openings OP4 may be etched.

The first stepped structure SW1 and the second stepped structure SW2, which are exposed through each of the fourth openings OP4 by the above-described etching process, are moved to a first depth d1, which is deeper than the depth of each of the first trench T11 and the second trench T12 in the stack structure 300. In other words, a vertical etch is performed on openings OP4 that increases a depth of alternating trenches.

The first groove G11 and the first preliminary grooves PG1 are extended to the first depth d1 in the stack structure 300 by the above-described etching process. The first groove G11 is disposed in a region corresponding to one of the fourth openings OP4, and the first preliminary grooves PG1 are disposed in regions corresponding to remaining fourth openings OP4.

Figure 10A:
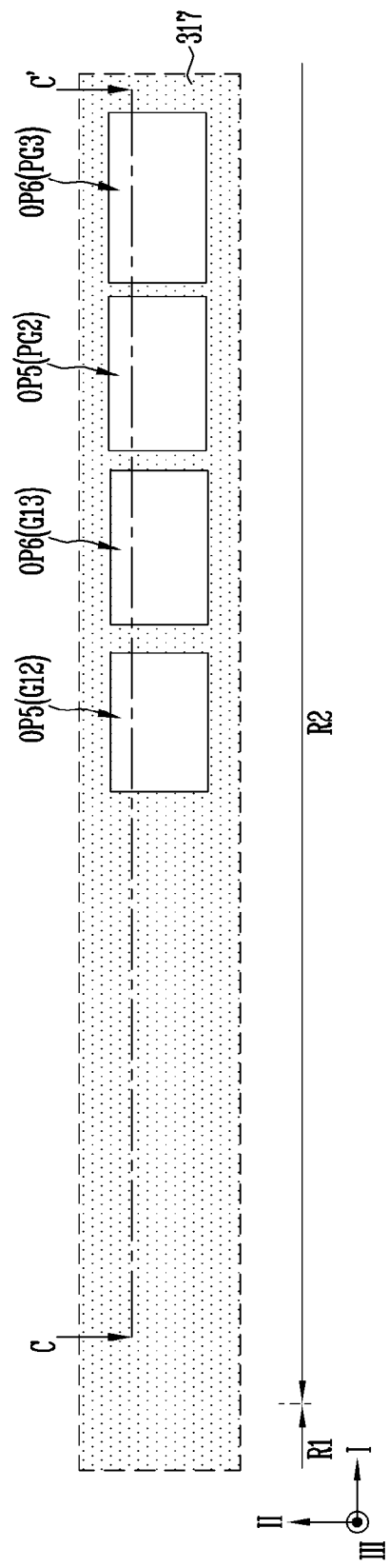
Figure 10B:
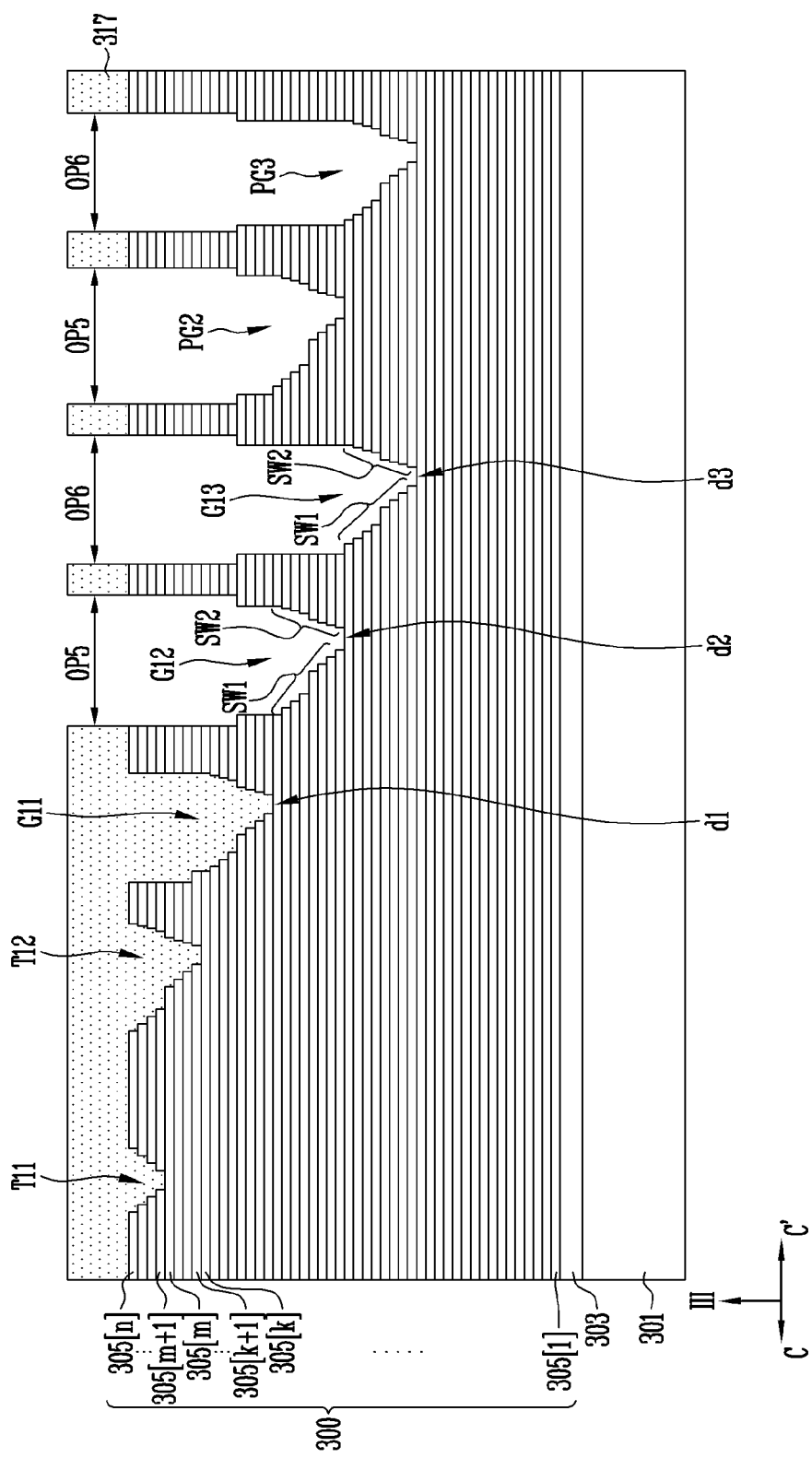

FIGS. 10A and 10B are plan and sectional views illustrating a process of forming a second groove G12, a third groove G13, a second preliminary groove PG2, and a third preliminary groove PG3. FIG. 10B illustrates a cross-section of the stack structure 300 taken along line C-C' shown in FIG. 10A.

Referring to FIGS. 10A and 10B, a fourth mask pattern 317 may be formed on the stack structure 300. Before the fourth mask pattern 317 is formed, the third mask pattern 315 shown in FIGS. 9A and 9B may be removed. The fourth mask pattern 317 may include a photoresist pattern.

The fourth mask pattern 317 may be formed to cover the first trench T11, the second trench T12, and the first groove G11. The fourth mask pattern 317 may include fifth openings OP5 and sixth openings OP6. The fifth openings OP5 respectively expose the second preliminary trenches PT2 shown in FIGS. 9A and 9B. The sixth openings OP6 respectively expose the first preliminary grooves PG1 shown in FIGS. 9A and 9B. The fifth openings OP5 are formed in an alternating arrangement with the sixth openings OP6.

At least some of the lower layers 305[1] to 305[k] are etched using the fourth mask pattern 317 as an etch mask. The first and second upper layers 305[k+1] to 305[n] exposed by the fifth and sixth openings OP5 and OP6 may be etched as well. In particular, a vertical etch process, e.g. an isotropic etching, may be performed to extend the depth of the trenches downwards by several layers while preserving the stepped shape of the trenches.

The first stepped structure SW1 and the second stepped structure SW2, which are exposed through each of the fifth openings OP5 by the above-described etching process, are moved to a second depth d2 deeper than the first depth d1 in the stack structure 300. In addition, the first stepped structure SW1 and the second stepped structure SW2, which are exposed through the sixth openings OP6 by the above-described etching process, are moved to a third depth d3 deeper than the second depth d2 in the stack structure 300.

The second groove G12 and the second preliminary groove PG2 are disposed at the second depth d2 in the stack structure 300 by the above-described etching process, and the third groove G13 and the third preliminary groove PG3 are disposed at the third depth d3 in the stack structure 300 by the above-described etching process.

Figure 11A:
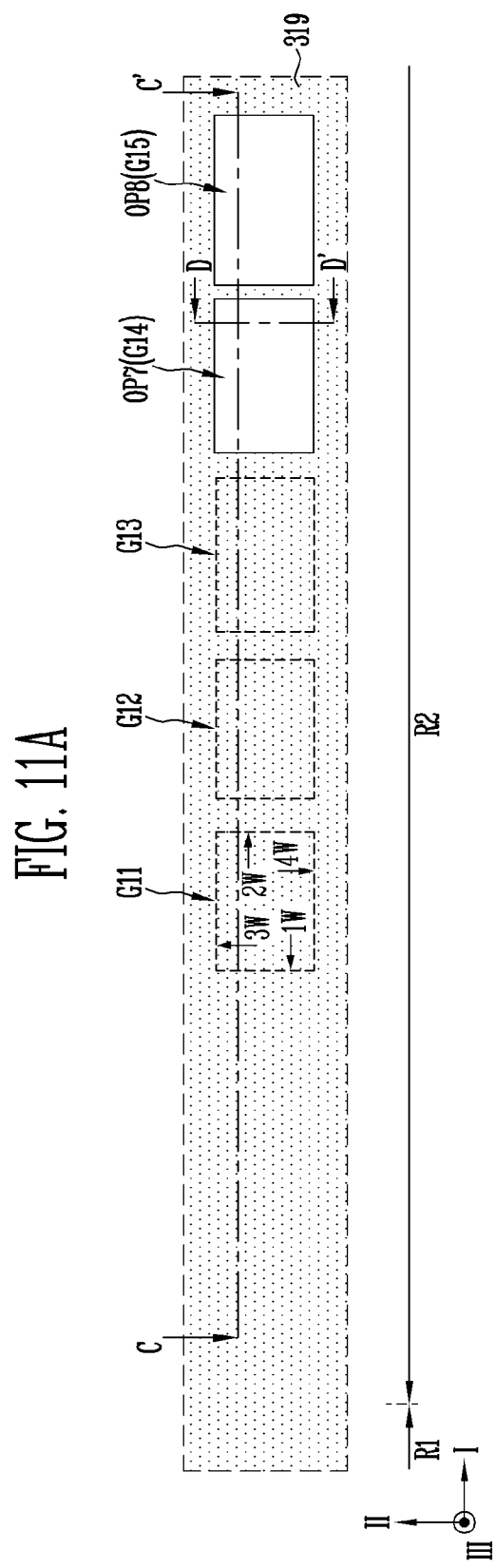
Figure 11B:
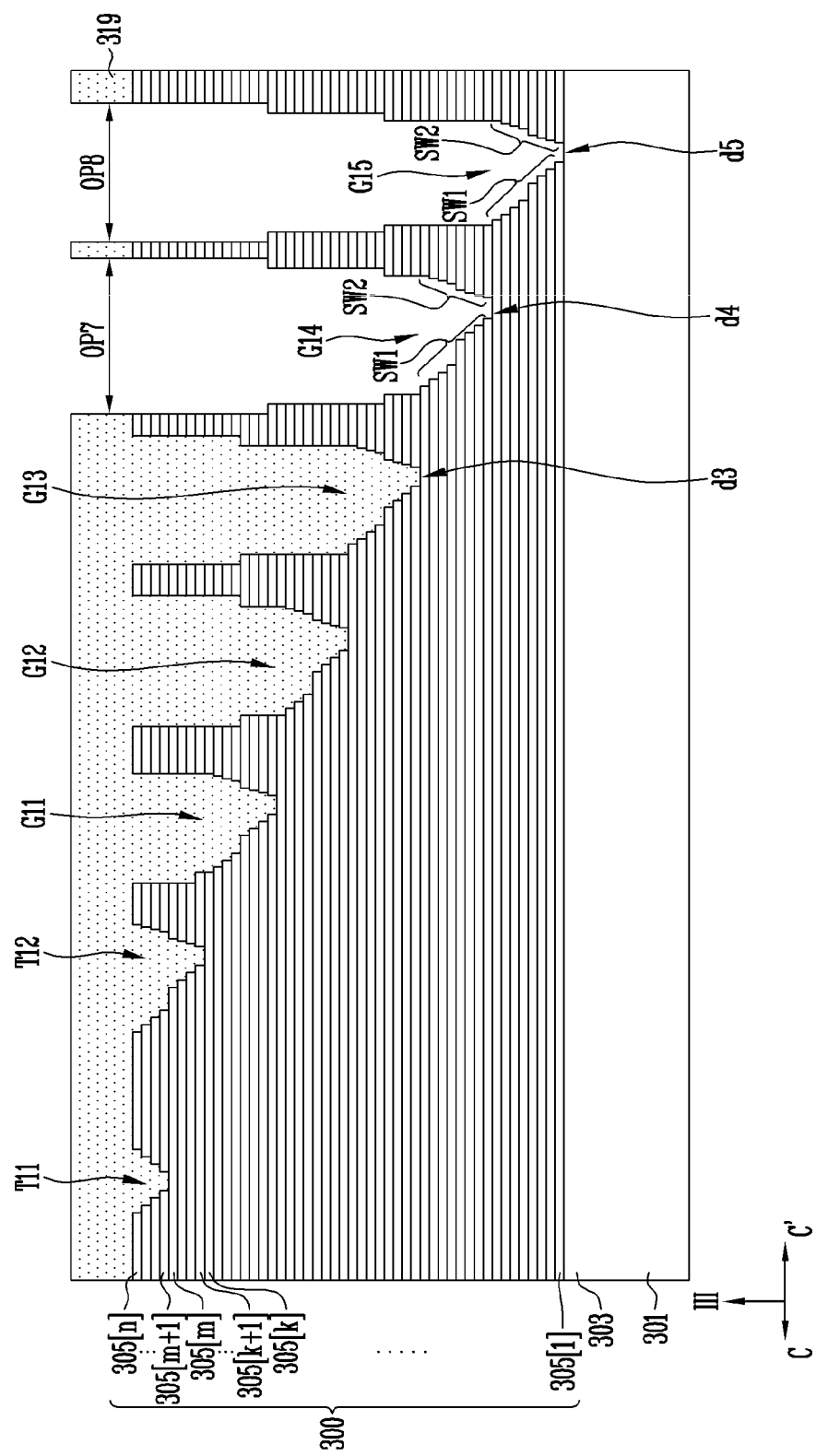
Figure 11C:
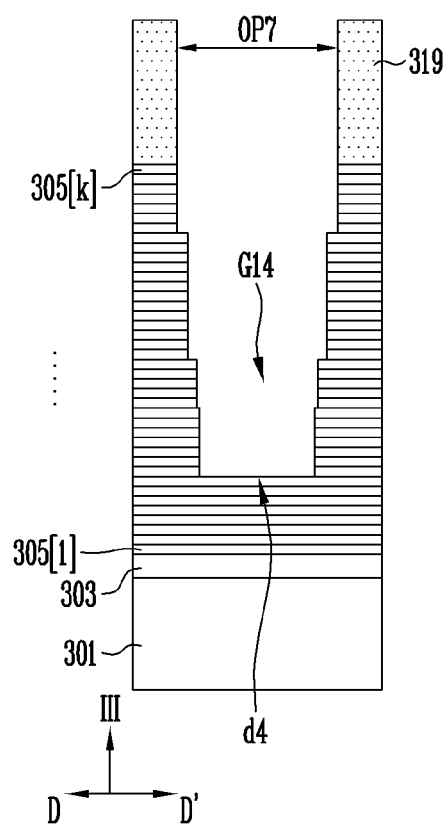

FIGS. 11A to 11C are views illustrating a process of forming a fourth groove G14 and a fifth groove G15. FIG. 11A is a plan view illustrating a fifth mask pattern 319. FIG. 11B illustrates a cross-section of the stack structure 300 taken along line C-C' shown in FIG. 11A. FIG. 11C illustrates a cross-section of the stack structure 300 taken along line D-D' shown in FIG. 11A.

Referring to FIGS. 11A to 11C, the fifth mask pattern 319 may be formed on the stack structure 300. Before the fifth mask pattern 319 is formed, the fourth mask pattern 317 shown in FIGS. 10A and 10B may be removed. The fifth mask pattern 319 may include a photoresist pattern.

The fifth mask pattern 319 may be formed to cover the first trench T11, the second trench T12, and the first to third grooves G11 to G13. The fifth mask pattern 319 may include a seventh opening OP7 and an eighth opening OP8. The seventh opening OP7 exposes the second preliminary groove PG2 shown in FIGS. 10A and 10B, and the eighth opening OP8 exposes the third preliminary groove PG3 shown in FIGS. 10A and 10B. The seventh opening OP7 and the eighth opening OP8 are spaced apart from each other.

At least some of the lower layers 305[1] to 305[k] are etched using the fifth mask pattern 319 as an etch mask. The first and second upper layers 305[k+1] to 305[n] exposed by the seventh and eighth openings OP7 and OP8 may be etched as well. In particular, a vertical etch process, e.g. an isotropic etching, may be performed to extend the depth of the trenches downwards by several layers while preserving the stepped shape of the trenches.

The first stepped structure SW1 and the second stepped structure SW2, which are exposed through the seventh opening OP7 by the described-above etching process, are moved to a fourth depth d4 deeper than the third depth d3 in the stack structure 300. In addition, the first stepped structure SW1 and the second stepped structure, which are exposed through the eighth opening OP8 by the above-described etching process, are moved to a fifth depth d5 deeper than the fourth depth d4 in the stack structure 300.

The fourth groove G14 is disposed at the fourth depth d4 in the stack structure 300 by the above-described etching process, and the fifth groove G15 is disposed at the fifth depth d5 in the stack structure 300 by the above-described etching process.

Dotted lines shown in FIG. 11A represent a layout of the first to third grooves G11 to G13.

Referring to FIG. 11A, each of the first to fifth grooves G11 to G15 are surrounded by the lower layers 305[1] to 305[k] shown in FIG. 11B. The lower layers 305[1] to 305[k] shown in FIG. 11B may surround each of the first to fifth grooves G11 to G15, to define first to fourth sidewalls 1W to 4W of each of the first to fifth grooves G11 to G15. The first sidewall 1W and the second sidewall 2W may face each other in the first direction I, and the third sidewall 3W and the fourth sidewall 4W may face each other in the second direction II.

The first stepped structure SW1 and the second stepped structure SW2, which are described with reference to FIG. 4A, may be formed adjacent to a bottom surface of each of the first to fifth grooves G11 to G15 disposed at different depths. For example, a lower portion of the first sidewall 1W of each of the first to fifth grooves G11 to G15 may have a first stepped structure SW1 corresponding thereto, and a lower portion of the second sidewall 2W of each of the first to fifth grooves G11 to G15 may have a second stepped structure SW2 corresponding thereto.

Figure 12A:
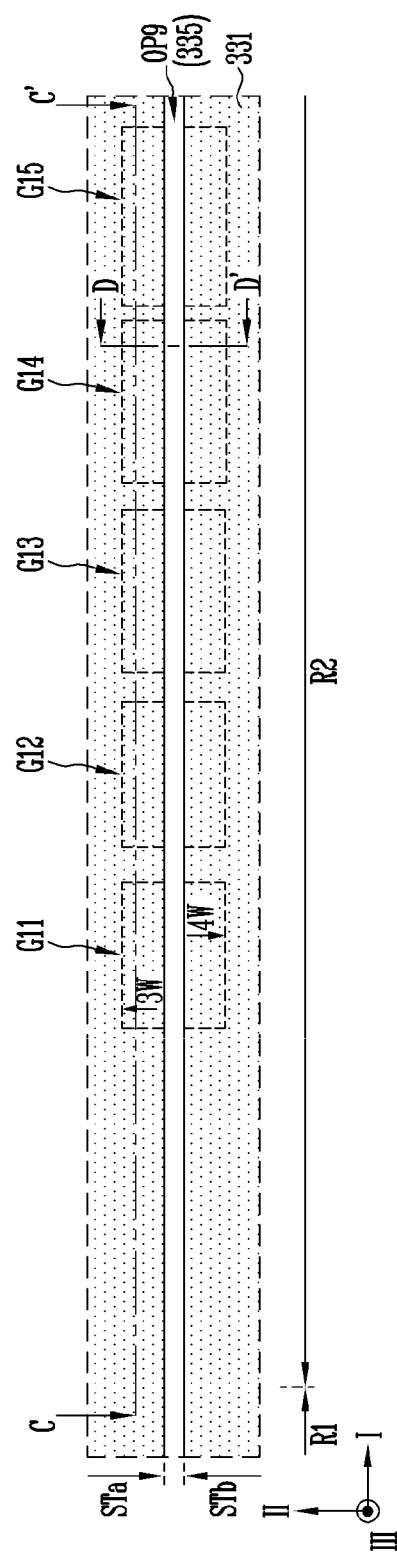
Figure 12B:
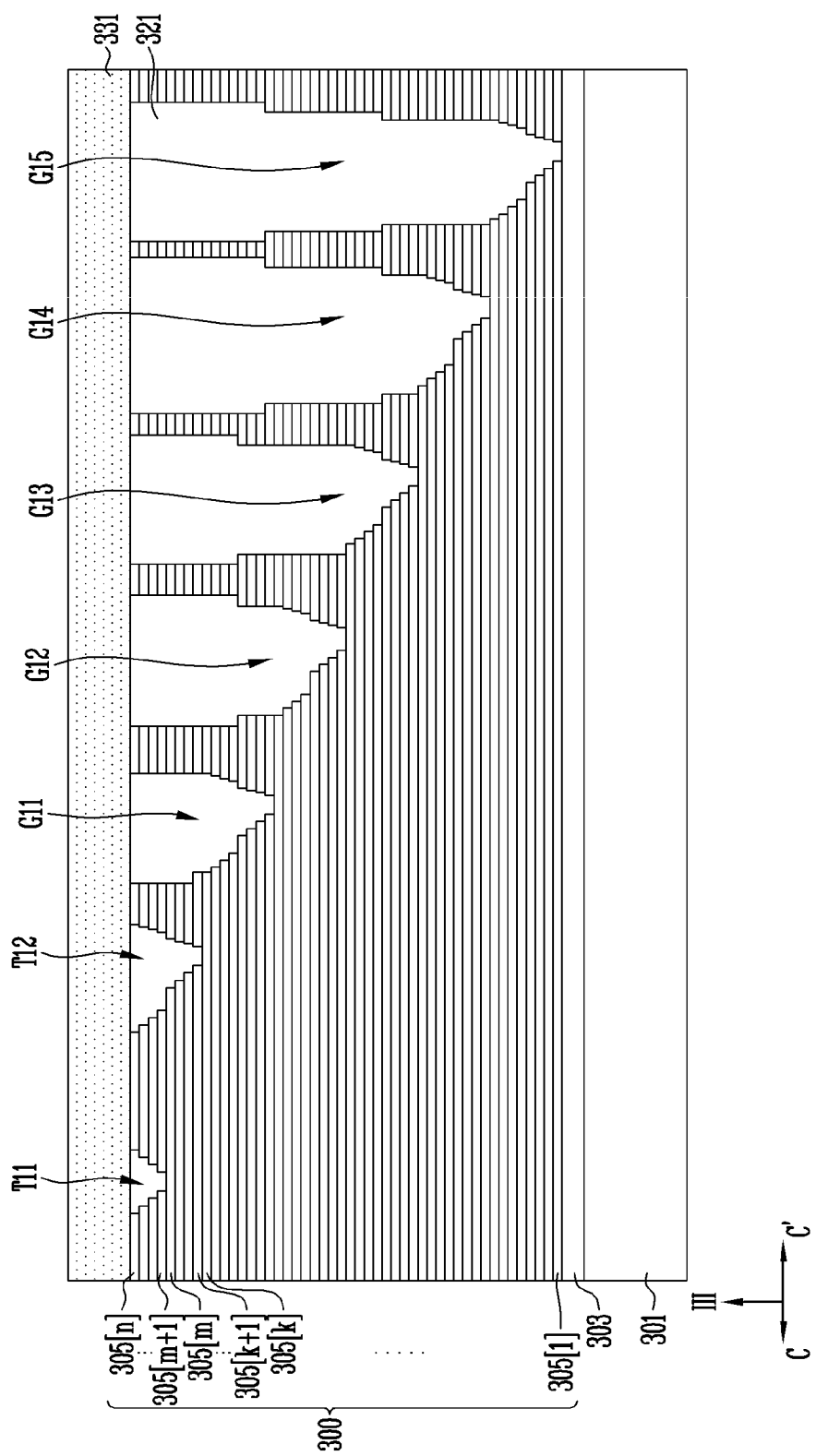
Figure 12C:
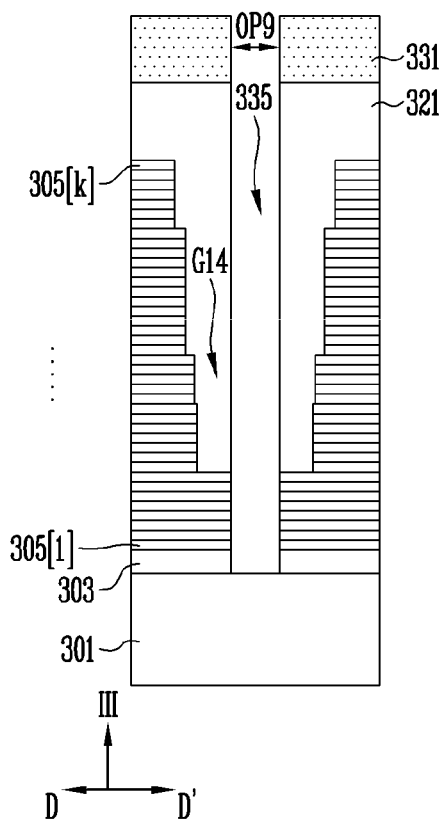

FIGS. 12A to 12C are views illustrating a process of forming a slit 335. FIG. 12A is a plan view illustrating a sixth mask pattern 331. A dotted line shown in FIG. 12A represents a layout of the first to fifth grooves G11 to G15. FIG. 12B illustrates a cross-section of the stack structure 300 taken along line C-C' shown in FIG. 12A. FIG. 12C illustrates a cross-section of the stack structure 300 taken along line D-D' shown in FIG. 12A.

Referring to FIGS. 12A to 12C, the sixth mask pattern 331 may be formed on the stack structure 300. Before the sixth mask pattern 331 is formed, the first trench T11, the second trench T12, and the first to fifth grooves G11 to G15 may be filled with a gap fill insulating layer 321. In accordance with an embodiment of the present disclosure, the first to fifth grooves G11 to G15 are locally formed in the contact region R2 of the stack structure 300. The flatness of a surface of the stack structure 300 can be improved by portions of the stack structure 300, which remain around the first to fifth grooves G11 to G15. The portions of the stack structure 300 which remain around the first to fifth grooves G11 to G15 may be the first and second dummy structures DS1 and DS2 described with reference to FIGS. 2A and 2B. When the flatness of the stack structure 300 is improved, a step difference in the gap fill insulating layer 321 is minimized, and thus the flatness of a surface of the gap fill insulating layer 321 can be improved.

Before the sixth mask pattern 331 is formed, a planarization process for planarizing the surface of the gap fill insulating layer 321, such as Chemical Mechanical Polishing (CMP), may be further performed. Also, before the sixth mask pattern 331 is formed, the fifth mask pattern 319 shown in FIGS. 11A to 11C may be removed.

The sixth mask pattern 331 may extend to the contact region R2 from the cell region R1. The sixth mask pattern 331 may include a ninth opening OP9 exposing the stack structure 300. The ninth opening OP9 may extend to the contact region R2 from the cell region R1. The ninth opening OP9 may be disposed between the third sidewall 3W and the fourth sidewall 4W.

A portion of each of the horizontal layers 305[1] to 305[n] of the stack structure 300 are etched using the sixth mask pattern 331 as an etch mask. Accordingly, the slit 335 penetrating the stack structure 300 is formed. The stack structure 300 may be separated into a plurality of stack patterns by the slit 335. For example, the stack patterns may include a first stack pattern STa and a second stack pattern STb, which are separated by the slit 335.

In an embodiment, the first and second stack patterns STa and STb may be respectively used as the first and second gate stack structures ST1 and ST2 described with reference to FIGS. 1A and 1B. In another embodiment, in order to form the first and second gate stack structures ST1 and ST2 described with reference to FIGS. 1A and 1B, sacrificial layers of each of the horizontal layers 305[1] to 305[n] constituting the second and second stack patterns STa and STb may be replaced with a conductive layer or an interlayer insulating layer.

Subsequently, a process of filling the slit 335 with a vertical structure and a process of forming the contact plugs 171 shown in FIG. 2A may be performed.

Figure 13A:
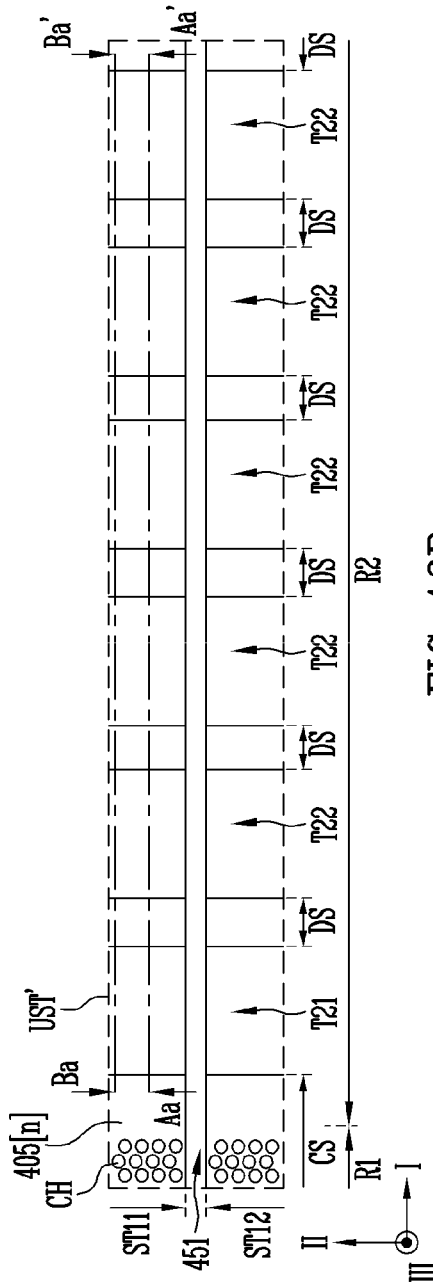
FIGS. 13A and 13B illustrate layouts of a semiconductor memory device in accordance with an embodiment of the present disclosure.
Figure 13B:
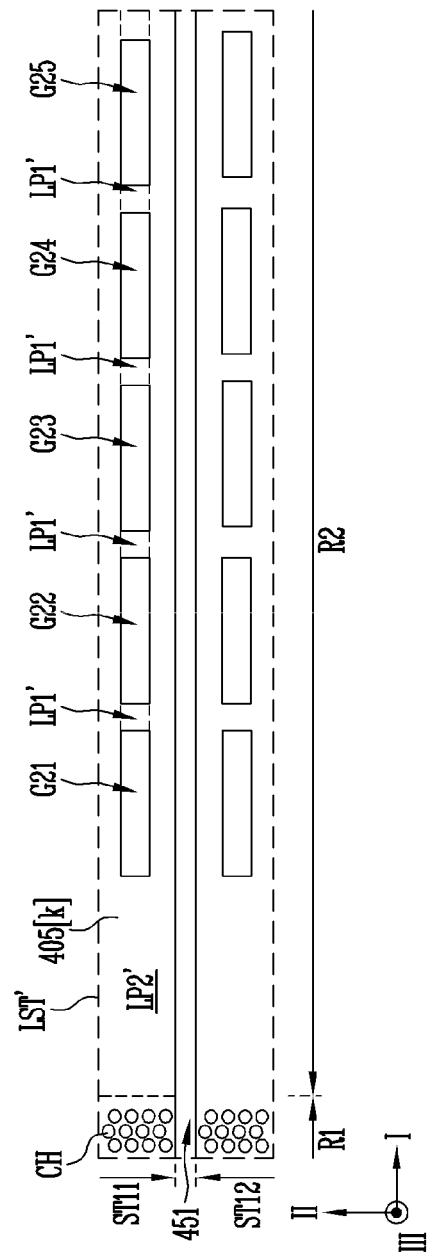

FIGS. 13A and 13B illustrate layouts of a semiconductor memory device in accordance with an embodiment of the present disclosure. FIG. 13A illustrates a layout of an upper stack structure UST', and FIG. 13B illustrates a layout of a lower stack structure LST' disposed under the upper stack structure UST'. FIG. 13A illustrates a layout of an uppermost upper layer 405[n] of the upper stack structure UST', and FIG. 13B illustrates an uppermost lower layer 405[k] of the lower stack structure LST'. The embodiment of FIGS. 13A and 13B is similar to the embodiment of FIGS. 1A and 1B, so descriptions of some elements that are redundant to the descriptions for FIGS. 1A and 1B are omitted.

Referring to FIGS. 13A and 13B, the semiconductor memory device may include gate stack structures ST11 and ST12. Each of the gate stack structures ST11 and ST12 may have a cell region R1 and a contact region R2 extending in a horizontal direction from the cell region R1.

Each of the gate stack structures ST11 and ST12 may be penetrated by channel structures CH disposed in the cell region R1. Although not shown in FIGS. 13A and 13B, a sidewall of each of the channel structures CH may be surrounded by a memory layer. The channel structures CH and the memory layer may be formed with the same material layers as described with reference to FIGS. 1A and 1B.

Each of the gate stack structures ST11 and ST12 may have an upper stack structure UST' that overlaps with a lower stack structure LST'. The upper stack structure UST' and the lower stack structure LST' are penetrated by a slit 451.

Referring to FIG. 13A, the upper stack structure UST' may be divided into a cell structure CS and dummy structures DS, which are separated from each other by a first trench T21 and second trenches T22, which are disposed in the contact region R2.

The first trench T21 may be disposed between the cell region R1 and the second trenches T22. The second trenches T22 may respectively open the grooves G21 to G25 shown in FIG. 13B. The first trench T21 and the second trenches T22 may penetrate the upper stack structure UST'.

Each of the gate stack structures ST11 and ST12 may include the upper stack structure UST' forming the cell structure CS. The cell structure CS may be disposed in the cell region R1. An end portion of the cell structure CS may extend toward the contact region R2 to provide a pad region connected to contact plugs 471 shown in FIG. 14A. The cell structure CS is penetrated by the channel structure CH in the cell region R1.

The dummy structures DS may be spaced apart from each other in the horizontal direction by the second trenches T22.

The cell structure CS may be spaced apart from the dummy structures DS in the horizontal direction by the first trench T21.

Referring to FIG. 13B, the lower stack structure LST' extends to the contact region R2 from the cell region R1, surrounds each of the grooves G21 to G25, and constitute each of the gate stack structures ST11 and ST12. The lower stack structure LST' is penetrated by the channel structures CH in the cell region R1.

The grooves G21 to G25 are disposed in the contact region R2 to be spaced apart from each other. The grooves G21 to G25 may extend to different depths in the lower stack structure LST'. The grooves G21 to G25 may be arranged in a line in first direction I. However, embodiments of the present disclosure are not limited thereto. For example, the grooves G21 to G25 may be arranged in various structures in the horizontal direction. The slit 451 may extend through each of the groves G21 to G25. Each of the grooves G21 to G25 may include a part surrounded by the first gate stack structure ST11 and a part surrounded by the second gate stack structure ST12.

The lower stack structure LST' may include a connection parts disposed in the contact region R2. For example, the lower stack structure LST' may include first connection parts LP1' and a second connection part LP2'. The first connection parts LP1' may be disposed between adjacent grooves G21 to G25. The second connection part LP2' may extend to be connected to the first connection parts LP1' from the cell region R1.

Figure 14A:
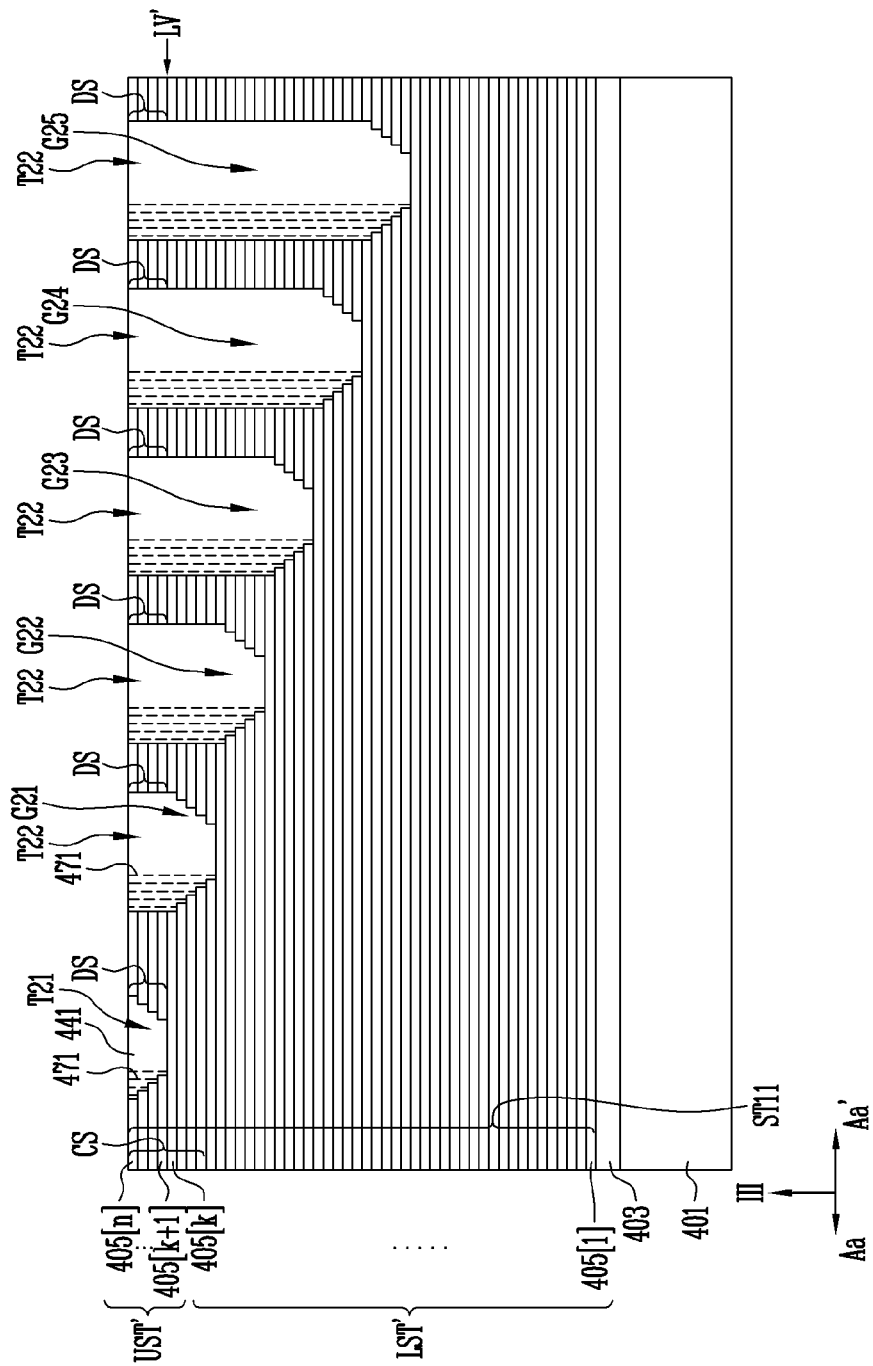
FIGS. 14A and 14B illustrate cross-sections of the semiconductor memory device in accordance with an embodiment of the present disclosure.
Figure 14B:
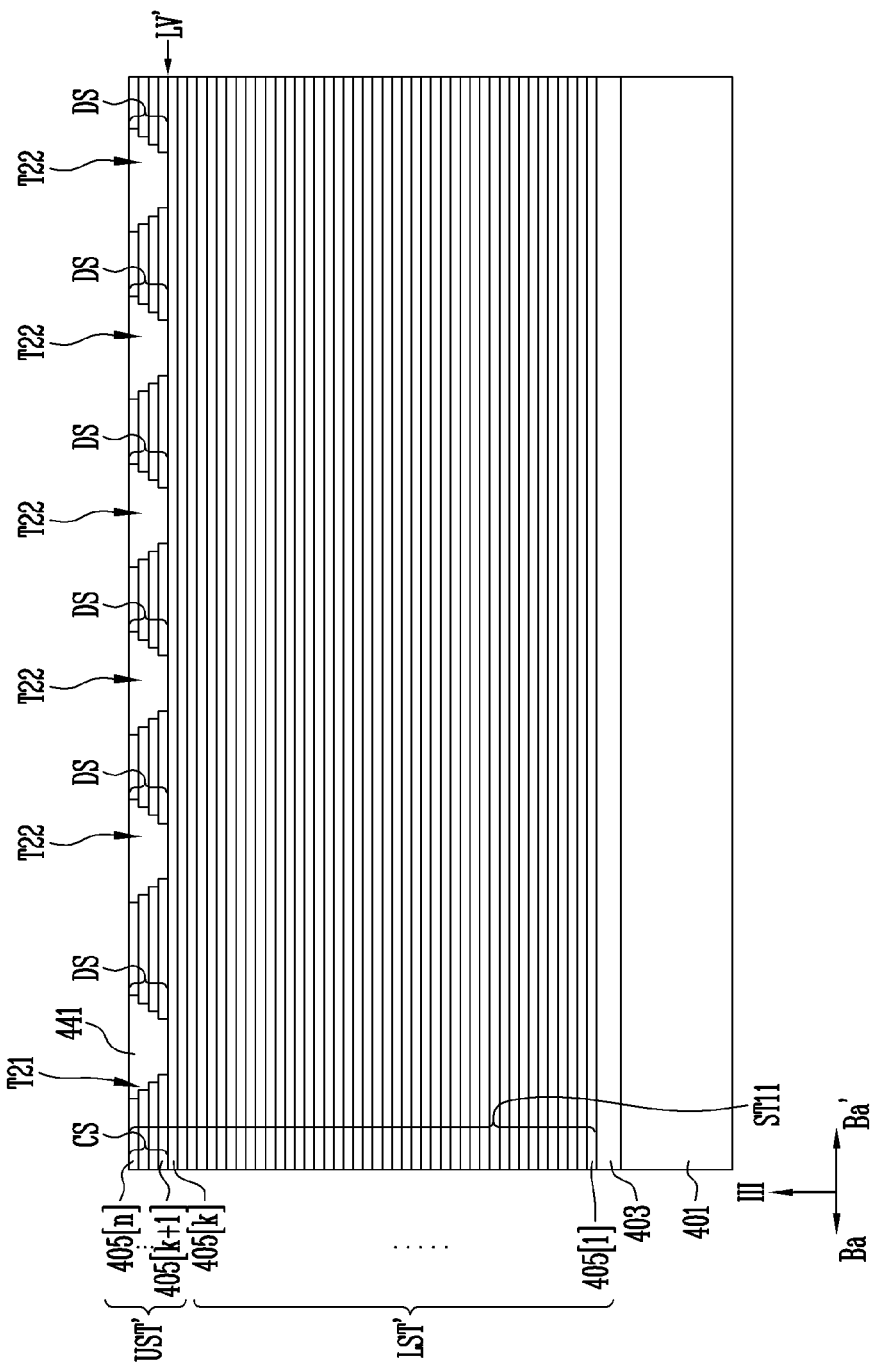

FIGS. 14A and 14B illustrate cross-sections of the semiconductor memory device in accordance with an embodiment of the present disclosure. FIG. 14A illustrates a cross-section of the semiconductor memory device taken along line Aa-Aa' shown in FIG. 13A, and FIG. 14B illustrates a cross-section of the semiconductor memory device taken along line Ba-Ba' shown in FIG. 13A.

Referring to FIGS. 14A and 14B, the lower stack structure LST' and the upper stack structure UST' may be disposed on a lower structure 401.

The lower structure 401 may be the same as the lower structure 101 described with reference to FIG. 2A. The lower structure 401 may be covered with an insulating layer 403. The insulating layer 403 may include insulating material having a multi-layer.

The lower stack structure LST' may include lower layers 405[1] to 405[$k$] stacked on each other. The upper stack structure UST' may include upper layers 405[$k$+1] to 405[$n$] stacked on the lower stack structure LST'.

The grooves G21 to G21 may extend to different depths toward the inside of the lower stack structure LST' from a height LV' at which an interface between the lower stack structure LST' and the upper stack structure UST' is disposed. The grooves G21 to G25 may be opened by the second trenches T22.

The first trench T21 and the second trenches T22 extend in a third direction III and penetrate the upper layers 405[$k$+1] to 405[$n$].

The first trench T21 is disposed between the cell region R1 and the grooves G21 to G25, which are shown in FIG. 13A. The first trench T21 overlaps with the lower layers 405[1] to 405[$k$]. The uppermost lower layer 405[$k$] may be a bottom surface of the first trench T21.

The second trenches T22 may overlap with the grooves GS21 to G25. The second trenches T22 may extend in the horizontal direction as shown in FIG. 13A, and penetrate the uppermost lower layer 405[$k$] of the lower stack structure LST'. The second trenches T22 may have sidewalls overlapping with the first connection parts LP1' shown in FIG. 13B and sidewalls overlapping with the second connection part LP2' shown in FIG. 13B. The sidewalls of the second trenches T22, which overlap with the first connection parts LP1', are shown in FIG. 14A, and the sidewalls of the second trenches T22, which overlap with the second connection part LP2, are shown in FIG. 14B. The sidewall of each of the second trenches T22 may have a first portion, which is shown in FIG. 14A, and a second portion, which is shown in FIG. 14B. A gradient of the first portion may be greater than that of the second portion. Portions of sidewalls of each of the second trenches T22, which are shown in FIG. 14A, may be vertical or substantially vertical.

Each of the cell structure CS and the dummy structures DS may overlap with the lower stack structure LST, and be configured with some of the upper layers 405[$k$+1] to 405[$n$]. The cell structure CS and the lower layers 405[1] to 405[$k$] may constitute the gate stack structure ST11. The flatness in the contact region R2 can be improved by the dummy structures DS.

Each of the grooves G21 to G25 and the first and second trenches T21 and T22 may be filled with a gap fill insulating layer 441. Each of the grooves G21 to G25 and the first and second trenches T21 and T22 may include stepped sidewalls facing each other. The stepped structures formed in the first trench T21 and the grooves G21 to G25 may provide pad regions connected to contact plugs 471.

Each of the upper layers 405[$k$+1] to 405[$n$] and the lower layers 405[1] to 405[$k$] may be comprise a conductive layer 105A and an interlayer insulating layer 105B as described with reference to FIG. 3.

The conductive layers included in the upper layers 405[$k$+1] to 405[$n$] may be first select lines connected to first select transistors, and the conductive layers included in the lower layers 405[1] to 405[$k$] may be word lines connected to memory cells or second select lines connected to second select transistors.

Figure 15:
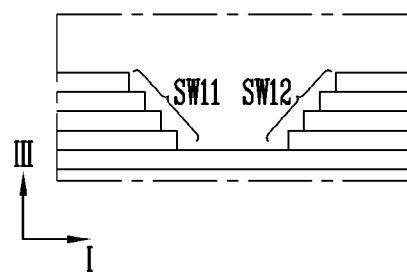
FIG. 15 is a sectional view illustrating stepped structures shown in FIGS. 14A and 14B.

FIG. 15 is a sectional view illustrating stepped structures shown in FIGS. 14A and 14B. A first stepped structure SW11 and a second stepped structure SW12, which are shown in FIG. 15, may be formed in each of the grooves G21 to G25 and the first and second trenches T21 and T22, which are shown in FIGS. 14A and 14B.

Referring to FIG. 15, the first stepped structure SW11 and the second stepped structure SW12 may face each other and be symmetrical to each other.

Figure 16:
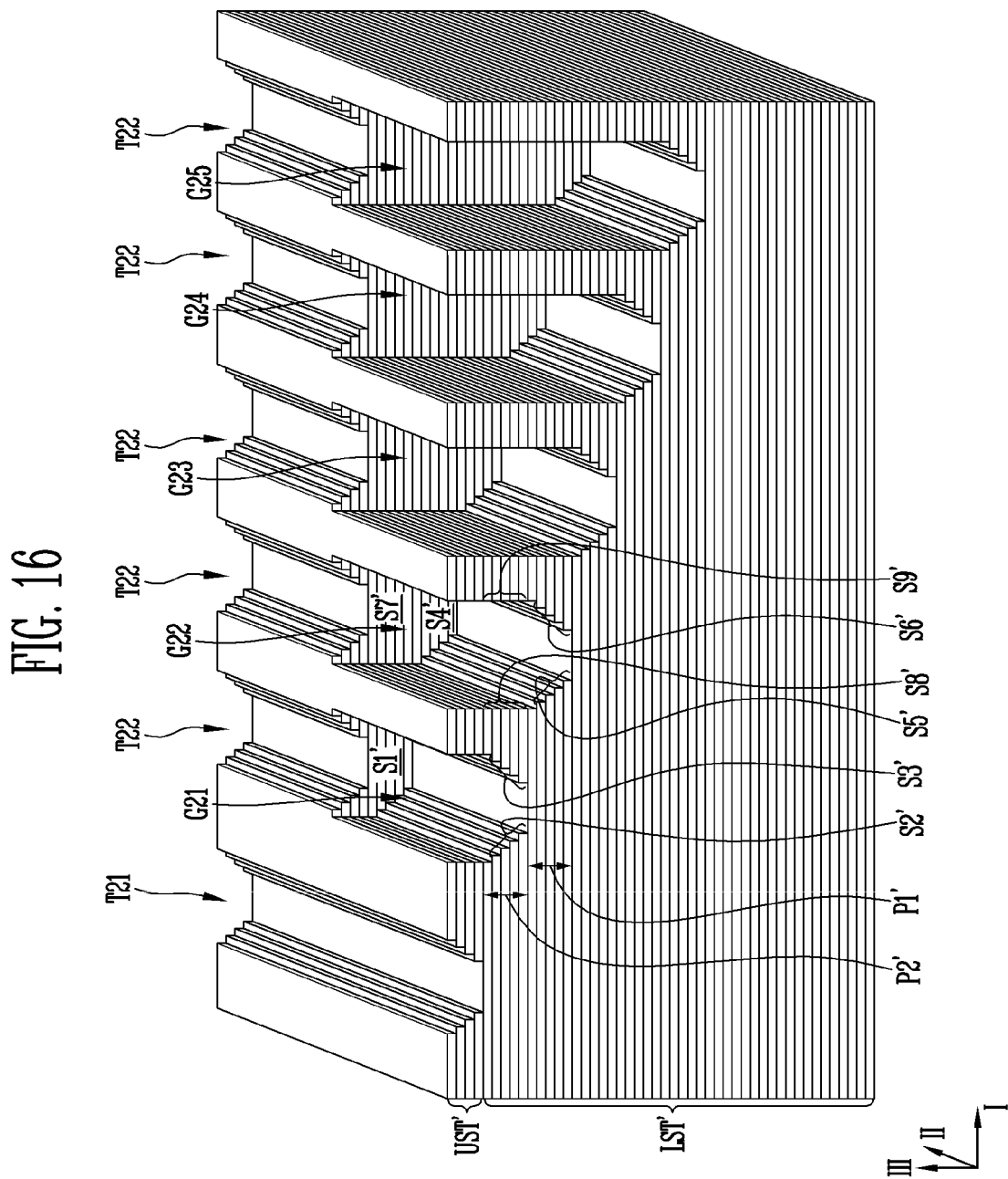
FIG. 16 is a perspective view illustrating structures of first and second trenches and grooves, which are shown in FIGS. 13A and 13B.

FIG. 16 is a perspective view illustrating structures of first and second trenches T21 and T22 and grooves G21 to G25, which are shown in FIGS. 13A and 13B.

Referring to FIG. 16, the first and second trenches T21 and T22 are disposed in the upper stack structure UST', and the grooves G21 to G25 may be disposed at different depths in the lower stack structure LST'.

Each of the first and second trenches T21 and T22 and the grooves G21 to G25 has a sidewall of the first stepped structure SW11 that faces and is symmetric to a sidewall of the second stepped structure SW12.

The grooves G21 to G25 may be locally formed in the lower stack structure LST'. For example, a first groove G21 may include first to third sidewalls S1' to S3'. The first groove G21 may overlap with first patterns P1' formed with some of the lower layers constituting the lower stack structure LST', and be surrounded by second patterns P2' that are disposed on the first patterns P1'. The first sidewall S1' of the first groove G21 may be defined along sidewalls of the second patterns P2'. The second sidewall S2' and the third sidewall S3' may face each other and extend from the first sidewall S1'. The second sidewall S2' may have the first stepped structure SW11 shown in FIG. 15, and the third sidewall S3' may have the second stepped structure SW12 shown in FIG. 15.

A second groove G22 among the grooves G21 to G25 may include fourth to sixth sidewalls S4' to S6'. The second groove G22 may be surrounded by the first patterns P1' and the second patterns P2'. The fourth sidewall S4' of the second groove G22 may comprise sidewalls of the first patterns P1'. The fifth sidewall S5' and the sixth sidewall S6' may face each other and extend from the fourth sidewall S4'. The fifth sidewall S5' may have the first stepped structure SW11 shown in FIG. 15, and the sixth sidewall S6' may have the second stepped structure SW12 shown in FIG. 15. The second groove G22 may further include seventh to ninth sidewalls S7' to S9' respectively extending from the fourth to sixth sidewalls S4' to S6'. The seventh to ninth sidewalls S7' to S9' may extends toward the upper stack structure UST' from the fourth to sixth sidewall S4' to S6'.

A gradient of each of the first sidewall S1', the fourth sidewall S4', and the seventh sidewall S7' may be greater than that of a gradient of each of the first stepped structure SW11 and the second stepped structure SW12.

FIGS. 17A and 17B, 18A and 18B, 19A and 19B, 20A and 20B, 21A to 21C, 22A and 22B, 23, and 24A and 24B are views illustrating a manufacturing method of the semiconductor memory device in accordance with an embodiment of the present disclosure. The gate stack structures described with reference to FIGS. 13A, 13B, 14A, 14B, 15, and 16 may be formed using the embodiment described below. In addition, the following processes that use a combination of a hard mask layer and a photoresist layer to vertically etch trenches can be applied to devices with asymmetric trenches as an alternative to the processes described with respect to FIGS. 9A to 11C.

Figure 17A:
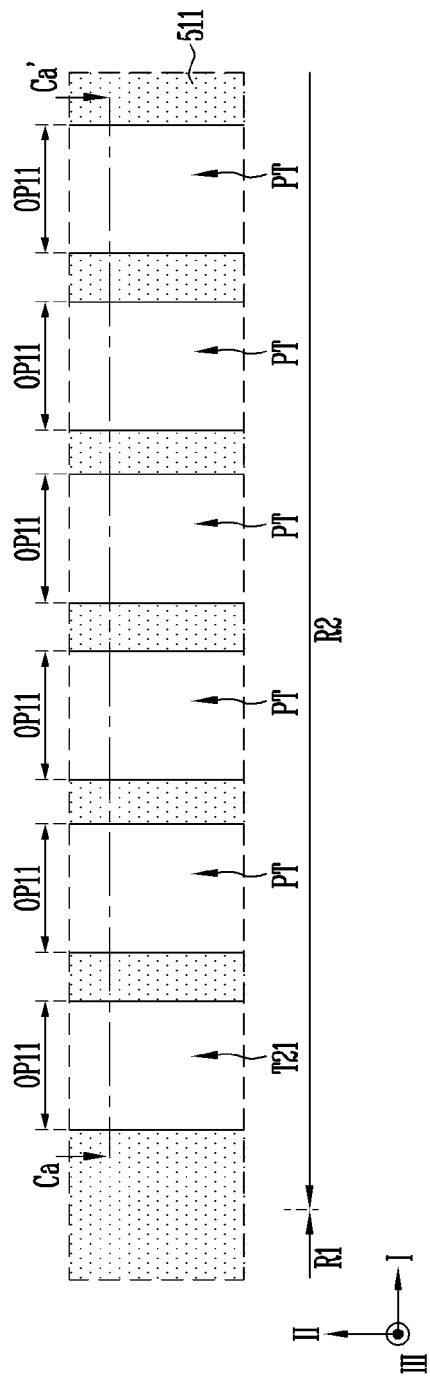

FIGS. 17A and 17B are plan and sectional views illustrating a process of forming a first trench T21 and preliminary trenches PT in a stack structure 500. FIG. 17B illustrates a cross-section of the stack structure 500 taken along line Ca-Ca' shown in FIG. 17A.

Referring to FIGS. 17A and 17B, the stack structure 500 is formed by stacking a plurality of horizontal layers 505[1] to 505[n] on a lower structure 501. The lower structure 501 is the same as the lower structure 101 described with reference to FIGS. 2A and 2B. After an insulating layer 503 covering the lower structure 501 is formed, the stack structure 500 may be formed on the insulating layer 503.

Each of the horizontal layers 505[1] to 505[n] of the stack structure 500 may include a cell region R1 and a contact region R2 extending in a horizontal direction from the cell region R1. The horizontal layers 505[1] to 505[n] may include lower layers 505[1] to 505[k] and upper layers 505[k+1] to 505[n].

Each of the horizontal layers 505[1] to 505[n] may be formed by alternately stacking first material layers and second material layers in a third direction III as described with reference to FIGS. 7A and 7B.

Subsequently, a first mask pattern 511 may be formed on the stack structure 500. Before the first mask pattern 511 is formed, the channel structures CH shown in FIGS. 13A and 13B in the cell region R1 of the stack structure 500 may be formed.

The first mask pattern 511 may include a photoresist pattern. The first mask pattern 511 may include first openings OP11 that open the contact region R2. The first openings OP11 may extend in parallel to each other in a first direction, and be spaced apart from each other in a second direction perpendicular to the first direction. For example, the first openings OP11 may be spaced apart from each other in first direction I, and extend in second direction II.

The first trench T21 and the preliminary trenches PT may be formed by etching each of the upper layers 505[k+1] to 505[n], using the first mask pattern 511 as an etch mask. The first trench T21 may be a pattern disposed between the cell region R1 and the preliminary trenches PT.

Each of the first trench T21 and the preliminary trenches PT may include sidewalls that face each other and are symmetrical to each other. Both the sidewalls may have symmetrical stepped structures Se. The stepped structures SE may be the first stepped structure SW11 and the second stepped structure SW12, which are described with reference to FIG. 15. However, embodiments are not limited to symmetric stepped structures—in other embodiments, the stepped structures may be asymmetric stepped structures such as SW1 and SW2 of FIG. 4A.

The stepped structures Se of each of the first trench T21 and the preliminary trenches PT may be formed by repeating vertical etching and slimming processes as described with reference to FIGS. 7A and 7B.

Figure 18B:
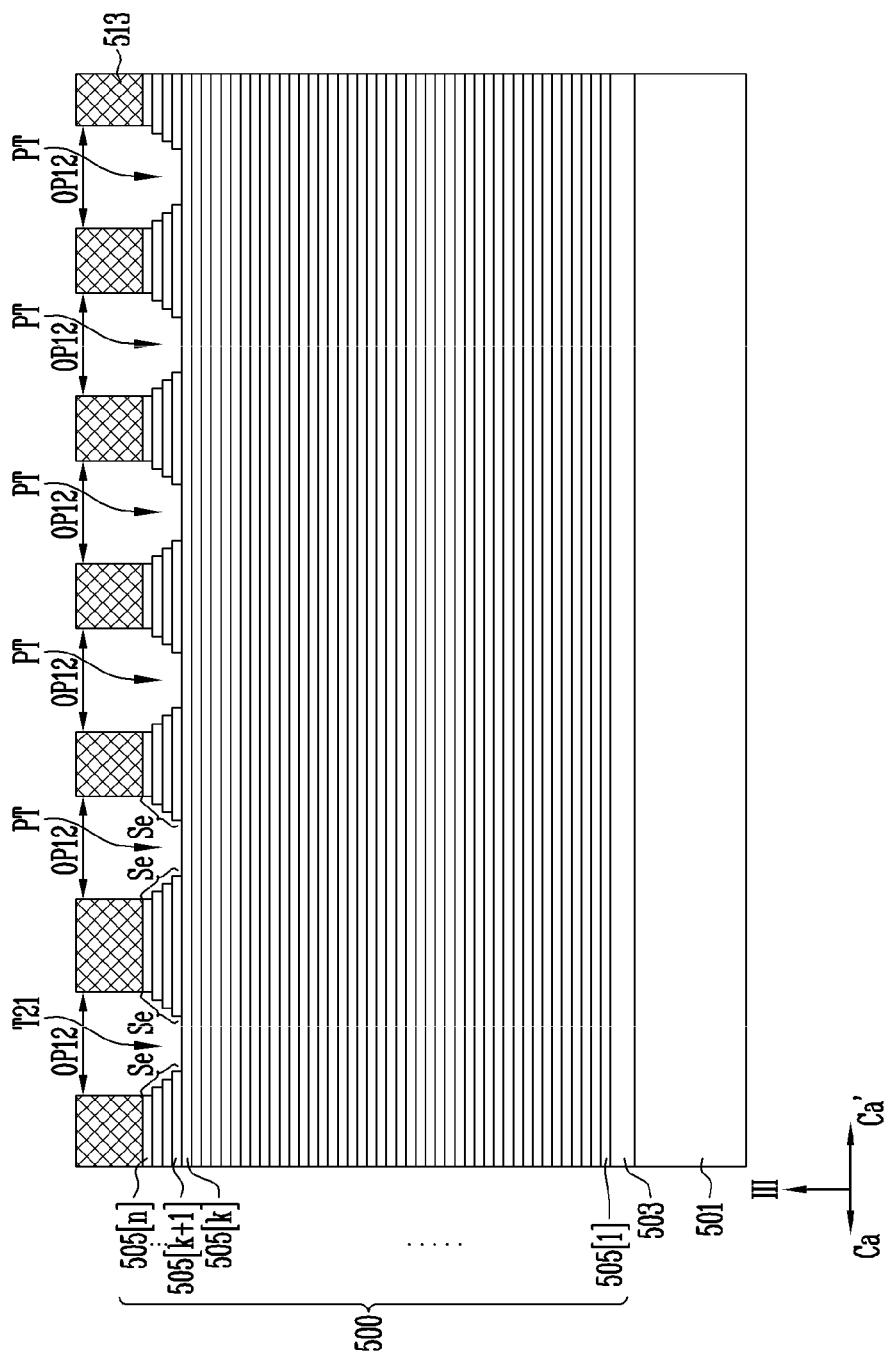

FIGS. 18A and 18B are plan and sectional views illustrating a process of forming an etch stop pattern 513. FIG. 18B illustrates a cross-section of the stack structure 500 taken along line Ca-Ca' shown in FIG. 18A.

Referring to FIGS. 18A and 18B, the etch stop pattern 513 may be formed on the stack structure 500. Before the etch stop pattern 513 is formed, the first mask pattern 511 shown in FIGS. 17A and 17B may be removed. The etch stop pattern 513 may be formed of a material different from those of the stack structure 500 and mask patterns formed in a subsequent process. For example, the etch stop pattern 513 may be a hard mask pattern that includes a polysilicon layer.

In various embodiments, the hard mask pattern may comprise a metal material, a silicide material, a polymeric material, or other hard mask materials as known in the art. The etch stop pattern 513 comprising the hard mask material may be formed, for example, by depositing a layer of hard mask material over an entire surface of the substrate, levelling the hard mask material, and selectively etching the hard mask material to form the etch stop pattern 513 shown in FIG. 18A. The etch stop pattern 513 may extend to the contact region R2 from the cell region R1. The etch stop pattern 513 may include second openings OP12 that locally open the first trench T21 and the preliminary trenches PT, respectively. The second openings OP12 may be spaced apart from each other.

Figure 19A:
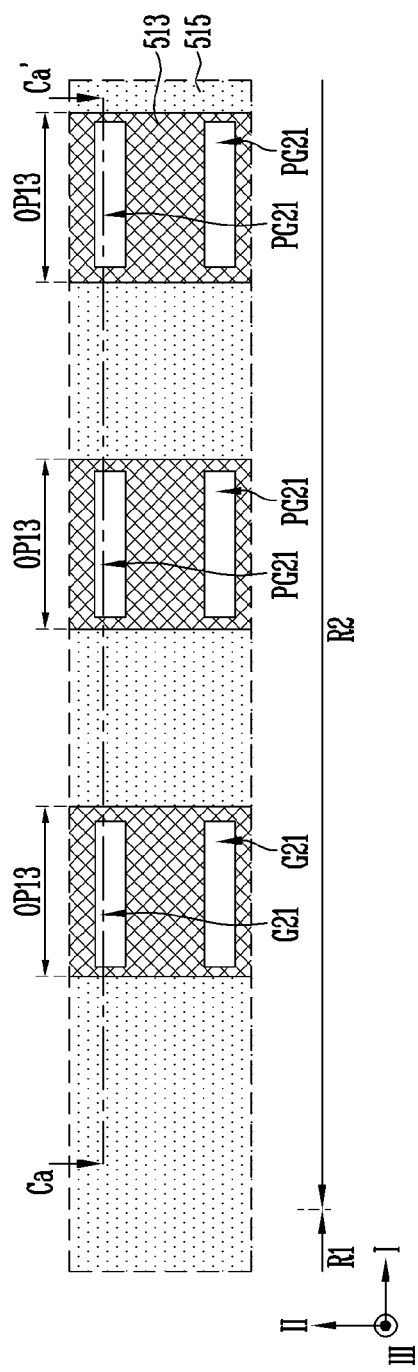

FIGS. 19A and 19B are plan and sectional views illustrating a process of forming a first groove G21 and first preliminary grooves PG21 using a combination of a hard mask material and a photoresist material. FIG. 19B illustrates a cross-section of the stack structure 500 taken along line Ca-Ca' shown in FIG. 19A.

Referring to FIGS. 19A and 19B, a second mask pattern 515 may be formed on the etch stop pattern 513 to cover the stack structure 500. The second mask pattern 515 may include a photoresist pattern.

The second mask pattern 515 may be formed to cover the cell region R1 and the first trench T21. The second mask pattern 515 may be formed to cover a first portion of the preliminary trenches PT, and include third openings OP13 that expose a second portion of the preliminary trenches PT. Specifically, the openings OP13 may be formed over alternating trenches so that every other trench is exposed, as seen in FIG. 19B. The third openings OP13 may be spaced apart from each other. When the second mask pattern 515 is formed over etch stop pattern 513, as shown in FIG. 19B, edges of the second mask pattern can be offset from edges of etch stop pattern 513.

While the edges of etch stop pattern will be used to define edges of a trench by an etching operation, the second mask pattern is used to protect remaining area of the device during the vertical etch process. Therefore, the exact location of edges of the second mask pattern 515 for opening OP13 have a relatively high tolerance compared to edges of the etch stop pattern 513. When a photoresist pattern is removed and re-applied several times, the looser tolerance reduces the probability of an alignment error and simplifies the process.

If the photoresist material is used to define edges of the etched trenches, the photoresist must be carefully aligned each time it is deposited. In contrast, when etch stop pattern 513 is present, a much larger tolerance can be used for the photoresist material of second mask pattern 515, which simplifies and reduces the cost of the process. The larger tolerance may be manifested by a difference between the edges of openings OP13 of the photoresist material and openings OP12 of the hard mask layer, where edges of openings of the photoresist pattern are set back from edges of openings in the etch stop pattern.

Using an etch mask that is a combination of a hard mask material for etch stop pattern 513 and a photoresist pattern 515 for the second mask pattern 515 provides numerous advantages, especially when etching through multiple stack layers 505. When a photoresist layer is used in conjunction with a hard mask layer, the thickness of the photoresist layer can be substantially reduced. The reduced thickness takes less time to form, providing a higher production throughput.

The reduced thickness facilitates curing of the photoresist material, which reduces the amount of time required to cure the material, also leading to improved production throughput. Because it is difficult to cure thick photoresist layers, the reduced thickness helps photo processes to focus properly and reduces defects from uncured photoresist material. Photoresist layers can build up through multiple etching processes, leading to a significant difference in a cell region compared to a contact region. While these and other issues can cause the shape of photoresist layers to change in an etching process, a hard mask material is more stable, which improves process reliability and reduces error rates.

Benefits of using a photoresist material and a hard mask material in conjunction with one another may be more apparent at greater etch depths. For example, in an embodiment, a stack structure 500 has at least 64 layers comprising at least 32 layers 105A and 32 layers 105B, and etching a groove includes etching at least 8 layers 105A and 8 layers 105B in a single etching process. In another embodiment, a stack structure 500 has at least 192 layers comprising at least 96 layers 105A and 96 layers 105B, and etching a groove includes etching at least 16 layers 105A and 16 layers 105B in a single etching process.

Each of the third openings OP13 may extend horizontally in parallel to the preliminary trenches PT. For example, each of the third openings OP13 may extend in the second direction II. The third openings OP13 may be spaced apart from each other. A portion of the etch stop pattern 513 may be exposed by each of the third openings OP13.

A vertical etch process is performed to etch the preliminary trenches using the second mask pattern 515 and the etch stop pattern 513 as an etch mask. In particular, the vertical etching may remove a plurality of layers 505 to extend the preliminary trenches downwards so that a highest step of the stepped preliminary trenches is one layer 505 below the base layer of trench T21. Accordingly, each layer 505 may have a surface portion that is exposed by at least one of the trenches, and the exposed surface portion is a contact pad which is connected to a vertical contact, e.g. a contact 471 in FIG. 14A, in a subsequent process. Thus, the stepped structures Se are moved to a first depth d11 that is greater than a depth of the first trench T21 by the vertical etching process using a combination of the hard mask material in etch stop pattern 513 and the photoresist material in second mask pattern 515.

FIGS. 20A and 20B are plan and sectional views illustrating a process of forming a second groove G22, a third groove G23, a second preliminary groove PG22, and a third preliminary groove PG23. FIG. 20B illustrates a cross-section of the stack structure 500 taken along line Ca-Ca' shown in FIG. 20A.

Referring to FIGS. 20A and 20B, a third mask pattern 517 may be formed on the etch stop pattern 513 to cover the stack structure 500. Before the third mask pattern 517 is formed, the second mask pattern 515 shown in FIGS. 19A and 19B may be removed. The third mask pattern 517 may include a photoresist pattern. Because etch stop pattern 513 including a hard mask material remains in place, the tolerances used to form third mask pattern 517 can be substantially lower than the tolerances that would be required to maintain alignment with edges of the grooves.

The third mask pattern 517 may be formed to cover the cell region R1, the first trench T21, and the first groove G21. The third mask pattern 517 may include a fourth opening OP14 that exposes a portion of each of the preliminary trenches PT shown in FIGS. 19A and 19B. The fourth opening OP14 may extend in the horizontal direction in parallel to the preliminary trenches PT. For example, the fourth opening OP14 may extend in the second direction II. A portion of the etch stop pattern 513 may be exposed by the fourth opening OP14.

At least some of the lower layers 505[1] to 505[k] are etched using the third mask pattern 517 and the etch stop pattern 513 as an etch mask. The etching process may be performed until the layer 505 below the bottom of groove G21 is exposed as the uppermost step of the stepped sidewall of adjacent groove G22.

Put another way, the stepped structures Se exposed in each of the regions in which the second openings OP12 and the fourth opening OP14 overlap with each other are moved to a second depth d12 and a third depth d13, which are deeper than the first depth d11.

The second groove G22 and the second preliminary groove PG22 are etched to the second depth d12 in the stack structure 500 through the above-described etching process, and the third groove G23 and the third preliminary groove PG23 are etched to the third depth d13 in the stack structure 500 through the above-described etching process.

Figure 21C:
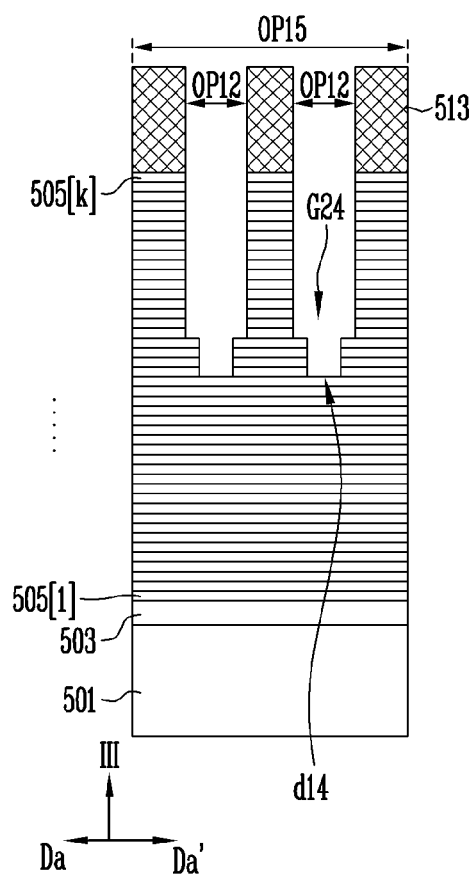

FIGS. 21A to 21C are views illustrating a process of forming a fourth groove G24 and a fifth groove G25. FIG. 21A is a plan view illustrating a fourth mask pattern 519. FIG. 21B illustrates a cross-section of the stack structure 500 taken along line Ca-Ca' shown in FIG. 21A. FIG. 21C illustrates a cross-section of the stack structure 500 taken along line Da-Da' shown in FIG. 21A.

Referring to FIGS. 21A to 21C, the fourth mask pattern 519 may be formed on the etch stop pattern 513 to cover the stack structure 500. Before the fourth mask pattern 519 is formed, the third mask pattern 517 shown in FIGS. 20A and 20B may be removed. The fourth mask pattern 519 may include a photoresist pattern.

The fourth mask pattern 519 may be formed to cover the cell region R1, the first trench T21, and the first to third grooves G21 to G23. The fourth mask pattern 519 may include a fifth opening OP15. The fifth opening OP15 exposes the second and third preliminary grooves PG22 and PG23 shown in FIGS. 20A and 20B. The fifth opening OP15 may extend in the horizontal direction parallel to the first trench T21. For example, the fifth opening OP15 may extend in the second direction II. A portion of the etch stop pattern 513 may be exposed by the fifth opening OP15.

At least some of the layers 505 are etched by a vertical etch process using a combination of the fourth mask pattern 519 and the etch stop pattern 513 as an etch mask. The stepped structures Se exposed in each of the regions in which the second openings OP12 and the fifth opening OP15 overlap with each other are moved to a fourth depth d14 and a fifth depth d15, which are deeper than the third depth d13.

The fourth groove G24 is etched to the fourth depth d14 in the stack structure 500 through the above-described etching process, and the fifth groove G25 is etched to the fifth depth d15 in the stack structure 500 through the above-described etching process. Portions of the upper layers 505[k+1] to 505[n] of the stack structure 500 which remain around the first to fifth grooves G21 to G25 may be dummy structures DS, which are described in more detail with reference to FIGS. 14A and 14B.

A plurality of grooves may be formed such that a lowermost lower layer 505[1] of the stack structure 500 is exposed using the processes described with reference to FIGS. 17A, 17B, 18A, 18B, 19A, 19B, and 21A to 21C. In other words, in an embodiment, a series of deposition and etching processes described with respect to these figures are performed until the lowermost groove exposes the lower layer 505[1]. In some embodiments, a stack structure may have, for example, 96 layers 505, and each trench may expose contact pads for 16 of those layers, resulting in a total of 6 trenches. However, numerous other examples are possible.

Using the combination of the hard mask and the photoresist pattern provides a number of advantages compared to a conventional process of only using a photoresist layer to create the vertical trenches. As noted above, when etch stop pattern 513 is present, the tolerances of the openings OP13, OP14 and OP15 are substantially looser, which greatly simplifies the deposition processes. When a photoresist layer is used without an etch stop pattern 513, the photoresist layer is relatively thick to fill trenches as well as protect upper surfaces of the device.

It can be challenging to fully cure the photoresist layer when it has a substantial thickness, which leads to errors in an etching process. For example, uncured portions of the mask may be removed by vertical etching, causing uneven sidewalls and mismatch between the mask and the trenches. In general, thicker layers of photoresist are problematic in a photocuring operation which has limitations of a depth of focus. However, these issues are substantially reduced by using a combination of hard mask and photoresist materials as described above.

Figure 22B:
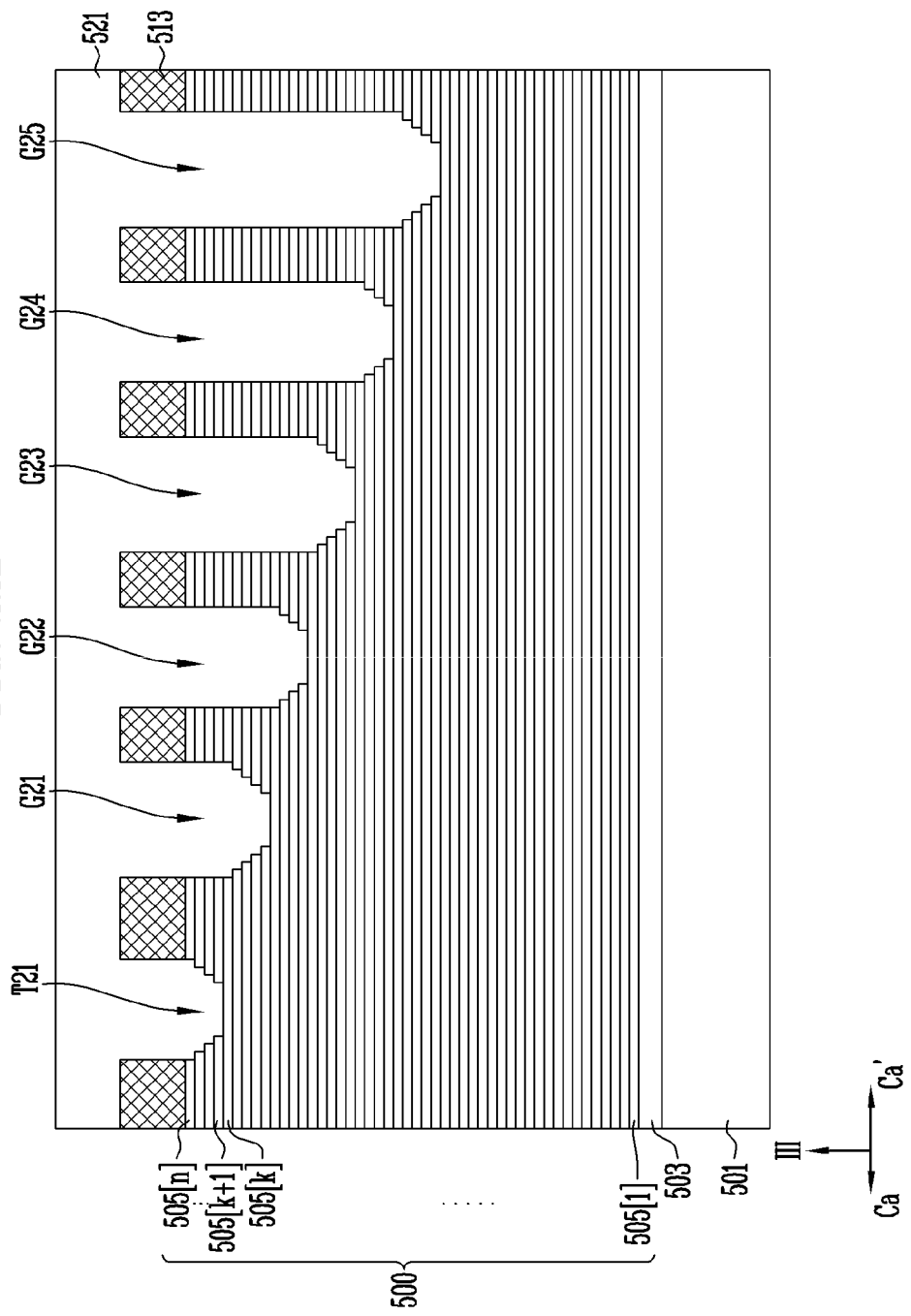

FIGS. 22A and 22B are plan and sectional views illustrating a process of forming a gap fill insulating layer 521. Dashed lines shown in FIG. 22A represent a layout of the first to fifth grooves G21 to G25. FIG. 22B illustrates a cross-section of the stack structure 500 taken along line Ca-Ca' shown in FIG. 22A.

Referring to FIG. 22A, each of the first to fifth grooves G21 to G25 is surrounded by the lower layers 505[1] to 505[k] shown in FIG. 22B. The lower layers 505[1] to 505[k] shown in FIG. 22B may surround each of the first to fifth grooves G21 to G25, to define first to fourth sidewalls 1W' to 4W' of each of the first to fifth grooves G21 to G22.

The first sidewall 1W' and the second sidewall 2W' face each other in the first direction I, and the third sidewall 3W' and the fourth sidewall 4W' face each other in the second direction II. The stepped structures of each of the first to fifth grooves G21 to G25 may be respectively formed at lower portions of the first sidewall 1W' and the second sidewall 2W', which are adjacent to a bottom surface of a groove.

Referring to FIGS. 22A and 22B, the gap fill insulating layer 521 is formed on the etch stop pattern 513 to fill a plurality of grooves including the first to fifth grooves G21 to G25 and the first trench T21. In accordance with an embodiment of the present disclosure, the plurality of grooves including the first to fifth grooves G21 to G25 are locally formed in the contact region R2 of the stack structure 500, so that the flatness of the gap fill insulating layer 521 can be improved.

Figure 23:
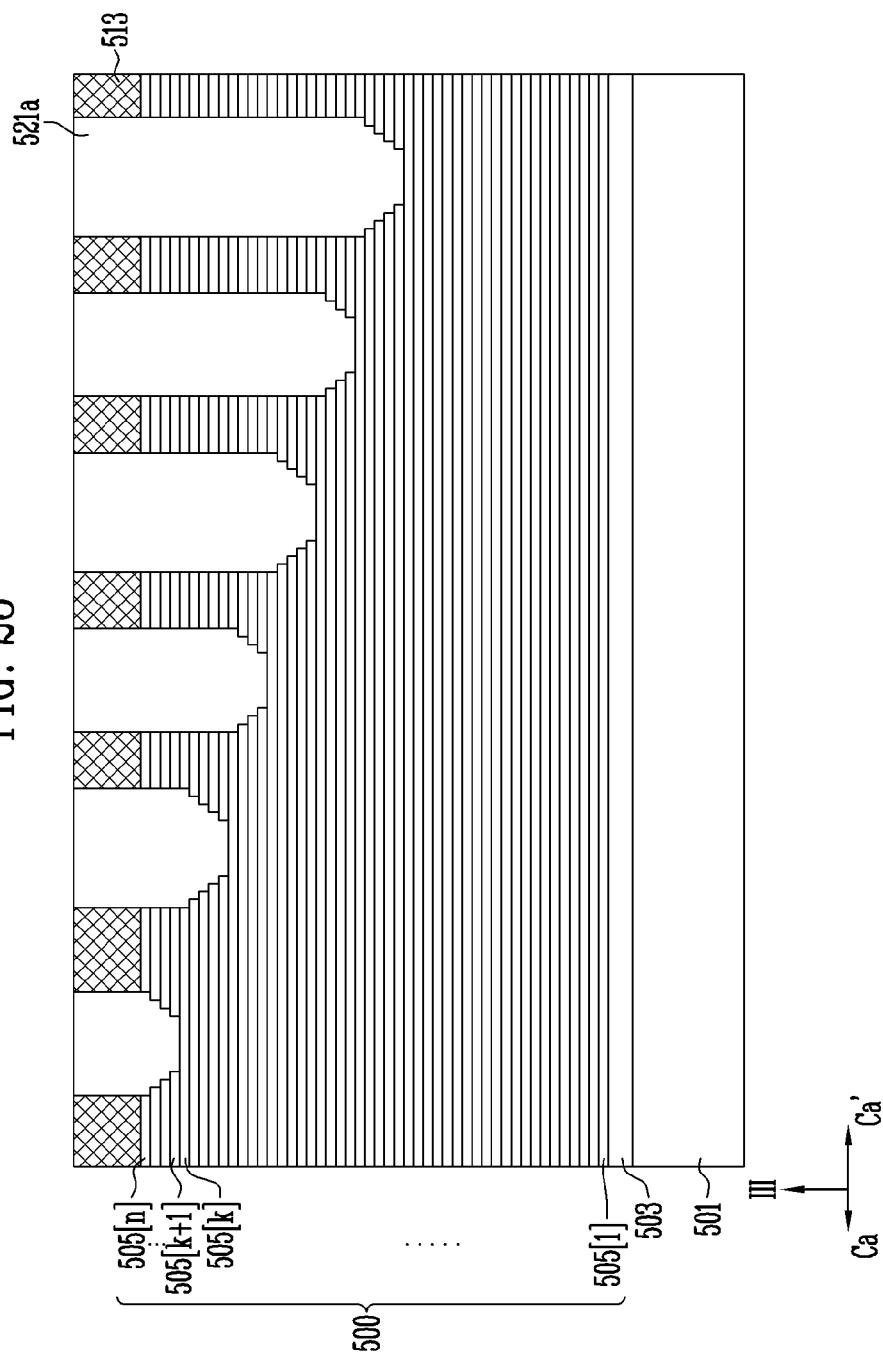

FIG. 23 is a sectional view illustrating a first planarization process.

Referring to FIG. 23, the gap fill insulating layer 521 shown in FIGS. 22A and 22B may be planarized. The first planarization process may be performed using Chemical Mechanical Polishing (CMP). The etch stop pattern 513 may be exposed by the planarized gap fill insulating layer 521a. The etch stop pattern 513 may be used as a stop layer in the first planarization process. In other embodiments, an etch back process is performed to remove the insulating layer 521, and the etch stop pattern 513 is used as a stop layer for the etch back process. Thus, etch stop pattern 513 may be a stop layer for a removal process that may be a polishing process or an etch back process.

Figure 24A:
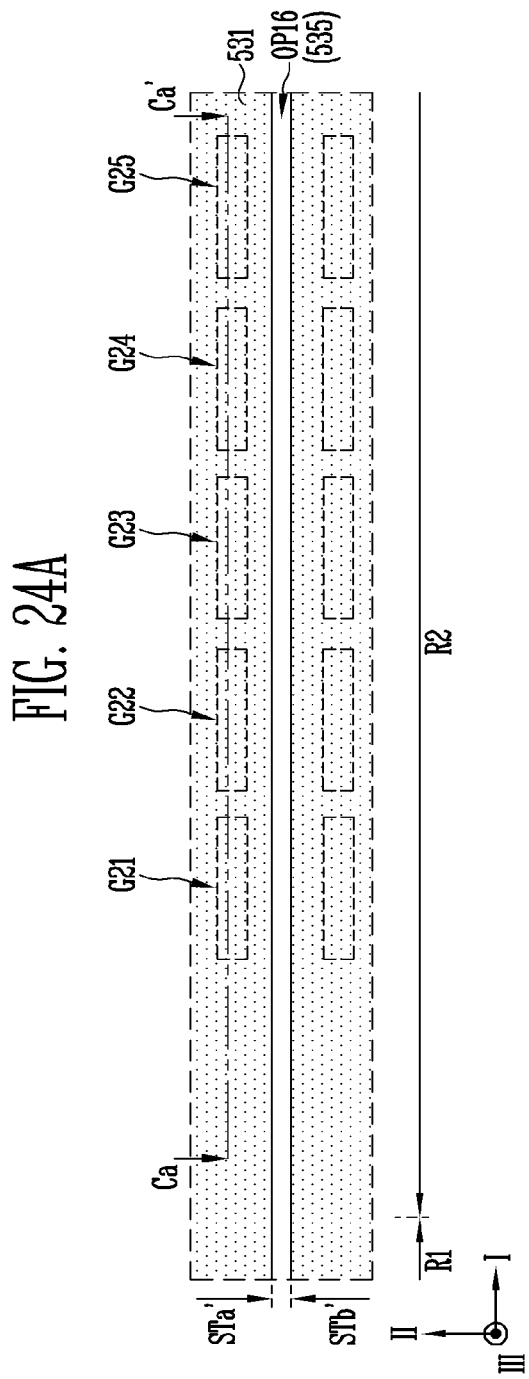

FIGS. 24A and 24B are views illustrating a process of forming a slit 535. Dashed lines shown in FIG. 24A represent a layout of the first to fifth grooves G21 to G25. FIG. 24B illustrates a cross-section of the stack structure 500 taken along line Ca-Ca' shown in FIG. 24A.

Referring to FIGS. 24A and 24B, a fifth mask pattern 531 may be formed on the stack structure 500. Before the fifth mask pattern 531 is formed, the etch stop pattern 513 shown in FIG. 23 may be removed, and the planarized gap fill insulating layer 521a may be planarized through a second planarization process. The second planarization process may be performed using an etch-back or CMP process.

The fifth mask pattern 531 may extend to the contact region R2 from the cell region R1. The fifth mask pattern 531 may include a sixth opening OP16 that exposes the stack structure 500. The sixth opening OP16 may extend to the contact region R2 from the cell region R1. The sixth opening OP16 may not overlap with the plurality of grooves including the first to fifth grooves G21 to G25 in the contact region R2.

A portion of each of the horizontal layers 505[1] to 505[n] of the stack structure 500 is etched using the fifth mask pattern 531 as an etch mask. Accordingly, the slit 535 penetrating the stack structure 500 is formed. The stack structure 500 may be separated into a plurality of stack patterns by the slit 535. For example, the stack patterns may include a first stack pattern STa' and a second stack pattern STb, which are separated by the slit 535.

The first and second stack patterns STa' and STb' may be used as the gate stack structures ST11 and ST12 described with reference to FIGS. 13A and 13B. In another embodiment, in order to form the gate stack structures ST11 and ST12 described with reference to FIGS. 13A and 13B, a sacrificial layer of each of the horizontal layers 505[1] to 505[n] constituting the first and second stack patterns STa' and STb' may be replaced with a conductive layer or an interlayer insulating layer.

Subsequently, a process of filling the slit 535 with a vertical structure and subsequent processes of forming the contact plugs 471 shown in FIG. 14A may be performed.

FIG. 25 illustrates a layout of a semiconductor memory device in accordance with an embodiment of the present disclosure.

Referring to FIG. 25, the semiconductor memory device may include gate stack structures ST21 and ST22. Each of the gate stack structures ST21 and ST22 may have a cell region R1 and a contact region R2 extending in a horizontal direction from the cell region R1.

Each of the gate stack structures ST21 and ST22 may be penetrated by channel structures CH arranged in the cell region R1. Although not shown in FIG. 25, a sidewall of each of the channel structures CH may be adjacent to a memory layer. Materials constituting the each of the channel structures CH and the memory layer may be the same as described with reference to FIGS. 1A and 1B.

The gate stack structures ST21 and ST22 may be separated from each other by a slit 651. For example, the gate stack structures ST21 and ST22 may include a first gate stack structure ST21 and a second gate stack structure ST22, which are separated from each other by the slit 651. The first gate stack structure ST21 and the second gate stack structure ST22 may be symmetrical to each other with respect to the slit 651.

Figure 26A:
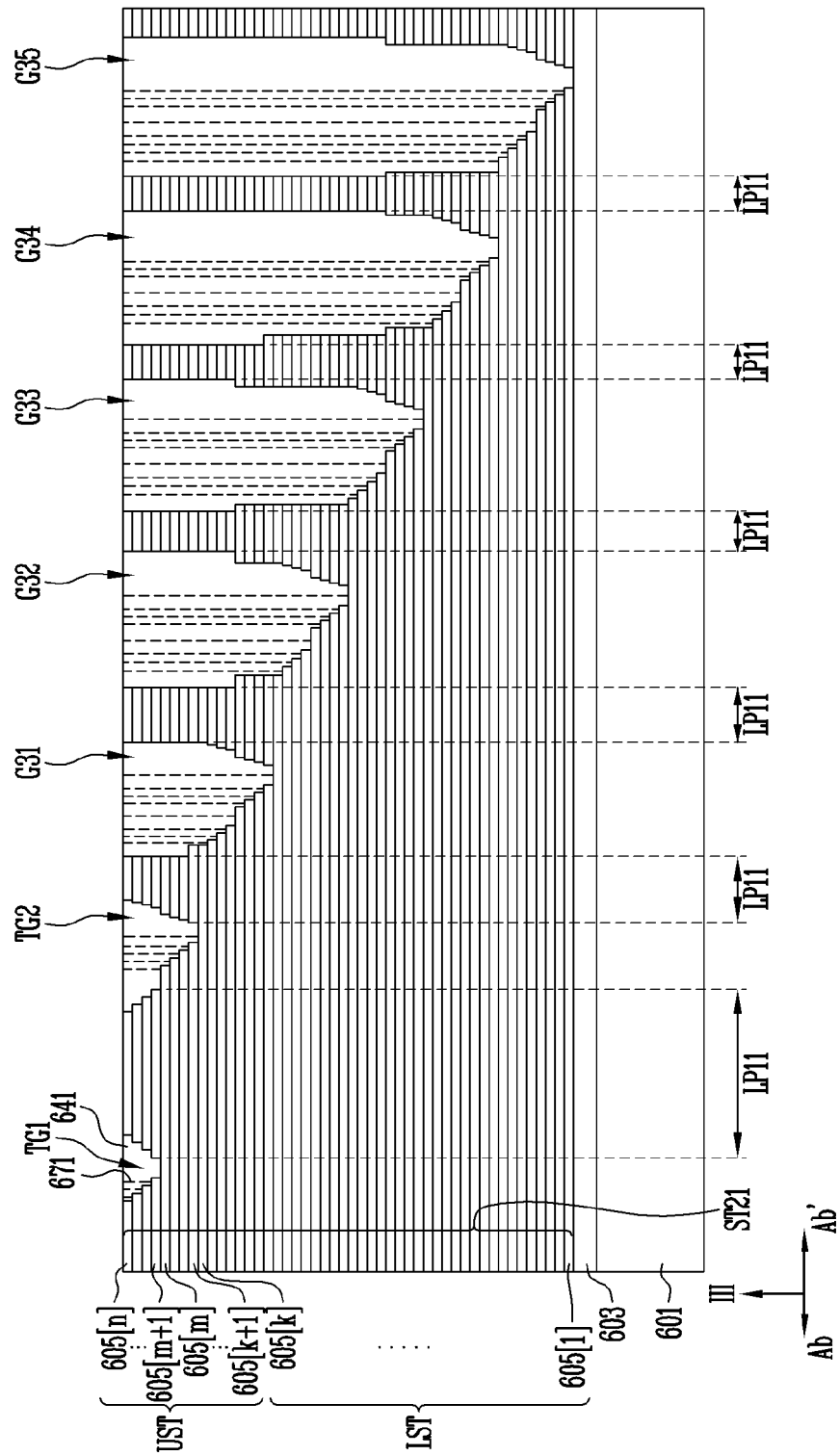
FIGS. 26A and 26B illustrate cross-sections of the semiconductor memory device, which are taken along lines Ab-Ab' and Bb-Bb' shown in FIG. 25.
Figure 26B:
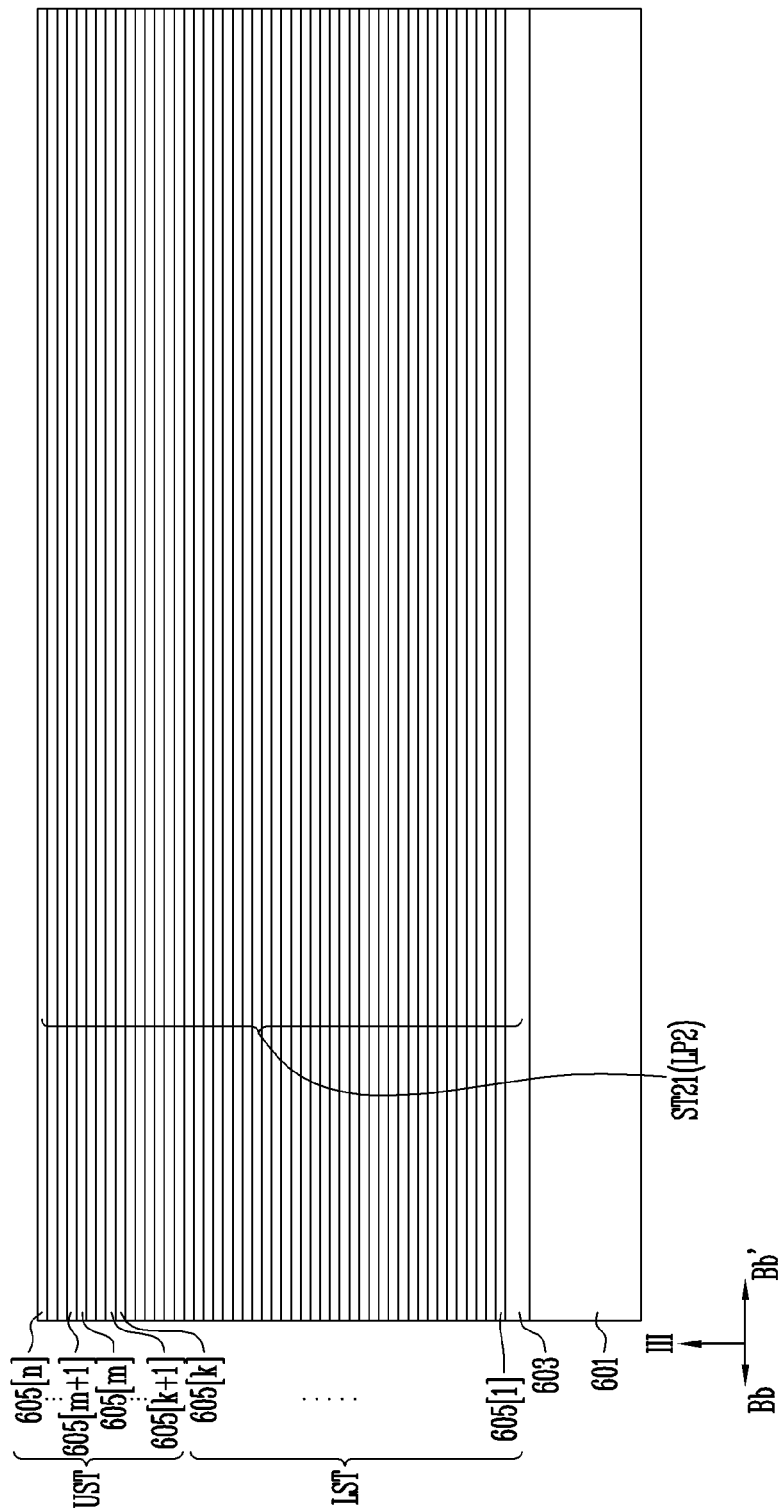

Each of thin films 605[1] to 605[n] shown in FIGS. 26A and 26B that constitute the gate stack structures ST21 and ST22 and are stacked in a third direction III may extend to the contact region R2 from the cell region R1 to surround each of upper grooves TG1 and TG2 and grooves G31 to G35.

The grooves G31 to G35 are disposed in the contact region R2 and spaced apart from each other. The grooves G31 to G35 may have different depths. The grooves G31 to G35 may be arranged in a line in a first direction I. However, the embodiment of the present disclosure is not limited thereto. For example, the grooves G31 to G35 may be arranged in various structures in the horizontal direction. The slit 651 may extend to overlap with each of the grooves G31 to G35.

The upper grooves TG1 and TG2 may be disposed between the grooves G31 to G35 and the cell region R1. For example, the upper grooves TG1 and TG2 may include a first upper groove TG1 disposed between the grooves G31 to G35 and the cell region R1 and a second upper groove TG2 that is disposed between the first upper groove TG1 and the grooves G31 to G35 and is deeper than the first upper groove TG1.

Each of the gate stack structures ST21 and ST22 may include connection parts disposed in the contact region R2. For example, each of the gate stack structures ST21 and ST22 may include first connection parts LP11 and a second connection part LP12. The first connection parts LP11 may be parts of each of the gate stack structures ST21 and ST22, which are respectively disposed between the upper grooves TG1 and TG2, between grooves G31 to G35, and between the upper groove TG2 and a first groove G31, which are adjacent to each other. The second connection part LP12 may be a portion of each of the gate stack structures ST21 and ST22 which connects the first connection parts LP11 from the cell region R1. Each of the upper grooves TG1 and TG2 and the grooves G31 to G35 have sidewalls defined by first and second connection parts LP11 and LP12.

FIGS. 26A and 26B illustrate sections of the semiconductor memory device which are taken along lines Ab-Ab' and Bb-Bb' shown in FIG. 25.

Referring to FIGS. 26A and 26B, the gate stack structures ST21 and ST22 shown in FIG. 25 may be divided into a lower stack structure LST and an upper stack structure UST. The lower stack structure LST and the upper stack structure UST may be disposed on a lower structure 601 described with reference to FIGS. 2A and 2B. The lower structure 601 may be covered with an insulating layer 603.

The lower stack structure LST may include a stack of lower layers 605[1] to 605[k]. The upper stack structure UST may include first upper layers 605[k+1] to 605[m] stacked on the lower stack structure LST and second upper layers 605[m+1] to 605[n] stacked on the first upper layers 605[k+1] to 605[m]. Each of the lower layers 605[1] to 605[k], the first upper layers 605[k+1] to 605[m], and the second upper layers 605[m+1] to 605[n] may include a conductive layer 105A and an interlayer insulating layer 105B, which are described with reference to FIG. 3.

Each of the grooves G31 to G35 may penetrate the upper stack structure UST and extend to different depths toward the inside of the lower structure LST. In other words, bottom surfaces of the grooves G31 to G35 may be disposed at different heights.

Each of the upper grooves TG1 and TG2 overlaps with the lower layers 605[1] to 605[k].

The second upper groove TG2 extends in the third direction III and penetrates the second upper layers 605[m+1] to 605[n] and the first upper layers 605[k+1] to 605[m] between the first upper groove TG1 and the grooves G31 to G35. The second upper groove TG2 may overlap with the lower stack structure LST and an uppermost lower layer 605[k] may be a bottom surface of the second upper groove TG2.

The first upper groove TG1 extends in the third direction III and penetrates the second upper layers 605[m+1] to 605[n]. The first upper groove TG1 overlaps with the first upper layers 605[k+1] to 605[m]. That is, an uppermost first upper layer 605[m] may be a bottom surface of the first upper groove TG1.

Each of the lower layers 605[1] to 605[k], the first upper layers 605[k+1] to 605[m], and the second upper layers 605[m+1] to 605[n], which constitute the gate stack structure ST21, may include first connection parts LP11 and a second connection part LP12.

Each of the upper grooves TG1 and TG2 and the grooves G31 to G35 may be filled with a gap fill insulating layer 641. Each of the upper grooves TG1 and TG2 and the grooves G31 to G35 may stepped sidewalls. The stepped sidewalls may have steps formed by the thin films 605[1] to 605[n] constituting the gate stack structure ST21, and provide pad regions connected to contact plugs 671. Each of the contact plugs 671 may extend in the third direction III to penetrate the gap fill insulating layer 641.

Each of the second upper groove TG2 and the grooves G31 to G35 may include a first stepped structure and a second stepped structure, which have different gradients and face each other. The first stepped structure and the second stepped structure may be the same structures described with reference to FIG. 4A.

The first upper groove TG1 may include third stepped structures that face each other and are symmetrical to each other. The third stepped structure may be the same as the structure described with reference to FIG. 4B.

Conductive layers constituting the thin films 605[1] to 605[k] included in the gate stack structure ST21 may include word lines connected to memory cells and select lines connected to select transistors. For example, conductive layers included in the second upper layers 605[m+1] to 605[n] of the gate stack structure ST21 may be used as first select lines, and conductive layers included in the first upper layers 605[k+1] to 605[m] and the lower layers 605[1] to 605[k] of the gate stack structure ST21 may be used as word lines or second select lines.

Figure 27A:
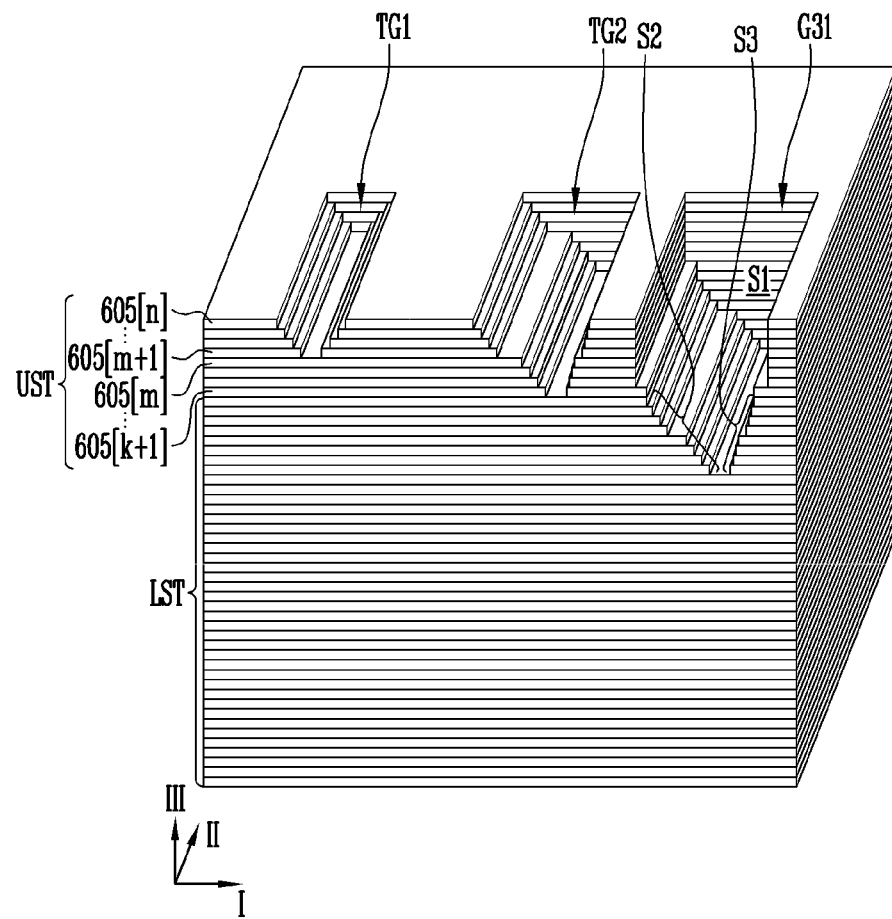
FIGS. 27A and 27B are perspective views illustrating structures of upper grooves and grooves, which are shown in FIG. 25.
Figure 27B:
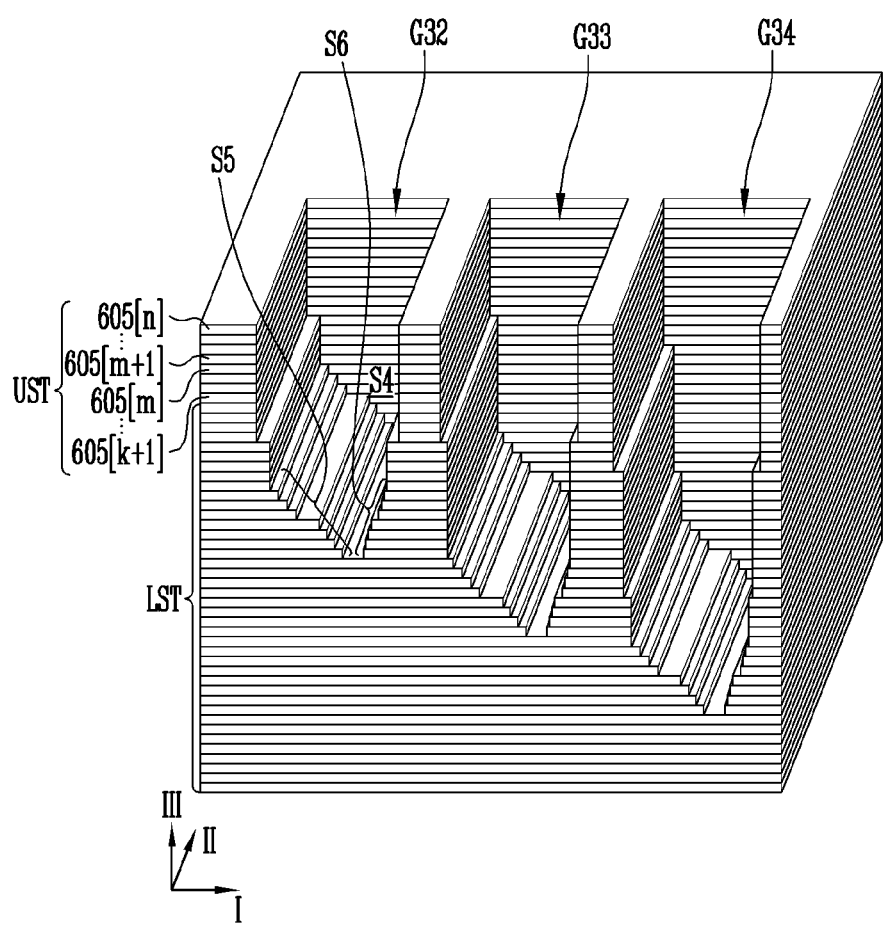

FIGS. 27A and 27B are perspective views illustrating structures which are shown in FIG. 25. FIGS. 27A and 27B illustrate a portion of the gate stack structure.

Referring to FIGS. 27A and 27B, the upper grooves TG1 and TG2 are disposed in the upper stack structure UST, and overlap with the lower stack structure LST. The grooves G31 to G34 penetrate all layers of the upper stack structure UST, and have different depths in the lower stack structure LST.

The first upper groove TG1 is surrounded by the second upper layers 605[m+1] to 605[n]. The first upper groove TG1 has sidewalls that face each other and are symmetrical to each other. Sidewalls of the first upper groove TG1 may have the third stepped structure SW3 described with reference to FIG. 4B. The first upper groove TG1 overlaps with the first upper layers 605[k+1] to 605[m].

The second upper groove TG2 is surrounded by the second upper layers 605[m+1] to 605[n] and the first upper layers 605[k+1] to 605[m]. The second upper groove TG2 overlaps with the lower stack structure LST. The second upper groove TG2 may have asymmetrical sidewalls that face each other and have different gradients. One of the sidewalls of the second upper groove TG2 may have the first stepped structure SW1 shown in FIG. 4A, and the other sidewall of the second upper groove TG2 may have the second stepped structure SW2 shown in FIG. 4A. Each of the grooves G31 to G34 may have a sidewall with the first stepped structure SW1 shown in FIG. 4A and a sidewall with the second stepped structure SW2 shown in FIG. 4A. For example, the first groove G31 may include first to third sidewalls S1 to S3 described with reference to FIG. 5A, and a second groove G32 may include forth to sixth sidewalls S4 to S6 described with reference to FIG. 5A.

The first upper layers 605[k+1] to 605[m] and the second upper layers 605[m+1] to 605[n] may surround each of the grooves G31 to G34.

FIGS. 28A and 28B, 29A and 29B, and 30A to 30D are views illustrating a method of manufacturing a semiconductor memory device in accordance with an embodiment of the present disclosure. The gate stack structures described with reference to FIGS. 25, 26A, 26B, 27A, and 27B may be formed as described below.

Figure 28B:
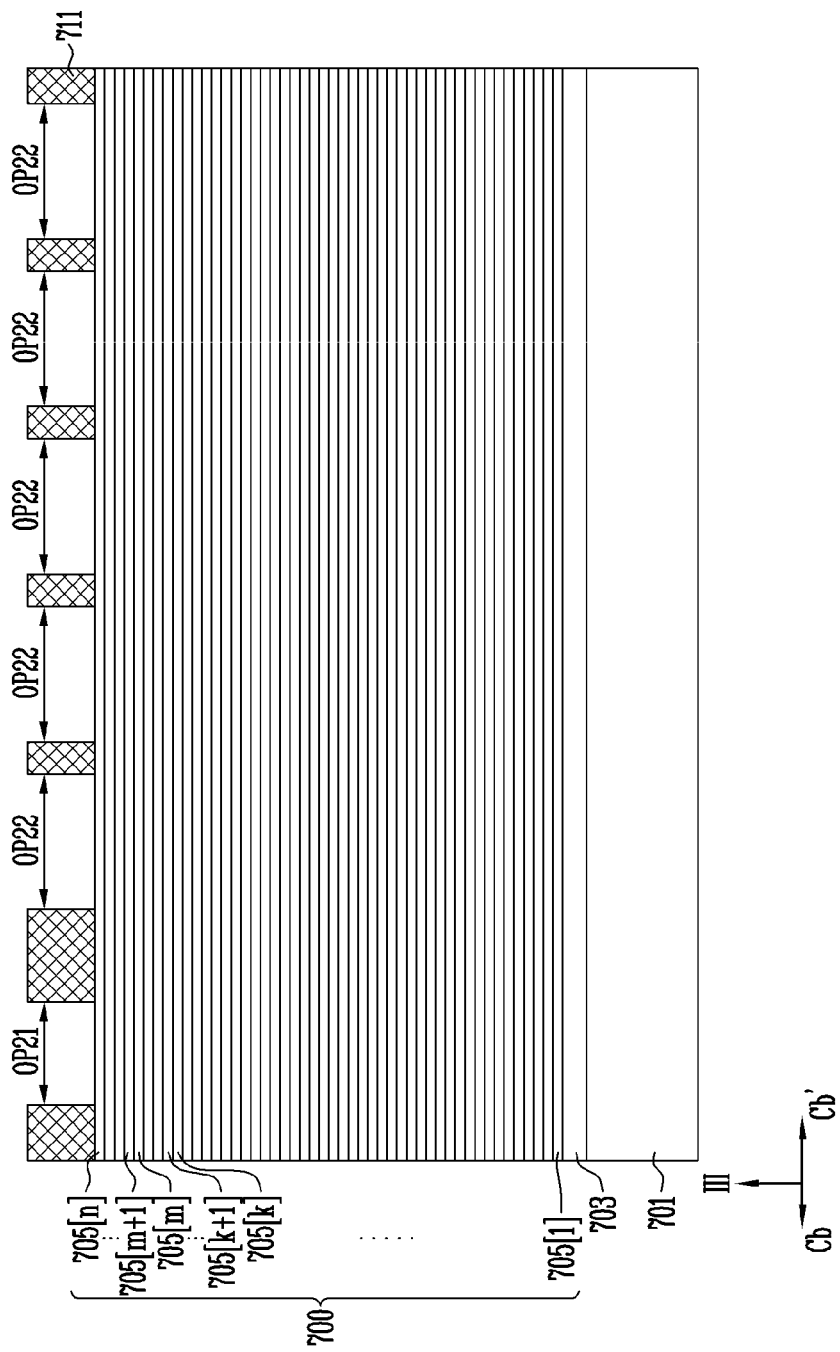

FIGS. 28A and 28B are plan and sectional views illustrating an etch stop pattern 711 on a stack structure 700. FIG. 28B illustrates a cross-section of the stack structure 700 taken along line Cb-Cb' shown in FIG. 28A.

Referring to FIGS. 28A and 28B, the stack structure 700 is formed by stacking a plurality of horizontal layers 705[1] to 705[n] on a lower structure 701. The lower structure 701 may be the same as the lower structure 101 described with reference to FIGS. 2A and 2B. After an insulating layer 703 covering the lower structure 701 is formed, the stack structure 700 may be formed on the insulating layer 703.

Each of the horizontal layers 705[1] to 705[n] of the stack structure 700 may include a cell region R1 and a contact region R2 extending in a horizontal direction from the cell region R1. The horizontal layers 705[1] to 705[n] may include lower layers 705[1] to 705[k], first upper layers 705[k+1] to 705[m], and second upper layers 705[m+1] to 705[n].

Each of the horizontal layers 705[1] to 705[n] may be formed by alternately stacking first material layers and second material layers as described with reference to FIGS. 7A and 7B.

Subsequently, an etch stop pattern 711 may be formed on the stack structure 700. Before the etch stop pattern 711 is formed, the channel structures CH shown in FIG. 25 may be formed in the cell region R1 of the stack structure 700.

The etch stop pattern 711 may be formed of a material different from those of the stack structure 700 and mask patterns formed in a subsequent process. For example, the etch stop pattern 711 may be a hard mask material as described above with respect to etch stop pattern 513.

The etch stop pattern 711 may extend to the contact region R2 from the cell region R1. The etch stop pattern 711 may include a first opening OP21 and second openings OP22, which locally open the stack structure 700 in the contact region R2.

The first opening OP21 may be disposed between the cell region R1 and the second openings OP22. Accordingly, the first opening OP21 may be formed closer to the cell region R1 than the second openings OP22. A width WC of the first opening OP21 may be narrower than a width WD of each of the second openings OP22.

Figure 29A:
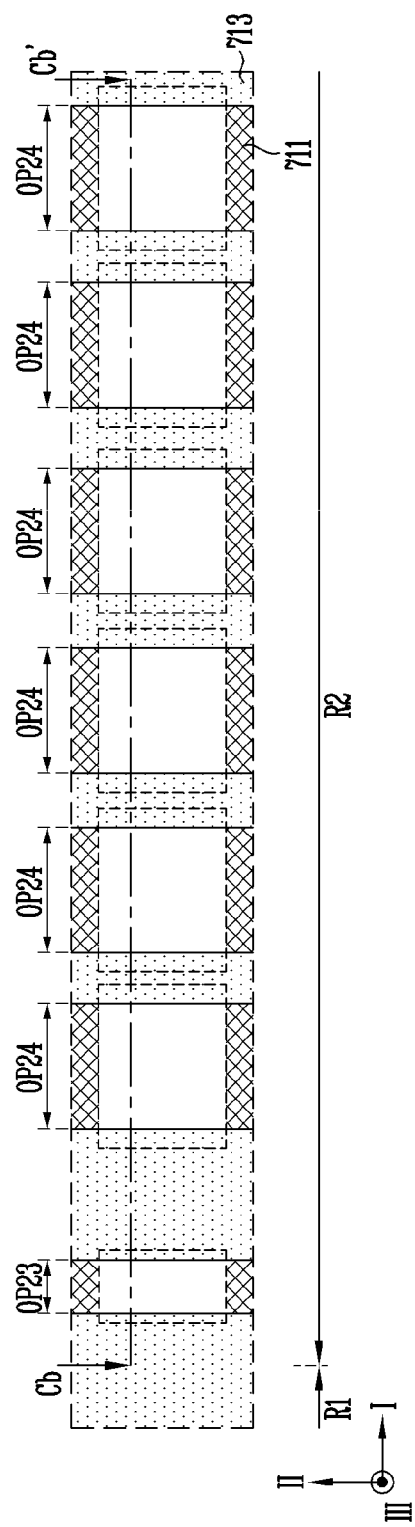
Figure 29B:
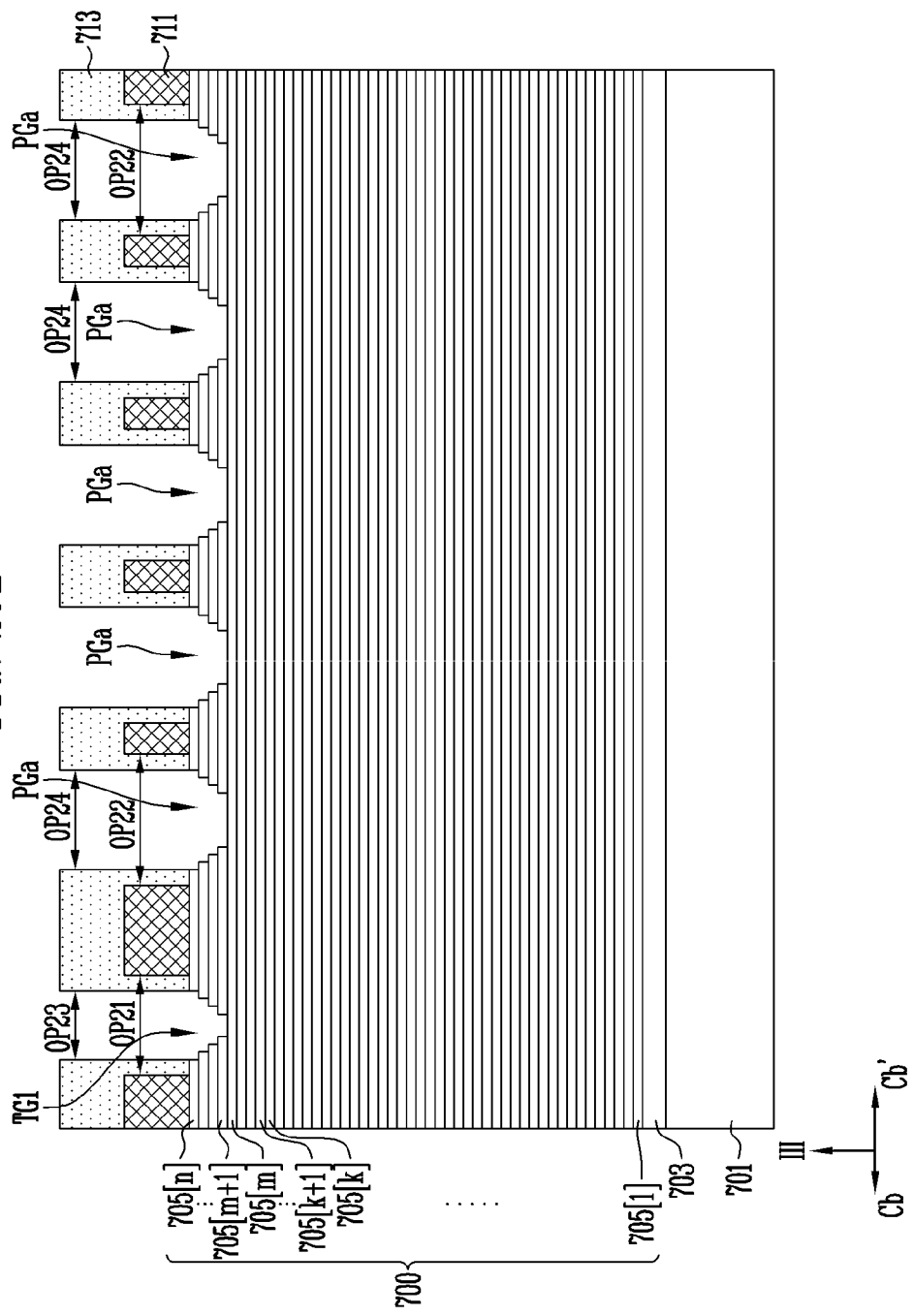

FIGS. 29A and 29B are views illustrating a process of forming a first upper groove TG1 and first preliminary grooves PGa. FIG. 29A is a plan view illustrating a first mask pattern 713. FIG. 29B illustrates a cross-section of the stack structure 700 taken along line Cb-Cb' shown in FIG. 29A.

Referring to FIGS. 29A and 29B, the first mask pattern 713 may be formed on the etch stop pattern 711 to cover the stack structure 700. The first mask pattern 713 may include a photoresist pattern. The first mask pattern 713 may have a third opening OP23 that exposes the first opening OP21 and fourth openings OP24 that respectively expose the second openings OP22.

Each of the second upper layers 705[m+1] to 705[n] is etched using the first mask pattern 713 and the etch stop pattern 711 as an etch mask, so that the first upper groove TG1 and the first preliminary grooves PGa are formed. The first upper groove TG1 may be defined by etching portions of the second upper layers 705[m+1] to 705[n] which are exposed by the first opening OP21 and the third opening OP23. The first preliminary grooves PGa may be defined by etching portions of the second upper layers 705[m+1] to 705[n] which are exposed by the second openings OP22 and the fourth openings OP24.

Each of the first upper groove TG1 and the first preliminary grooves PGa may include opposing sidewalls. Both of the opposing sidewalls may have stepped structures that are symmetrical to each other. Each of the stepped structures may have the third stepped structure SW3 described with reference to FIGS. 4A to 4B.

The stepped structures of each of the first upper groove TG1 and the first preliminary grooves PGa may be formed by repeating an etching process and a slimming process as described with reference to FIGS. 7A and 7B.

FIGS. 30A to 30D are plan views illustrating processes of etching a portion of each of the first preliminary grooves PGa shown in FIGS. 29A and 29B.

Referring to FIG. 30A, the stack structure 700 shown in FIG. 29B may be etched using a second mask pattern 715 covering a portion of each of the first preliminary grooves PGa. Before the second mask pattern 715 is formed, the first mask pattern 713 shown in FIGS. 29A and 29B may be removed. The second mask pattern 715 may include a photoresist pattern.

The second mask pattern 715 may extend to completely cover the first upper groove TG1 and the cell region R1. The second mask pattern 715 may include fifth openings OP25.

The fifth openings OP25 may overlap with the second openings OP22, respectively. The fifth openings OP25 may be biased toward one side of the first preliminary grooves PGa.

Each of the first upper layers 705[k+1] to 705[m] shown in FIG. 29B may be etched using the etch stop pattern 711 and the second mask pattern 715 as an etch mask. Accordingly, the second upper groove TG2 shown in FIGS. 25, 26A, and 27A is formed. During the etching process for forming the second upper groove TG2, the second stepped structure SW2 described with reference to FIG. 4A may be formed using openings OP25 and the second openings OP22. The second stepped structure SW2 may be formed by repeating the etching and slimming processes which are described with reference to FIG. 8C.

Through the process described with reference to FIG. 30A, one of the first preliminary grooves PGa may be changed to have the shape of the second upper groove TG2 at a position shown in FIG. 30B, and the remaining first preliminary grooves PGa may be changed to the shape of second preliminary grooves PGb, which is the same as the second upper groove TG2, at positions shown in FIG. 30B.

Referring to FIG. 30B, after the second upper groove TG2 and the second preliminary grooves PGb are formed, the second mask pattern 715 shown in FIG. 30A may be removed. Subsequently, a third mask pattern 717 may be formed, which has sixth openings OP26 opening some of the second preliminary grooves PGb, and completely covers the remaining second preliminary grooves PGb. The third mask pattern 717 may be formed on the etch stop pattern 711. The third mask pattern 717 may include a photoresist pattern.

The third mask pattern 717 may extend to completely cover the first upper groove TG1, the second upper groove TG2, and the cell region R1. The sixth openings OP26 may overlap with some of the second openings OP22, respectively.

In order to form the first groove G31 shown in FIGS. 25, 26A, and 27A, at least some of the lower layers 705[1] to 705[k] shown in FIG. 29B may be etched using the etch stop pattern 711 and the third mask pattern 711 as an etch mask. A structure with the same structure as the stack structure 300 shown in FIG. 9B may be formed by the etching process for forming the first groove G31.

Figure 30C:
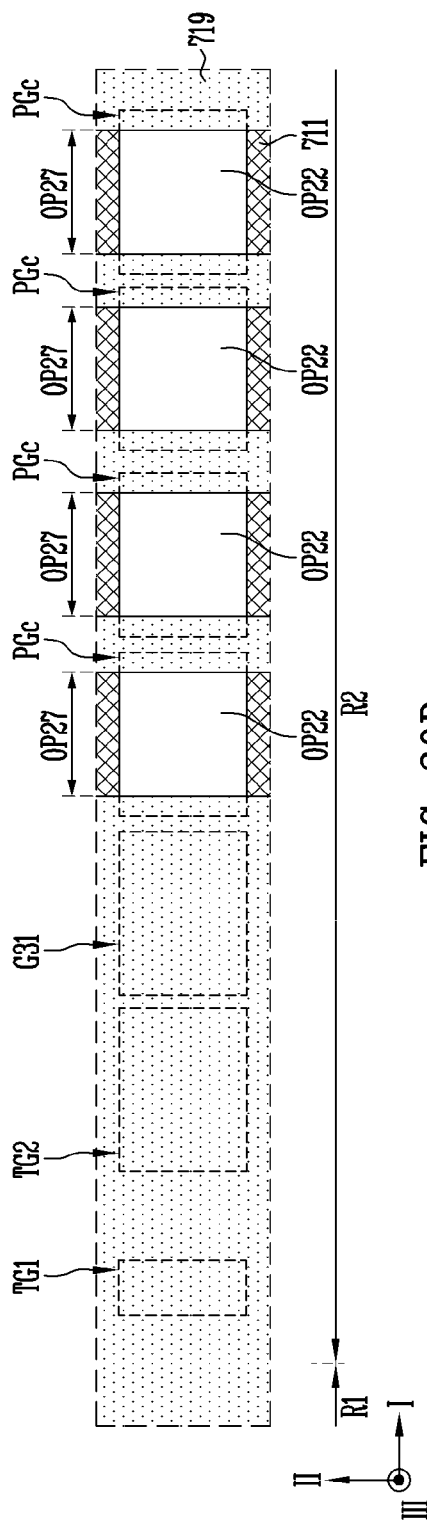

The etched second preliminary grooves PGb may be a first groove G31 and third preliminary grooves PGc as shown in FIG. 30C.

Referring to FIG. 30C, after the first groove G31 and the third preliminary grooves PGc are formed, the third mask pattern 717 shown in FIG. 30B may be removed. Subsequently, a fourth mask pattern 719 may be formed, which has seventh openings OP27 that expose the third preliminary grooves PGc and the remaining second preliminary grooves PGb and completely covers the upper grooves TG1 and TG2 and the first groove G31. The fourth mask pattern 719 may be formed on the etch stop pattern 711. The fourth mask pattern 719 may include a photoresist pattern.

The fourth mask pattern 719 may extend to completely cover the cell region R1. The seventh openings OP27 may overlap with some of the second openings OP22.

In order to form the second groove G32 and a third groove G33, which are shown in FIGS. 25, 26A, and 27A, at least some of the lower layers 705[1] to 705[k] shown in FIG. 29B may be etched using the etch stop pattern 711 and the fourth mask pattern 719 as an etch mask. A sectional structure with the same shape as the stack structure 300 shown in FIG. 10B may be formed by etching the second groove G32 and the third groove G33.

Figure 30D:
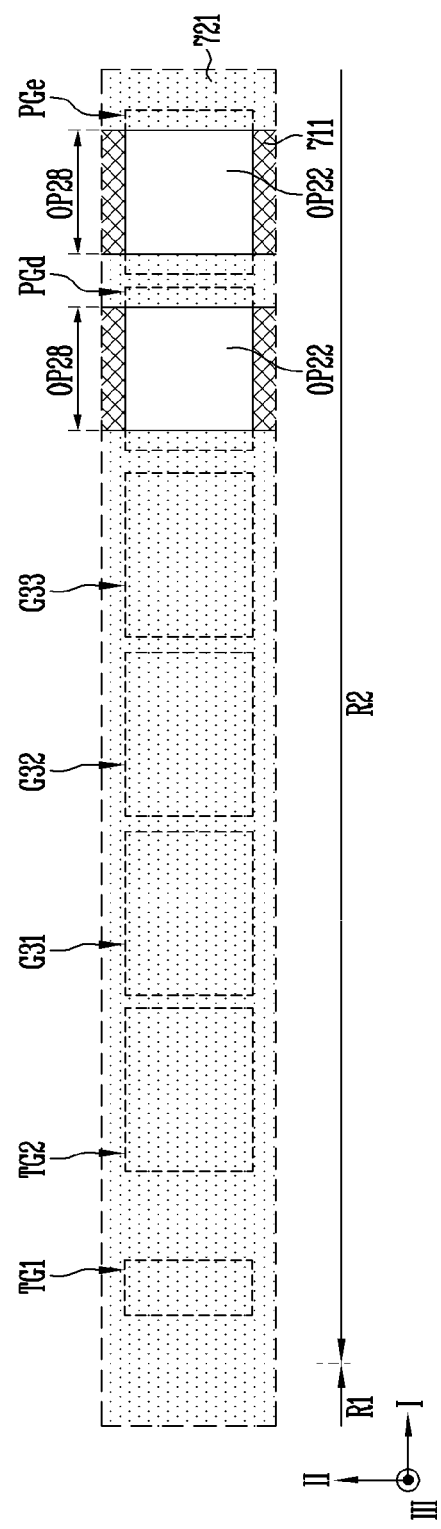

The grooves exposed by the seventh openings OP27 may be a second groove G32 and a fourth preliminary groove PGd as shown in FIG. 30D. The grooves exposed by the seventh openings OP27 may be a third groove G33 and a fifth preliminary groove PGe as shown in FIG. 30D.

Referring to FIG. 30D, after the second and third grooves G32 and G33 and the fourth and fifth preliminary grooves PGd and PGe are formed, the fourth mask pattern 719 shown in FIG. 30C may be removed. Subsequently, a fifth mask pattern 721 may be formed, which has eighth openings OP28 that expose the fourth and fifth preliminary grooves PGd and PGe and completely covers the upper grooves TG1 and TG2 and the first to third grooves G31 to G33. The fifth mask pattern 721 may be formed on the etch stop pattern 711. The fifth mask pattern 721 may include a photoresist pattern.

The fifth mask pattern 721 may extend to completely cover the cell region R1. The eighth openings OP28 may overlap with some of the second openings OP22, respectively.

In order to form the fourth groove 34 and the fifth groove 35, which are shown in FIGS. 25, 26A, and 27A, at least some of the lower layers 705[1] to 705[k] shown in FIG. 29B may be etched using the etch stop pattern 711 and the fifth mask pattern 721 as an etch mask. A sectional structure with the same shape as the stack structure 300 shown in FIG. 11B may be formed by the etching process for forming the fourth groove G34 and the fifth groove G35.

Subsequently, the fifth mask pattern 721 may be removed, and a process of forming a gap fill insulating layer as described with reference to FIGS. 22A and 22B, a first planarization process as described with reference to FIG. 23, and a second planarization process and a process of forming a slit as described with reference to FIGS. 24A and 24B may be sequentially performed.

Figure 31:
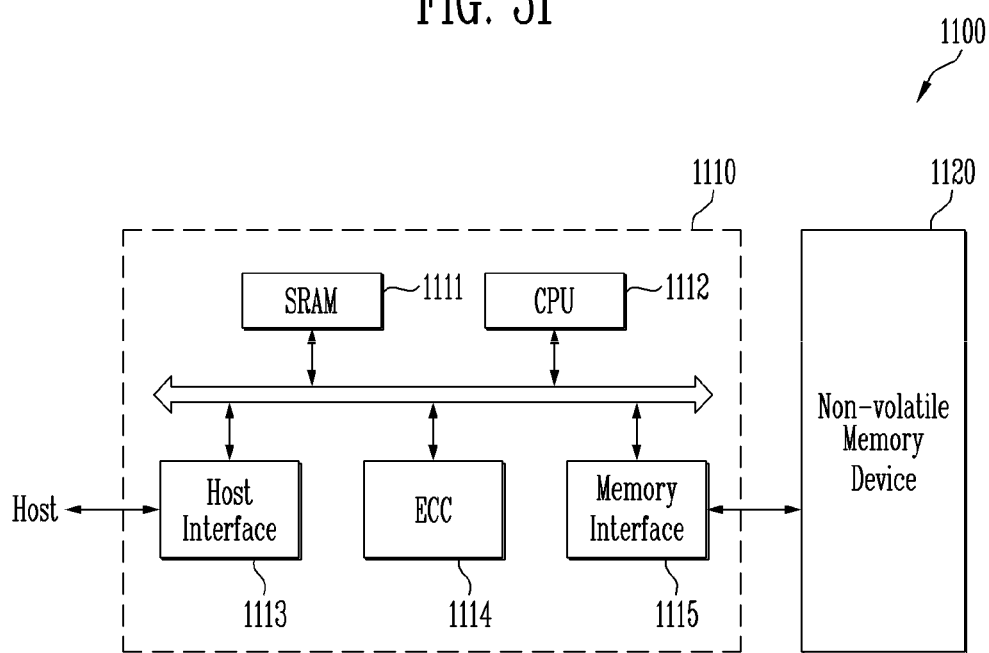
FIG. 31 is a block diagram illustrating a configuration of a memory system in accordance with an embodiment of the present disclosure.

FIG. 31 is a block diagram illustrating a configuration of a memory system in accordance with an embodiment of the present disclosure.

Referring to FIG. 31, the memory system 1100 in accordance with the embodiment of the present disclosure includes a memory device 1120 and a memory controller 1110.

The memory device 1120 may be a multi-chip package configured with a plurality of flash memory chips. The memory device 1120 may include any one of the semiconductor memory devices described with reference to FIGS. 1A, 1B, 2A, 2B, 3, 4A and 4B, 5A and 5B, 6, 13A and 13B, 14A and 14B, 15, 16, 25, 26A and 26B, and 27A and 27B.

The memory controller 1110 is configured to control the memory device 1120, and may include a static random access memory (SRAM) 1111, a CPU 1112, a host interface 1113, an error correction code (ECC) 1114, and a memory interface 1115. The SRAM 1111 is used as an operational memory of the CPU 1112, the CPU 1112 performs overall control operations for data exchange of the memory controller 1110, and the host interface 1113 includes a data exchange protocol for a host connected with the memory system 1100. The ECC 1114 detects and corrects errors in data read from the memory device 1120, and the memory interface 1115 interfaces with the memory device 1120. In addition, the memory controller 1110 may further include a ROM for storing code data for interfacing with the host, and the like.

The memory system 1100 configured as described above may be a memory card or a Solid State Drive (SSD), in which the memory device 1120 is combined with the controller 1110. For example, when the memory system 1100 is an SSD, the memory controller 1100 may communicate with an external entity (e.g., the host) through various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 32:
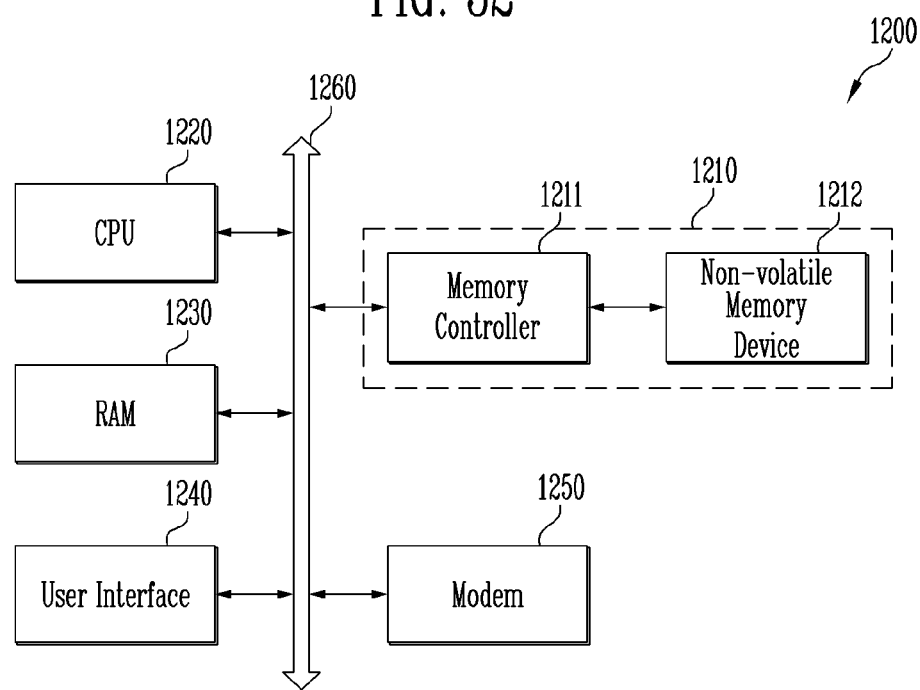
FIG. 32 is a block diagram illustrating a configuration of a computing system in accordance with an embodiment of the present disclosure.

FIG. 32 is a block diagram illustrating a configuration of a computing system in accordance with an embodiment of the present disclosure.

Referring to FIG. 32, a computing system 1200 in accordance with the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor (CIS), a mobile D-RAM, and the like may be further included.

In an embodiment of the present disclosure, grooves disposed at different depths in a contact region of a stack structure are provided with sidewalls having a stepped structure, so that the stepped structure can be used as a pad region connected to a contact plug.

In an embodiment of the present disclosure, the grooves are locally formed in thin films making up the stack structure. Accordingly, the thin films extend to both sides of a contact region of the stack structure, so that both sides of the contact region can be used as a cell region.

In an embodiment of the present disclosure, each of the thin films constituting the stack structure remains in the contact region, so that the stability of a manufacturing process can be ensured. Accordingly, the structural stability of the three-dimensional semiconductor memory device can be improved.

In an embodiment of the present disclosure, some of sidewalls defining each of the grooves have a stepped structure, and the other sidewalls have a gradient greater than that of the stepped structure. Accordingly, the area occupied by the grooves is decreased, and thus the degree of integration of the semiconductor memory device can be improved.

In an embodiment of the present disclosure, an etching process of the stack structure can be performed such that regions of the stack structure, which are individually exposed by mask patterns used as an etch mask, overlap with each other. Accordingly, the grooves disposed at different depths can be easily formed.

In embodiments of the present disclosure, forming a semiconductor device includes applying and removing photoresist layers several times to form a series of grooves. When a hard mask layer is present in conjunction with the photoresist layers, the thickness photoresist layers can be substantially reduced, and the amount of time to create and remove the photoresist layers is substantially reduced, leading to higher throughput and lower defects and cost. In addition, because openings in the hard mask pattern are used to form the grooves, tolerances of the photoresist mask can be much greater.

Embodiments of the present disclosure have been described in the drawings and specification. Specific terminologies have been used to explain specific embodiments of the present disclosure. However, the present disclosure is not restricted to the above-described embodiments, and many variations are possible within the scope of the present disclosure. It should be apparent to those skilled in the art that various modifications can be made based on the technological scope of the present disclosure in addition to the embodiments disclosed herein.

What is claimed is:

1. A semiconductor memory device comprising:
a lower stack structure including a lower first stepped structure and a lower second stepped structure facing each other; and
an upper stack structure disposed over the lower stack structure and including an upper first stepped structure and an upper second stepped structure facing each other,
wherein a first gradient is defined between a lowermost step and an uppermost step in each of the lower first stepped structure and the upper first stepped structure,
wherein a second gradient is defined between a lowermost step and an uppermost step in each of the lower second stepped structure and the upper second stepped structure,
wherein the first gradient is different from the second gradient,
wherein the upper stack structure includes upper layers stacked on the lower stack structure, and
wherein each of the upper layers includes a first portion forming the upper first stepped structure, a second portion forming the upper second stepped structure and a third portion connecting the first portion to the second portion.

2. The semiconductor memory device of claim 1,
wherein each of the lower first stepped structure and the upper first stepped structure includes steps having a first width,
wherein each of the lower second stepped structure and the upper second stepped structure includes steps having a second width, and
wherein the first width is different from the second width.

3. The semiconductor memory device of claim 1,
wherein the lower stack structure includes lower layers stacked on each other, and
wherein each of the lower layers includes a first portion overlapping the upper first stepped structure and the upper second stepped structure of the upper stack structure, a second portion extending from the first portion and forming the lower first stepped structure, a third portion forming the lower second stepped structure and a fourth portion connecting the second portion to the third portion.

4. The semiconductor memory device of claim 3,
wherein the first gradient is smaller than the second gradient.

5. The semiconductor memory device of claim 3,
wherein the lower stack structure includes a groove surrounded by the fourth portion of each of the lower layers, the lower first stepped structure, and the lower second stepped structure.

6. The semiconductor memory device of claim 3,
wherein the upper stack structure includes a portion overlapping with the fourth portion of each of the lower layers.

7. The semiconductor memory device of claim 1,
wherein the upper stack structure includes first upper layers forming the upper first stepped structure and extending to form a cell region and second upper layers forming the upper second stepped structure, and wherein the first upper layers are isolated from the second upper layers by a trench between the upper first stepped structure and the upper second stepped structure.

8. The semiconductor memory device of claim 7, wherein the first gradient is smaller than the second gradient.

9. The semiconductor memory device of claim 1, wherein the upper stack structure includes a groove surrounded by the third portion of each of the upper layers, the upper first stepped structure, and the upper second stepped structure.

10. The semiconductor memory device of claim 1, further comprising:
- a channel layer extending in a vertical direction in which the lower stack structure and the upper stack structure are stacked,
- wherein each of the lower stack structure and the upper stack structure includes conductive layers and interlayer insulating layers alternately stacked in the vertical direction, and
- wherein the conductive layers and the interlayer insulating layers surrounding the channel layer.

* * * * *